US012672279B2

(12) United States Patent
Kang

(10) Patent No.: US 12,672,279 B2
(45) Date of Patent: Jun. 30, 2026

(54) 3D SEMICONDUCTOR MEMORY DEVICE INCLUDING FLOATING GATE AND METHOD OF MANUFACTURING THE SAME

(71) Applicant: SK hynix Inc., Icheon-si (KR)

(72) Inventor: In Ku Kang, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 610 days.

(21) Appl. No.: 18/108,953

(22) Filed: Feb. 13, 2023

(65) Prior Publication Data

US 2024/0074169 A1 Feb. 29, 2024

(30) Foreign Application Priority Data

Aug. 29, 2022 (KR) ........................ 10-2022-0108447

(51) Int. Cl.
*H10B 41/27* (2023.01)
(52) U.S. Cl.
CPC ................................... *H10B 41/27* (2023.02)
(58) Field of Classification Search
CPC ......... H10B 41/27; H10B 41/30; H10B 41/35
See application file for complete search history.

(56) References Cited

U.S. PATENT DOCUMENTS

2015/0200199 A1* 7/2015 Sakamoto ............ H10D 30/693
257/329

FOREIGN PATENT DOCUMENTS

KR 1020210106288 A 8/2021
KR 1020210106293 A 8/2021

* cited by examiner

*Primary Examiner* — Brent A. Fairbanks
*Assistant Examiner* — Molly K Reida
(74) *Attorney, Agent, or Firm* — WILLIAM PARK AND ASSOCIATES LTD.

(57) ABSTRACT
Provided herein may be a semiconductor device and a method of manufacturing the same. The semiconductor device may include a gate stacked structure including a plurality of insulating layers and a plurality of conductive layers that are alternately stacked, a vertical structure extending into the gate stacked structure, a floating gate disposed between the vertical structure and the plurality of conductive layers, and a dielectric pattern disposed between the floating gate and the plurality of conductive layers. The floating gate may include a first portion that is adjacent to the vertical structure and a second portion that is adjacent to the dielectric pattern, and the dielectric pattern may contact an upper surface, a lower surface, and a sidewall of the second portion.

7 Claims, 66 Drawing Sheets

3D SEMICONDUCTOR MEMORY DEVICE INCLUDING FLOATING GATE AND METHOD OF MANUFACTURING THE SAME

CROSS-REFERENCE TO RELATED APPLICATION

The present application claims priority under 35 U.S.C. § 119(a) to Korean patent application number 10-2022-0108447, filed on Aug. 29, 2022, in the Korean Intellectual Property Office, the entire disclosure of which is incorporated herein by reference.

BACKGROUND

1. Technical Field

Various embodiments of the present disclosure generally relate to an electronic device, and more particularly to a semiconductor device and a method of manufacturing the semiconductor device.

2. Related Art

Nonvolatile memory devices retain stored data regardless of power on/off conditions. Recently, as the improvement of integration of a two-dimensional nonvolatile memory device including memory cells formed on a substrate in a single layer is limited, a three-dimensional (3D) nonvolatile memory device including the memory cells stacked in a vertical direction on the substrate has been proposed.

The 3D nonvolatile memory device may include inter-layer insulating layers and gate electrodes that are stacked alternately with each other, and channel layers passing therethrough, with the memory cells stacked along the channel layers. To improve the operational reliability of such a nonvolatile memory device having the 3D structure, various structures and manufacturing methods have been developed.

SUMMARY

An embodiment of the present disclosure may provide for a semiconductor device. The semiconductor device may include a gate stacked structure including a plurality of insulating layers and a plurality of conductive layers that are alternately stacked, a vertical structure extending into the gate stacked structure, a floating gate disposed between the vertical structure and the plurality of conductive layers, and a dielectric pattern disposed between the floating gate and the plurality of conductive layers, wherein the floating gate includes a first portion that is adjacent to the vertical structure and a second portion that is adjacent to the dielectric pattern, and wherein the dielectric pattern contacts an upper surface, a lower surface, and a sidewall of the second portion.

An embodiment of the present disclosure may provide for a semiconductor device. The semiconductor device may include a gate stacked structure including a plurality of insulating layers and a plurality of conductive layers that are alternately stacked, a vertical structure extending into the gate stacked structure, a plurality of insulating patterns disposed between the plurality of insulating layers and the vertical structure, a floating gate disposed in a space between the plurality of insulating patterns, and a dielectric pattern disposed between the floating gate and the plurality of conductive layers, wherein the dielectric pattern includes a low dielectric layer contacting the plurality of conductive layers, and a high dielectric layer contacting the floating gate.

An embodiment of the present disclosure may provide for a method of manufacturing a semiconductor device. The method may include forming a hole that passes through at least a portion of a stacked structure in which a plurality of first and second material layers are alternately stacked, forming a recess area by etching a sidewall of each of the plurality of second material layers that are exposed through the hole to a certain thickness and forming a low dielectric layer that contacts the sidewall of each of the plurality of second material layers, forming a first high dielectric layer along a sidewall of the hole and forming first sacrificial patterns in the recess area that has been outlined by the first high dielectric layer, each having a protrusion that protrudes toward the hole, forming a plurality of insulating patterns that contact the first high dielectric layer in a space between the protrusions of the first sacrificial patterns and removing the first sacrificial patterns to form a pocket, and forming a floating gate in the pocket.

An embodiment of the present disclosure may provide for a method of manufacturing a semiconductor device. The method may include forming a hole that passes through at least a portion of a stacked structure in which a plurality of first and second material layers are alternately stacked, forming a recess area by etching a sidewall of each of the plurality of second material layers that are exposed through the hole to a certain thickness and forming a low dielectric layer that contacts the sidewall of each of the plurality of second material layers, forming a first high dielectric layer along a surface of the recess area and forming a sacrificial pattern that fills the recess area that has been outlined by the first high dielectric layer, forming each insulating pattern, among a plurality of insulating patterns, on a sidewall of each of the plurality of first material layers and removing the sacrificial pattern to form a pocket, and forming a floating gate in the pocket.

An embodiment of the present disclosure may provide for a method of manufacturing a semiconductor device. The method may include forming a hole that passes through at least a portion of a stacked structure in which a plurality of first and second material layers are alternately stacked, forming each insulating pattern, among a plurality of insulating patterns, on a sidewall of each of the first material layers that are exposed through the hole, sequentially forming a low dielectric layer and a high dielectric layer on a sidewall of each of the plurality of second material layers that are exposed through the hole, and forming a floating gate in a space between the plurality of insulating patterns, wherein the low dielectric layer is formed between the first material layers, and the high dielectric layer is formed between the plurality of insulating patterns.

An embodiment of the present disclosure may provide for a method of manufacturing a semiconductor device. The method may include forming a hole that passes through at least a portion of a stacked structure in which a plurality of first and second material layers are alternately stacked, forming each of first sacrificial patterns on a sidewall of each of the plurality of second material layers that are exposed through the hole, forming each of second sacrificial patterns that contacts a sidewall of each of the first material layers in a space between the first sacrificial patterns, forming a plurality of insulating patterns by removing the first sacrificial patterns and oxidizing the second sacrificial patterns, sequentially forming a low dielectric layer and a high dielectric layer on a sidewall of each of the plurality of second material layers that are exposed through the hole, and forming a floating gate in a space between the plurality of insulating patterns.

An embodiment of the present disclosure may provide for a method of manufacturing a semiconductor device. The method may include forming a hole that passes through at least a portion of a stacked structure in which plurality of first and second material layers are alternately stacked, etching a sidewall of each of the first material layers that are exposed through the hole to a certain thickness to remove the sidewall and forming first sacrificial patterns in spaces from which the first material layers have been etched, forming a plurality of insulating patterns from a sidewall of the first sacrificial patterns that protrude farther toward a center of the hole than each of the plurality of second material layers by oxidizing the first sacrificial patterns, sequentially forming a low dielectric layer and a high dielectric layer on the sidewall of each of the plurality of second material layers that are exposed through the hole, and forming a floating gate in a space between the plurality of protruding insulating patterns.

DETAILED DESCRIPTION

Specific structural or functional descriptions in the embodiments of the present disclosure introduced in this specification or application are only for description of the embodiments of the present disclosure. The descriptions should not be construed as being limited to the embodiments described in the specification or application.

Various embodiments of the present disclosure will now be described more fully hereinafter with reference to the accompanying drawings, in which preferred embodiments of the present disclosure are shown, so that those of ordinary skill in the art can easily carry out the technical idea of the present disclosure.

Various embodiments of the present disclosure are directed to a semiconductor device which has a stable structure and improved characteristics, and a method of manufacturing the semiconductor device.

Figure 1:
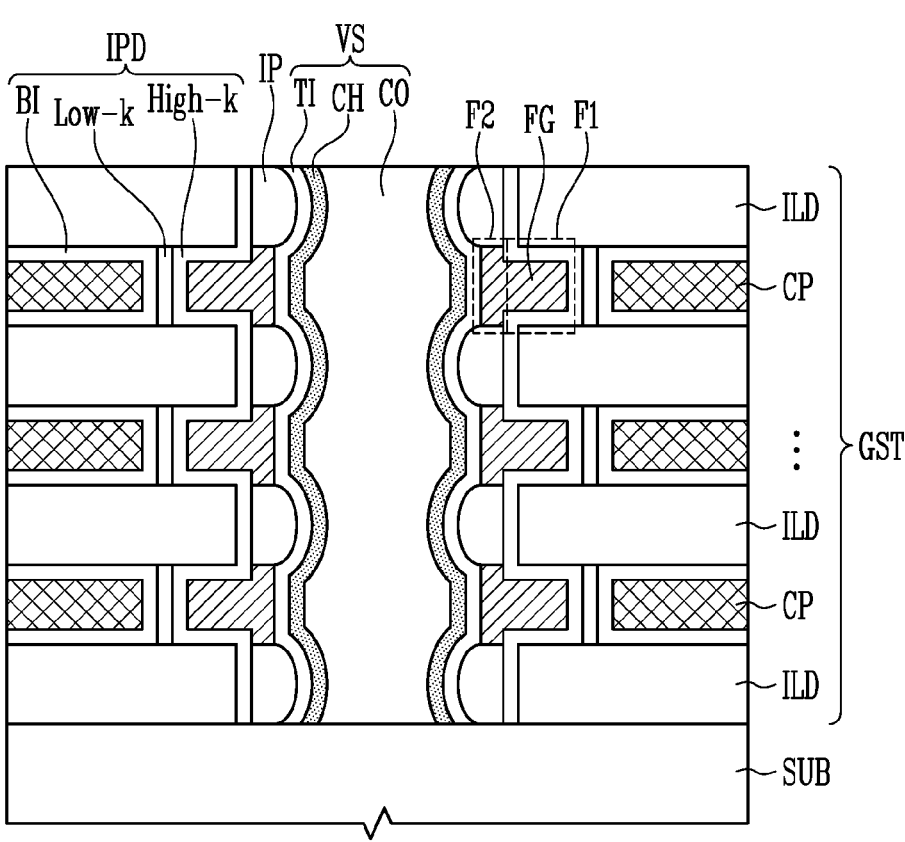
FIG. 1 is a sectional view illustrating a semiconductor device according to an embodiment of the present disclosure.

FIG. 1 is a sectional view illustrating a semiconductor device according to an embodiment of the present disclosure.

Referring to FIG. 1, the semiconductor device may include a gate stacked structure GST, a vertical structure VS, an insulating pattern IP, a floating gate FG, and a dielectric pattern IPD.

The gate stacked structure GST may include conductive layers CP and interlayer insulating layers ILD that are alternately stacked. The conductive layers CP may be gate electrodes, such as a select transistor or a memory cell. The conductive layers CP may be a select line that is coupled to the select transistor and a word line that is coupled to the memory cell. The conductive layers CP may include a conductive material, such as polysilicon, tungsten, or metal. The interlayer insulating layers ILD may function to insulate the stacked conductive layers CP from each other. The interlayer insulating layers ILD may include an insulating material, such as oxide or nitride. The interlayer insulating layers ILD may have a structure that protrudes in the direction of the vertical structure VS with respect to the conductive layers CP.

The vertical structure VS may extend in a vertical direction through the gate stacked structure GST. That is, the vertical structure VS may extend in a stacking direction of the gate stacked structure GST. The stacking direction of the gate stacked structure GST may be defined as the direction in which the conductive layers CP and the interlayer insulating layers ILD are alternately stacked to form the gate stacked structure GST.

The vertical structure VS may include a core insulating layer CO, a channel layer CH, and a tunnel insulating layer TI. The core insulating layer CO may extend in a direction that is perpendicular to the substrate SUB. The core insulating layer CO may be formed in a central area of the vertical structure VS and may include an insulating material, such as oxide. The channel layer CH may be an area in which the channel, such as the select transistor or the memory cell, is formed. The channel layer CH may extend in a vertical direction and may be formed to enclose an outer wall of the core insulating layer CO. The channel layer CH may include a semiconductor material, such as silicon or germanium, or may include a nanostructure, such as a nano dot, a nano tube, or graphene. The tunnel insulating layer TI may extend in the vertical direction and may be formed to enclose an outer wall of the channel layer CH. The tunnel insulating layer TI may be a layer through which electric charges tunnel via F-N tunneling or the like and may include an insulating material, such as oxide or nitride.

The insulating pattern IP may be disposed between each of the interlayer insulating layers ILD and the vertical structure VS. The insulating pattern IP may separate floating gates FG, which are vertically adjacent to each other, from each other. The insulating pattern IP may include an insulating material, such as oxide or nitride.

The floating gates FG may be disposed in a space between the protruding interlayer insulating layers ILD and a space between the insulating patterns IP. The floating gate FG may be disposed in a space between the conductive layers CP and the vertical structure VS. The floating gate FG may include a first portion F1 and a second portion F2. The first portion F1 may be disposed between the insulating patterns IP, and the second portion F2 may be disposed between the insulating patterns IP. A vertical length of the first portion F1 may be shorter than a vertical length of the second portion F2. The floating gate FG may trap charges that are introduced by tunneling the tunnel insulating layer TI during a program operation. The floating gate FG may include polysilicon.

The dielectric pattern IPD may be disposed between each of the floating gates FG and each of the conductive layers CP. The dielectric pattern IPD may include a high dielectric layer High-k, a low dielectric layer Low-k, and a blocking insulating layer BI. The high dielectric layer High-k may be formed to enclose the first portion F1 of the floating gate FG. For example, the high dielectric layer High-k may be formed to enclose the first portion F1 by covering an upper surface, a lower surface, and a sidewall of the first portion F1, the sidewall being adjacent to each of the conductive layers CP. The high dielectric layer High-k may extend along an interface between each of the interlayer insulating layers ILD and each of the insulating patterns IP. The high dielectric layer High-k may include a high dielectric constant material, such as aluminum oxide ($Al_2O_3$), hafnium oxide (HfOx), or hafnium silicon oxide (HfSiOx). The low dielectric layer Low-k may be disposed between the high dielectric layer High-k and the blocking insulating layer BI. The low dielectric layer Low-k may have a dielectric permittivity that is lower than that of the high dielectric layer High-k. The low dielectric layer Low-k may be formed of a radical oxide layer. The blocking insulating layers BI may be disposed between the interlayer insulating layers ILD and the conductive layers CP and between the conductive layers CP and the low dielectric layers Low-k. The blocking insulating layer BI may be formed to enclose each of the conductive layers CP by covering the upper surface, lower surface, and sidewall of each of the conductive layers CP, the sidewall being adjacent to the floating gate FG. The blocking insulating layer BI may be formed of a high dielectric layer. The dielectric permittivity of the blocking insulating layer BI may be higher than that of the low dielectric layer Low-k.

FIGS. 2A to 2G are sectional views illustrating a method of manufacturing a semiconductor device according to an embodiment of the present disclosure.

Figure 2A:
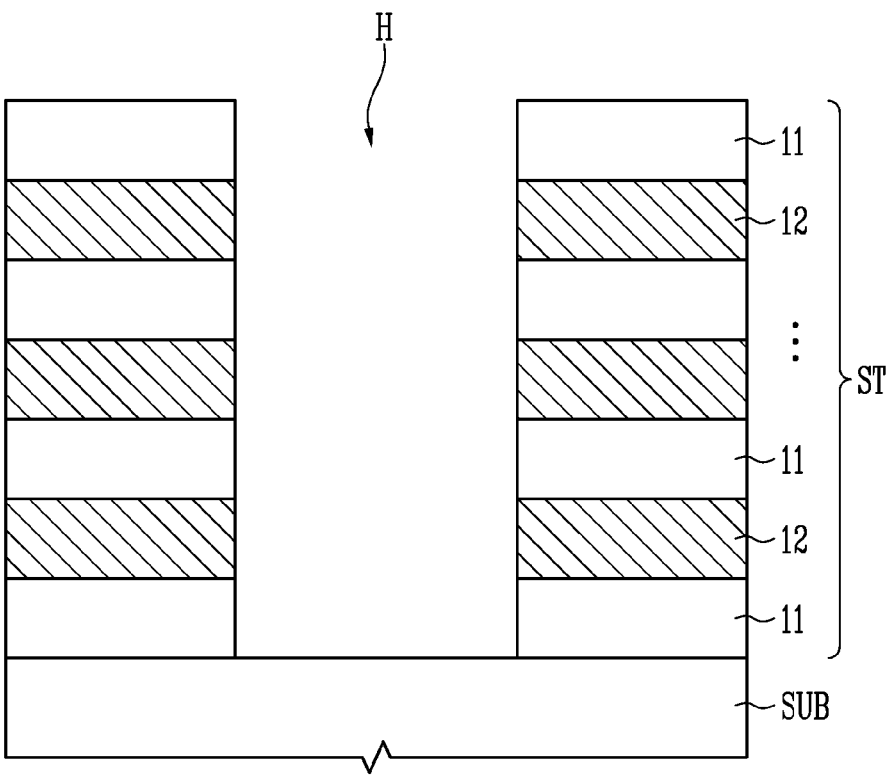
FIGS. 2A to 2G are sectional views illustrating a method of manufacturing a semiconductor device according to an embodiment of the present disclosure.

Referring to FIG. 2A, a stacked structure ST may be formed on a substrate SUB. The stacked structure ST may include first material layers 11 and second material layers 12 that are alternately stacked. The first and second material layers 11 and 12 may be stacked in a direction that is perpendicular to the substrate SUB. The first and second material layers 11 and 12 may be formed through a deposition process, such as Chemical Vapor deposition (CVD).

The first material layers 11 may include material having a high etch selectivity compared to the second material layers 12. In an embodiment, the first material layers 11 may include an insulating material, such as oxide, and the second material layers 12 may include a sacrificial material, such as nitride. In an embodiment, the first material layers 11 may include an insulating material, such as oxide, and the second material layers 12 may include a conductive material, such as polysilicon or tungsten.

Subsequently, a hard mask pattern (not shown) may be formed on the stacked structure ST, and an etching process that uses the hard mask pattern may be performed to form a hole H that passes through at least a portion of the stacked structure ST. The hole H may partially extend into the substrate SUB.

Figure 2B:
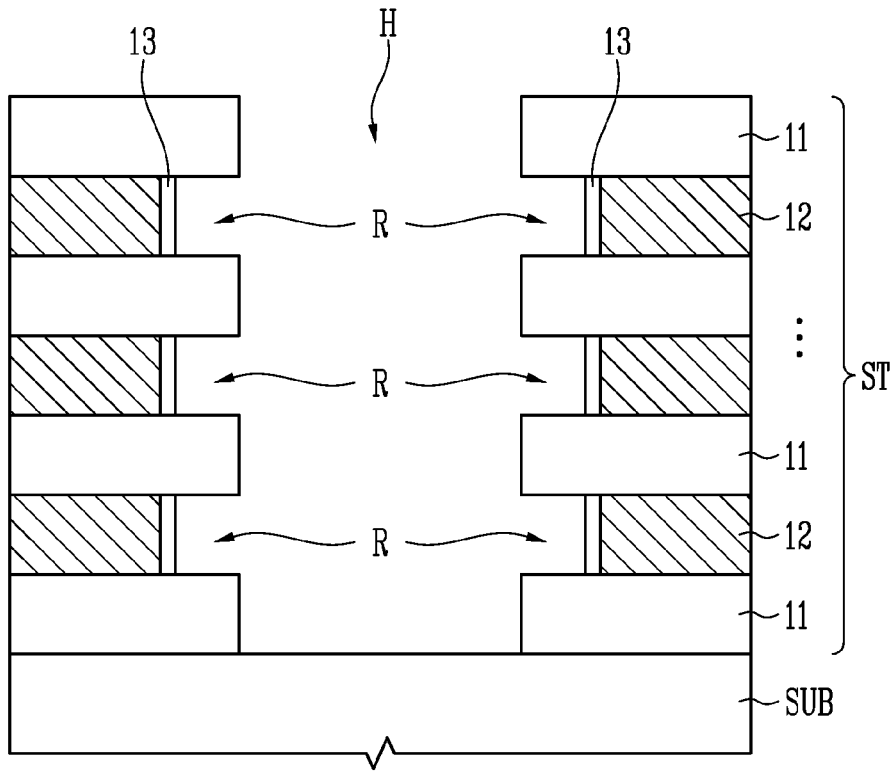

Referring to FIG. 2B, the second material layers 12 that are exposed through the hole H may be etched to a predetermined depth in a horizontal direction to form a recess area R. In other words, the sidewalls of the second material layers 12 may be etched to a predetermined depth so that the first material layers 11 protrude farther than the second material layers 12 in the horizontal direction.

Thereafter, a low dielectric layer 13 may be formed on a sidewall of each of the exposed second material layers 12. The low dielectric layer 13 may be selectively formed only on the sidewall of each of the second material layers 12 through a radical oxidation process.

Figure 2C:
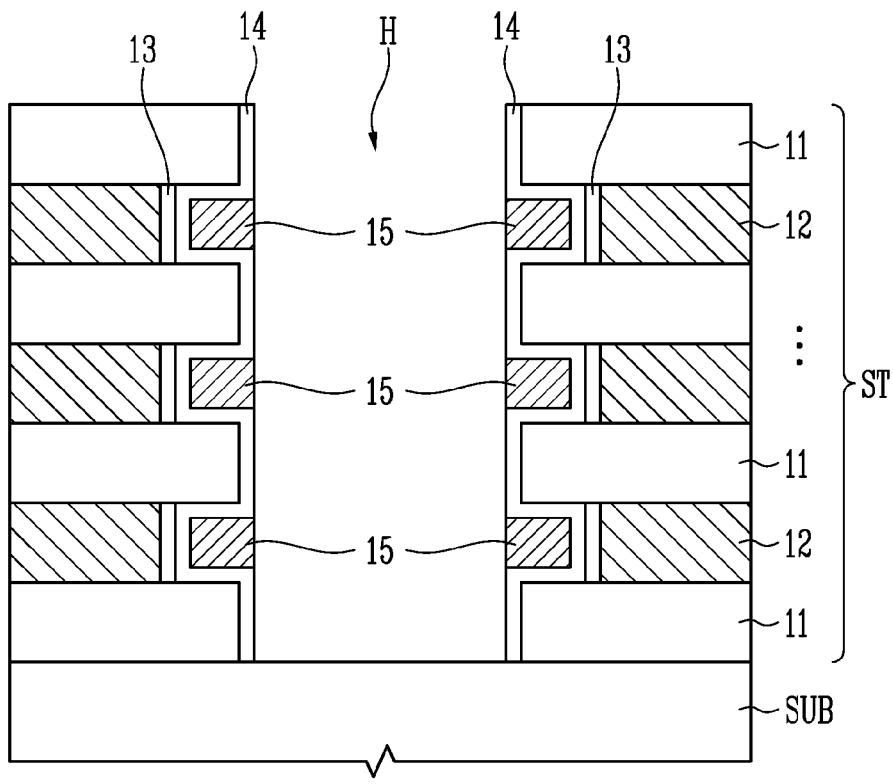

Referring to FIG. 2C, a high dielectric layer 14 may be formed along a sidewall of the hole H. For instance, the high dielectric layer 14 may be formed along protruding surfaces of the first material layers 11 and an exposed surface of the low dielectric layer 13. The high dielectric layer 14 may be formed to include a high dielectric constant material, such as aluminum oxide ($Al_2O_3$), hafnium oxide (HfOx), or hafnium silicon oxide (HfSiOx).

Thereafter, a first sacrificial layer 15 may be formed in a space between the protruding first material layers 11. For example, after forming the first sacrificial layer 15 on the sidewall of the hole H to fill the space between the protruding first material layers 11, an etch-back process may be performed so that the high dielectric layer 14 that is formed on the sidewall of each of the first material layers 11 is exposed. Thus, the first sacrificial layer 15 may remain only in the space between the protrusions of the first material layers 11 that are adjacent to each other in the vertical direction. The first sacrificial layer 15 may be formed of a polysilicon layer or a silicon nitride layer. Thereafter, a selective growth process may be performed so that the first sacrificial layer 15 partially protrudes in the direction of the hole H.

Figure 2D:
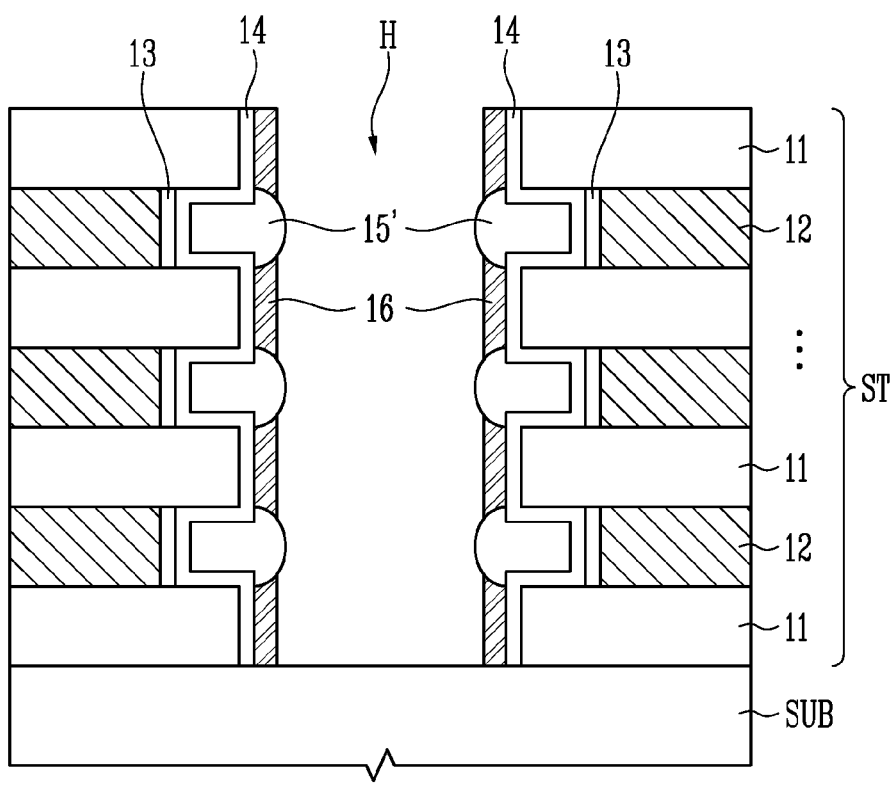

Referring to FIG. 2D, a sacrificial pattern 15' may be formed by performing an oxidation process to selectively oxidize the first sacrificial layer 15 (FIG. 2C). The sacrificial pattern 15' may be formed to have a protrusion protruding in the direction of the hole H.

Thereafter, a second sacrificial layer 16 may be formed in a space between the protrusions of the sacrificial pattern 15'. For example, after the second sacrificial layer 16 is formed on the sidewall of the hole H to fill a space between the protrusions of the sacrificial pattern 15', an etch-back process may be performed to expose a portion of the protrusion of the sacrificial pattern 15'. Thus, a second sacrificial layer 16 may remain in the space between the protrusions of the sacrificial patterns 15' that are adjacent to each other in the vertical direction. The second sacrificial layer 16 may be formed of a polysilicon layer or a silicon nitride layer.

Figure 2E:
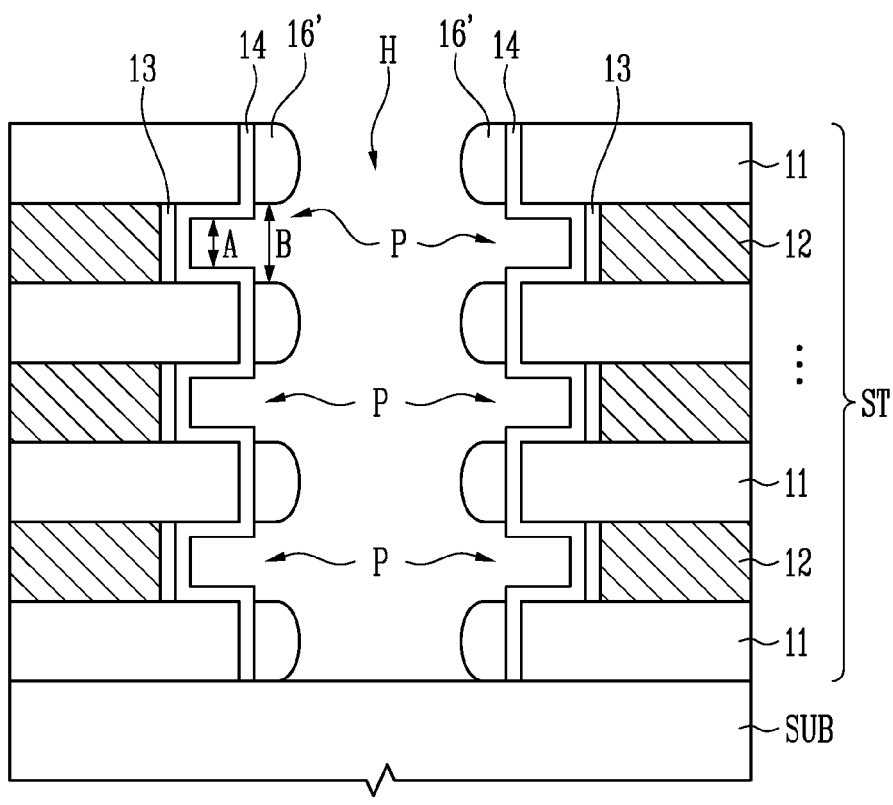

Referring to FIG. 2E, an etching process may be performed to remove the sacrificial pattern 15' (FIG. 2D). Thereafter, the insulating pattern 16' may be formed by selectively oxidizing the second sacrificial layer 16 (FIG. 2D). Thus, a pocket P including a space from which the sacrificial pattern 15' (see FIG. 2D) has been removed and a space between the insulating patterns 16' that are adjacent to each other in the vertical direction may be formed. The vertical length A of the space from which the sacrificial pattern 15' (see FIG. 2D) has been removed may be shorter than the vertical length B of the space between the insulating patterns 16' that are adjacent to each other in the vertical direction.

Figure 2F:
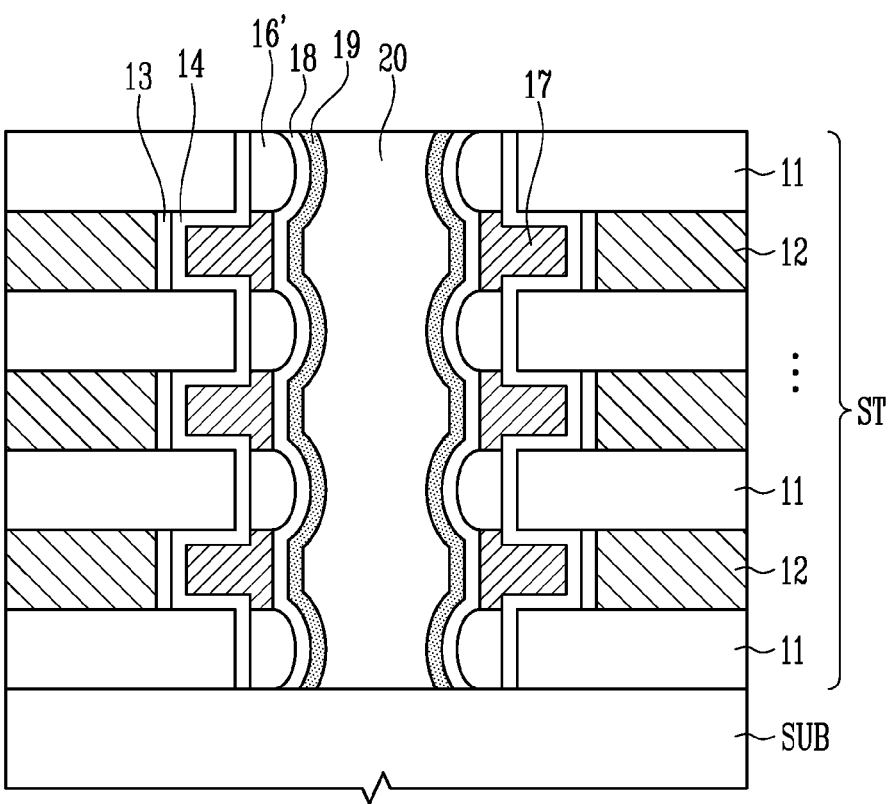

Referring to FIG. 2F, a floating gate 17 may be formed to fill each pocket P (see FIG. 2E). The floating gate 17 may include polysilicon. For example, a floating gate layer may be formed on the sidewall of the hole H (see FIG. 2E) to fill the pocket P (see FIG. 2E), and an etch-back process may be performed to expose a portion of the sidewall of the insulating pattern 16'. Thus, the floating gate 17 may remain only in the pocket P (see FIG. 2E), and the floating gates 17 that are adjacent to each other in the vertical direction may be electrically and physically spaced apart from each other by the insulating patterns 16'.

Thereafter, a tunnel insulating layer 18 may be formed along the sidewall of the insulating pattern 16' and the sidewall of the floating gate 17. The tunnel insulating layer 18 may be a layer through which electric charges tunnel via F-N tunneling or the like and may include an insulating material, such as oxide or nitride.

Subsequently, a channel layer 19 may be formed on the sidewall of the tunnel insulating layer 18. The channel layer 19 may be formed of a semiconductor material. In an embodiment, the channel layer 19 may include a semiconductor material, such as silicon or germanium, or may include a nanostructure, such as a nano dot, a nano tube, or graphene.

Thereafter, the core insulating layer 20 may be formed to fill the central portion of the hole. The core insulating layer 20 may be formed of an oxide layer.

Figure 2G:
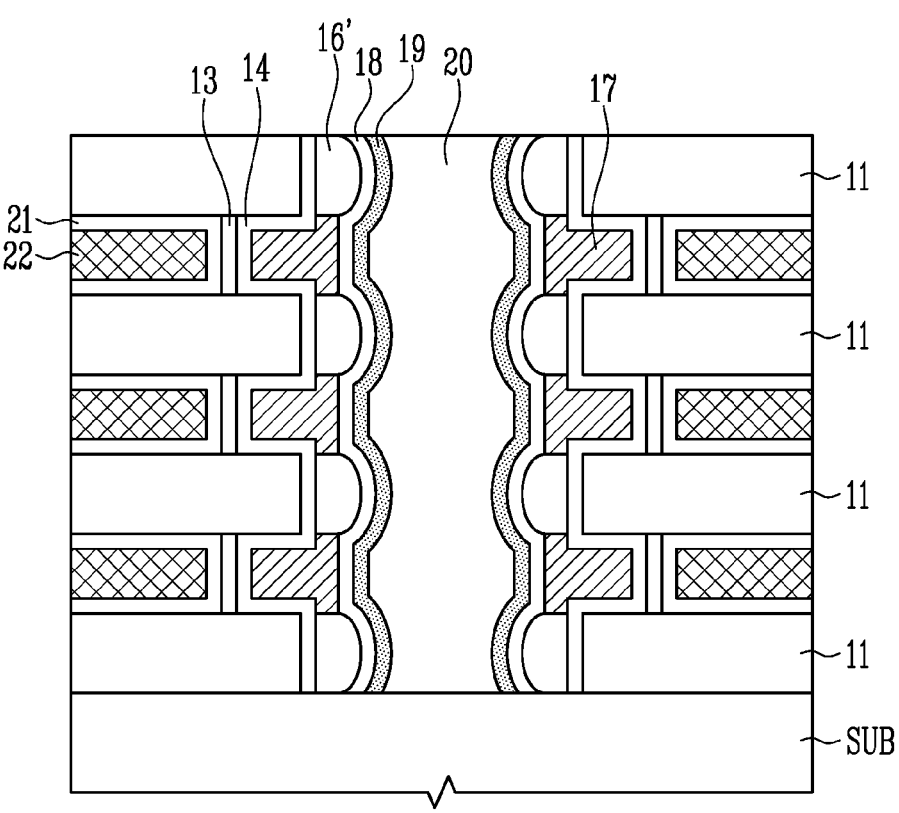

Referring to FIG. 2G, an etching process may be performed so that a sidewall of the stacked structure ST (see FIG. 2F) is exposed, and the exposed second material layer 12 (FIG. 2F) may be removed. Thereafter, a blocking insulating layer 21 may be formed along the exposed upper and lower surfaces of the first material layers 11 and the exposed surface of the low dielectric layer 13. Thereafter, the third material layer 22 may be formed in the space from which the second material layer 12 (see FIG. 2F) has been removed. The third material layer 22 may include a conductive material, such as polysilicon, tungsten, or metal.

Figure 3:
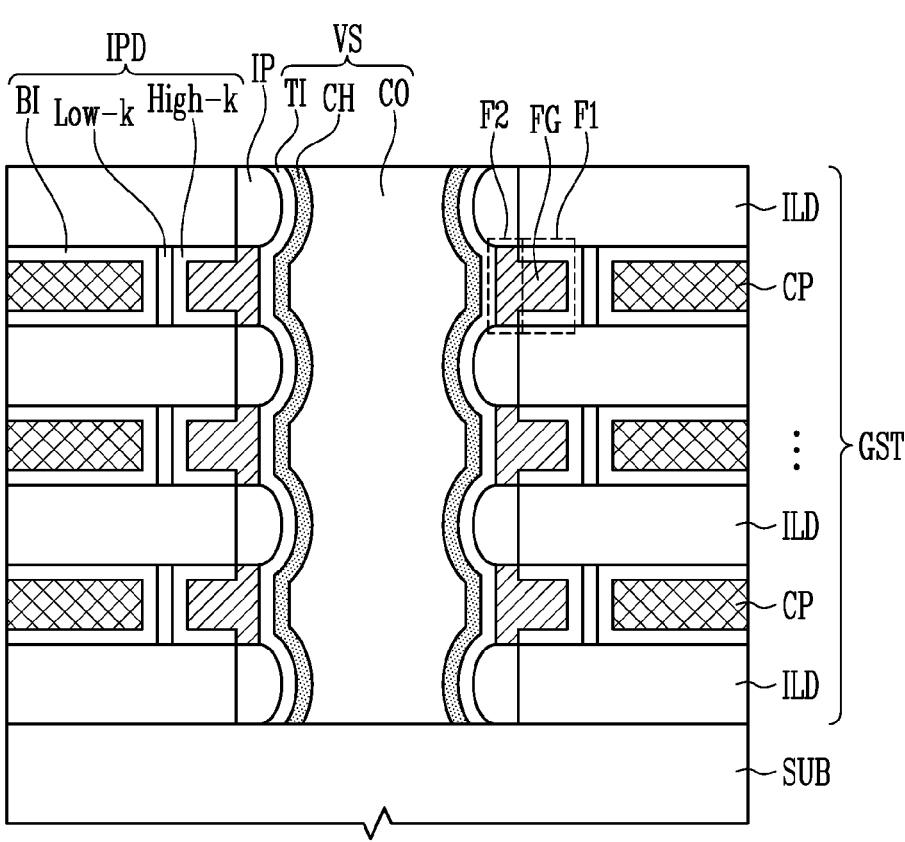
FIG. 3 is a sectional view illustrating a semiconductor device according to an embodiment of the present disclosure.

FIG. 3 is a sectional view illustrating a semiconductor device according to an embodiment of the present disclosure.

Referring to FIG. 3, the semiconductor device may include a gate stacked structure GST, a vertical structure VS, an insulating pattern IP, a floating gate FG, and a dielectric pattern IPD.

The gate stacked structure GST may include conductive layers CP and interlayer insulating layers ILD that are alternately stacked. The conductive layers CP may be gate electrodes, such as a select transistor or a memory cell. The conductive layers CP may be a select line that is coupled to the select transistor and a word line that is coupled to the memory cell. The conductive layers CP may include a conductive material, such as polysilicon, tungsten, or metal. The interlayer insulating layers ILD may function to insulate the stacked conductive layers CP from each other. The interlayer insulating layers ILD may include an insulating material, such as oxide or nitride. The interlayer insulating layers ILD may have a structure that protrudes in the direction of the vertical structure VS with respect to the conductive layers CP.

The vertical structure VS may extend in a vertical direction through the gate stacked structure GST. That is, the vertical structure VS may extend in a stacking direction of the gate stacked structure GST. The stacking direction of the gate stacked structure GST may be defined as the stacking direction of the alternately stacked conductive layers CP and the interlayer insulating layers ILD that are included in the gate stacked structure GST.

The vertical structure VS may include a core insulating layer CO, a channel layer CH, and a tunnel insulating layer TI. The core insulating layer CO may extend in a direction that is perpendicular to the substrate SUB. The core insulating layer CO may be formed in a central area of the vertical structure VS and may include an insulating material, such as oxide. The channel layer CH may be an area in which the channel, such as the select transistor or the memory cell, is formed. The channel layer CH may extend in a vertical direction and may be formed to enclose an outer wall of the core insulating layer CO. The channel layer CH may include a semiconductor material, such as silicon or germanium, or may include a nanostructure, such as a nano dot, a nano tube, or graphene. The tunnel insulating layer TI may extend in the vertical direction and may be formed to enclose an outer wall of the channel layer CH. The tunnel insulating layer TI may be a layer through which electric charges tunnel via F-N tunneling or the like and may include an insulating material, such as oxide or nitride.

The insulating pattern IP may be disposed between each of the interlayer insulating layers ILD and the vertical structure VS. The insulating pattern IP may separate floating gates FG, which are vertically adjacent to each other, from each other. The insulating pattern IP may include an insulating material, such as oxide or nitride. The insulating pattern IP may be formed to directly contact sidewalls of the interlayer insulating layers ILD.

The floating gates FG may be disposed in a space between the protruding interlayer insulating layers ILD and a space between the insulating patterns IP. The floating gate FG may be disposed in a space between the conductive layers CP and the vertical structure VS. The floating gate FG may include a first portion F1 and a second portion F2. The first portion F1 may be disposed between the insulating patterns IP, and the second portion F2 may be disposed between the insulating patterns IP. A vertical length of the first portion F1 may be shorter than a vertical length of the second portion F2. The floating gate FG may trap charges that are introduced by tunneling the tunnel insulating layer TI during a program operation. The floating gate FG may include polysilicon.

The dielectric pattern IPD may be disposed between each of the floating gates FG and each of the conductive layers CP. The dielectric pattern IPD may include a high dielectric layer High-k, a low dielectric layer Low-k, and a blocking insulating layer BI. The high dielectric layer High-k may be formed to enclose the first portion F1 of the floating gate FG. For example, the high dielectric layer High-k may be formed to enclose the first portion F1 by covering an upper surface, lower surface, and a sidewall of the first portion F1, the sidewall being adjacent to each of the conductive layers CP. The high dielectric layer High-k may include a high dielectric constant material, such as aluminum oxide ($Al_2O_3$), hafnium oxide (HfOx), or hafnium silicon oxide (HfSiOx). The low dielectric layer Low-k may be disposed between the high dielectric layer High-k and the blocking insulating layer BI. The low dielectric layer Low-k may have a dielectric permittivity that is lower than that of the high dielectric layer High-k. The low dielectric layer Low-k may be formed of a radical oxide layer. The blocking insulating layers BI may be disposed between the interlayer insulating layers ILD and the conductive layers CP and between the conductive layers CP and the low dielectric layers Low-k. The blocking insulating layer BI may be formed to enclose each of the conductive layers CP by covering the upper surface, lower surface, and sidewall of each of the conductive layers CP, the sidewall being adjacent to the floating gate FG. The blocking insulating layer BI may be formed of a high dielectric layer. The dielectric permittivity of the blocking insulating layer BI may be higher than that of the low dielectric layer Low-k.

FIGS. 4A to 4H are sectional views illustrating a method of manufacturing a semiconductor device according to an embodiment of the present disclosure.

Figure 4A:
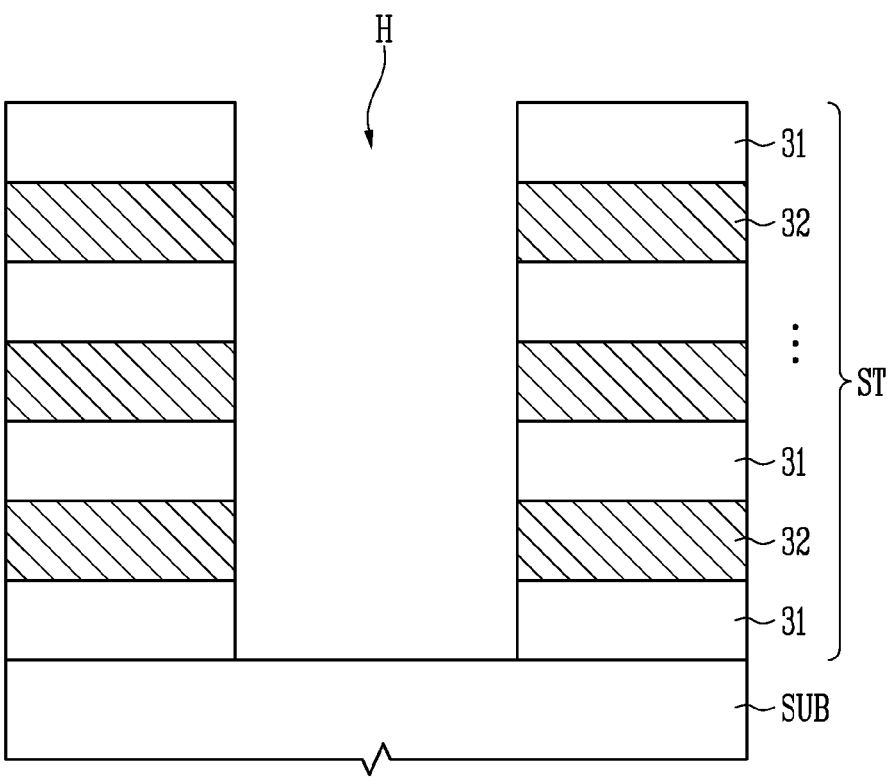
FIGS. 4A to 4H are sectional views illustrating a method of manufacturing a semiconductor device according to an embodiment of the present disclosure.

Referring to FIG. 4A, a stacked structure ST may be formed on a substrate SUB. The stacked structure ST may include first material layers 31 and second material layers 32 that are alternately stacked. The first and second material layers 31 and 32 may be stacked in a direction that is perpendicular to the substrate SUB. The first and second material layers 31 and 32 may be formed through a deposition process, such as CVD.

The first material layers 31 may include material having a high etch selectivity compared to the second material layers 32. In an embodiment, the first material layers 31 may include an insulating material, such as oxide, and the second material layers 32 may include a sacrificial material, such as nitride. In an embodiment, the first material layers 31 may include an insulating material, such as oxide, and the second material layers 32 may include a conductive material, such as polysilicon or tungsten.

Subsequently, a hard mask pattern (not shown) may be formed on the stacked structure ST, and an etching process that uses the hard mask pattern may be performed to form a hole H that passes through at least a portion of the stacked structure ST. The hole H may partially extend into the substrate SUB.

Figure 4B:
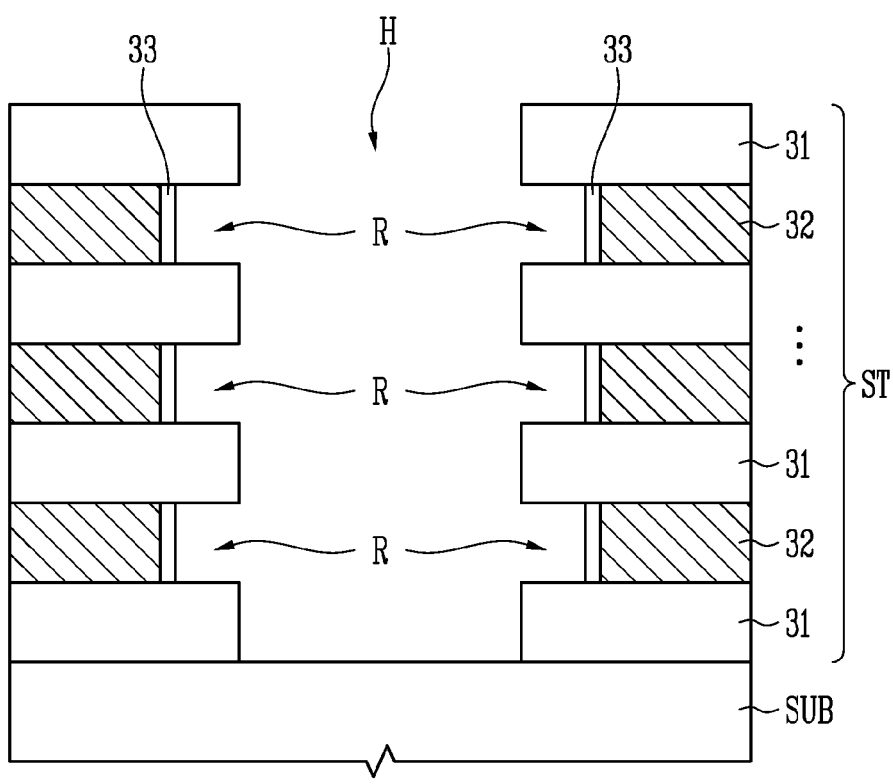

Referring to FIG. 4B, the second material layers 32 that are exposed through the hole H may be etched to a predetermined depth in a horizontal direction to form a recess area R. In other words, the sidewalls of the second material layers 32 may be etched to a predetermined depth so that the first material layers 31 protrude farther than the second material layers 32 in the horizontal direction.

Thereafter, a low dielectric layer 33 may be formed on a sidewall of each of the exposed second material layers 32. The low dielectric layer 33 may be selectively formed only on the sidewall of each of the second material layers 32 through a radical oxidation process.

Figure 4C:
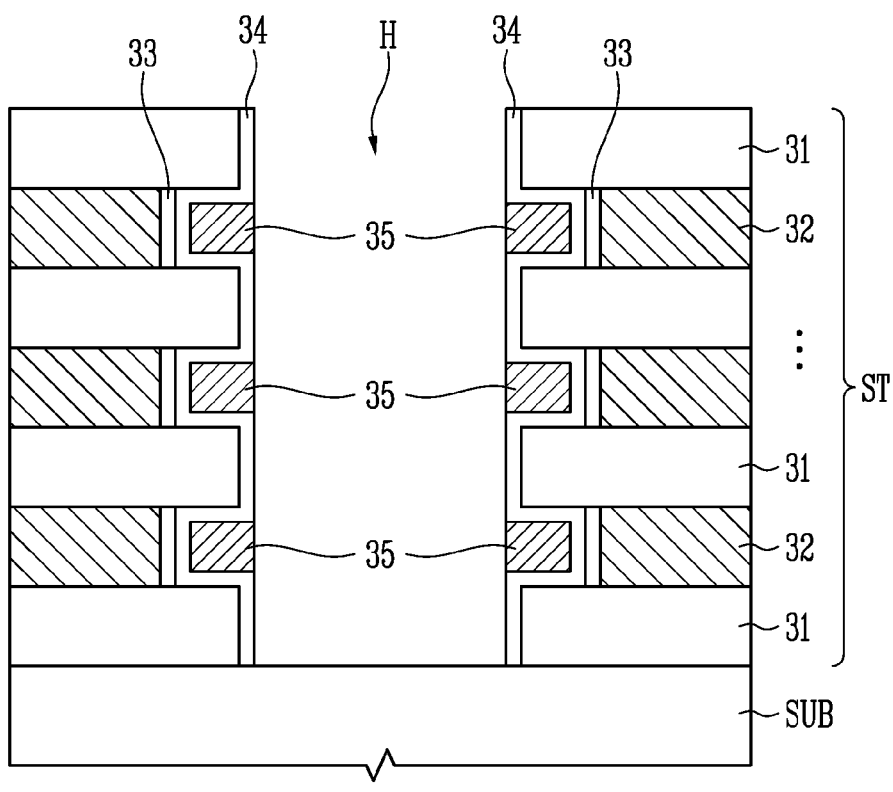

Referring to FIG. 4C, a high dielectric layer 34 may be formed along a sidewall of the hole H. For instance, the high dielectric layer 34 may be formed along protruding surfaces of the first material layers 31 and an exposed surface of the low dielectric layer 33. The high dielectric layer 34 may be formed to include a high dielectric constant material, such as aluminum oxide ($Al_2O_3$), hafnium oxide (HfOx), or hafnium silicon oxide (HfSiOx).

Thereafter, a first sacrificial layer 35 may be formed in a space between the protruding first material layers 31. For example, after forming the first sacrificial layer 35 on the sidewall of the hole H to fill the space between the protruding first material layers 31, an etch-back process may be performed so that the high dielectric layer 34 that is formed on the sidewall of each of the first material layers 31 is exposed. Thus, the first sacrificial layer 35 may remain only in the space between the protrusions of the first material layers 31 that are adjacent to each other in the vertical direction. The first sacrificial layer 35 may be formed of a polysilicon layer or a silicon nitride layer.

Figure 4D:
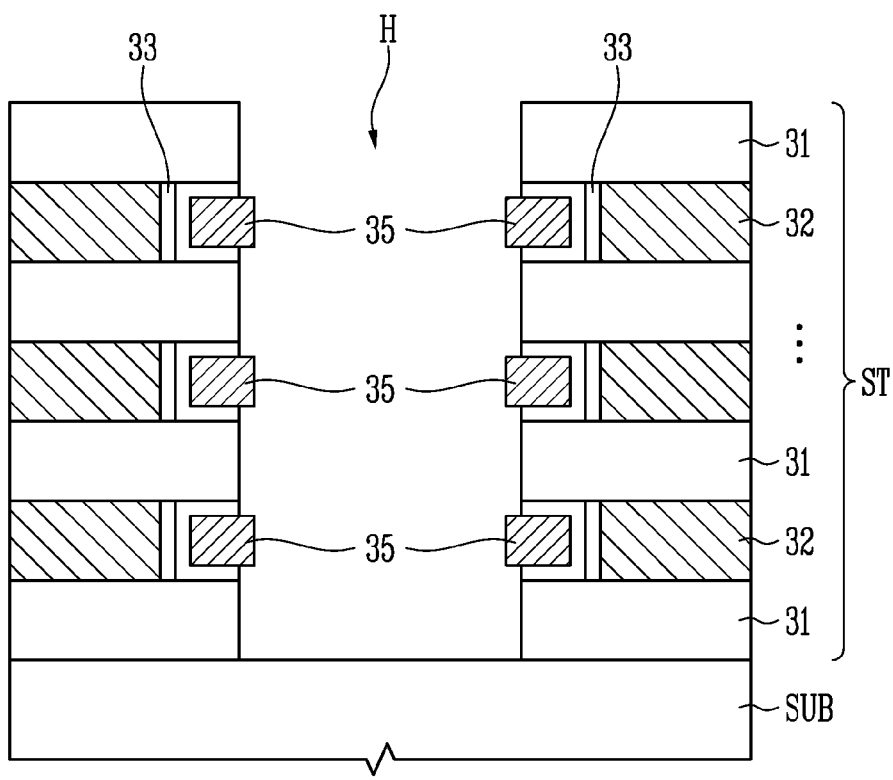

Referring to FIG. 4D, an etching process may be performed to remove the high dielectric layer 34 that is formed on the sidewall of each of the first material layers 31. The first sacrificial layer 35 may partially protrude in the direction of the hole H by the etching process. The remaining high dielectric layer 34 may enclose a portion of the first sacrificial layer 35 by covering a sidewall, a portion of an upper surface, and a portion of a lower surface of the first sacrificial layer 35, the sidewall being adjacent to the low dielectric layer 33.

Thereafter, a selective growth process may be performed so that the first sacrificial layer 35 further protrudes toward the hole H.

Figure 4E:
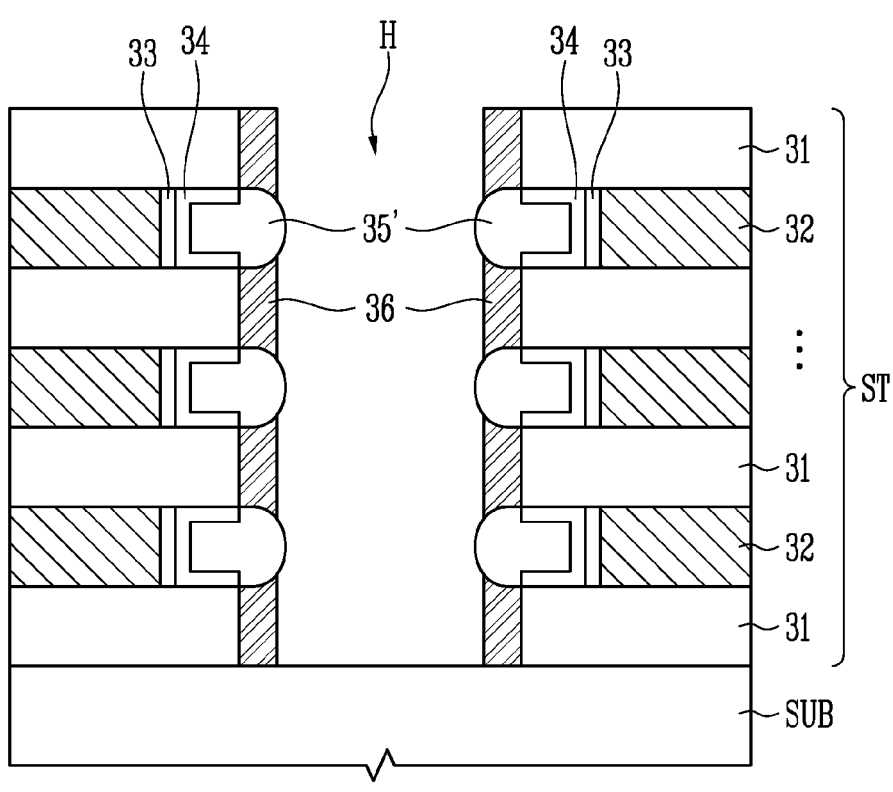

Referring to FIG. 4E, a sacrificial pattern 35' may be formed by performing an oxidation process to selectively oxidize the first sacrificial layer 35 (FIG. 4D). The sacrificial pattern 35' may be formed to have a protrusion protruding in the direction of the hole H.

Thereafter, a second sacrificial layer 36 may be formed in a space between the protrusions of the sacrificial pattern 35'. For example, after the second sacrificial layer 36 is formed on the sidewall of the hole H to fill a space between the protrusions of the sacrificial pattern 35', an etch-back process may be performed to expose a portion of the protrusion of the sacrificial pattern 35'. Thus, a second sacrificial layer 36 may remain in the space between the protrusions of the sacrificial patterns 35' that are adjacent to each other in the vertical direction. The second sacrificial layer 36 may be formed of a polysilicon layer or a silicon nitride layer.

Figure 4F:
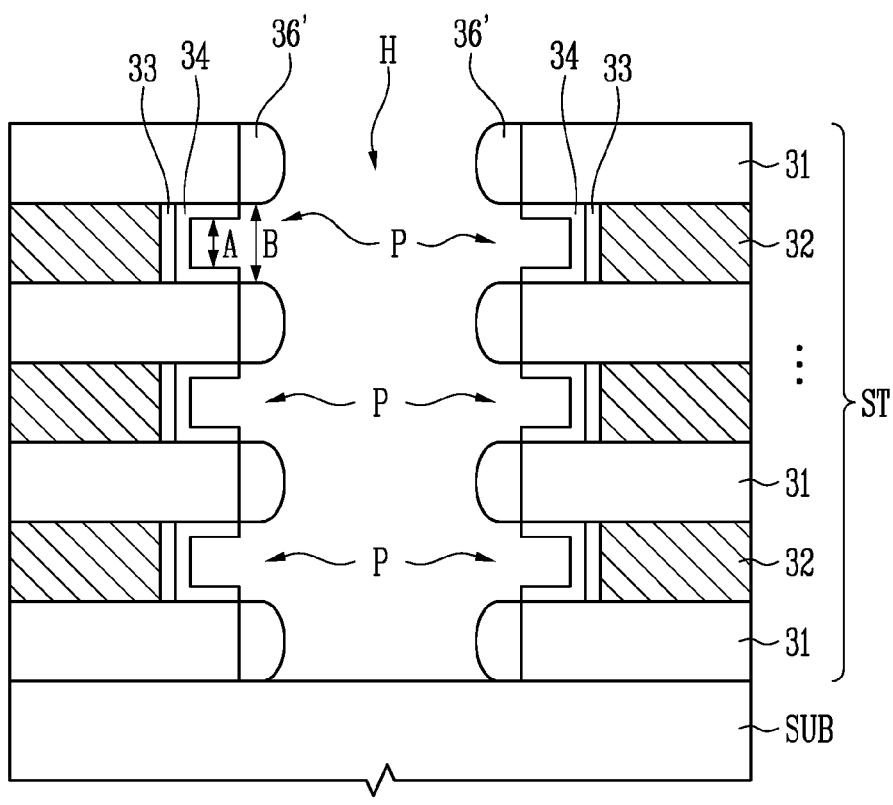

Referring to FIG. 4F, an etching process may be performed to remove the sacrificial pattern 35' (FIG. 4E). Thereafter, the insulating pattern 36' may be formed by selectively oxidizing the second sacrificial layer 36 (FIG. 4E). Thus, a pocket P including a space from which the sacrificial pattern 35' (see FIG. 4E) has been removed and a space between the insulating patterns 36' that are adjacent to each other in the vertical direction may be formed. The vertical length A of the space from which the sacrificial pattern 35' (see FIG. 4E) has been removed may be shorter than the vertical length B of the space between the insulating patterns 36' that are adjacent to each other in the vertical direction. In addition, the high dielectric layer 34 may be formed to contact only a space in the pocket P from which the sacrificial pattern 35' (see FIG. 4E) has been removed.

Figure 4G:
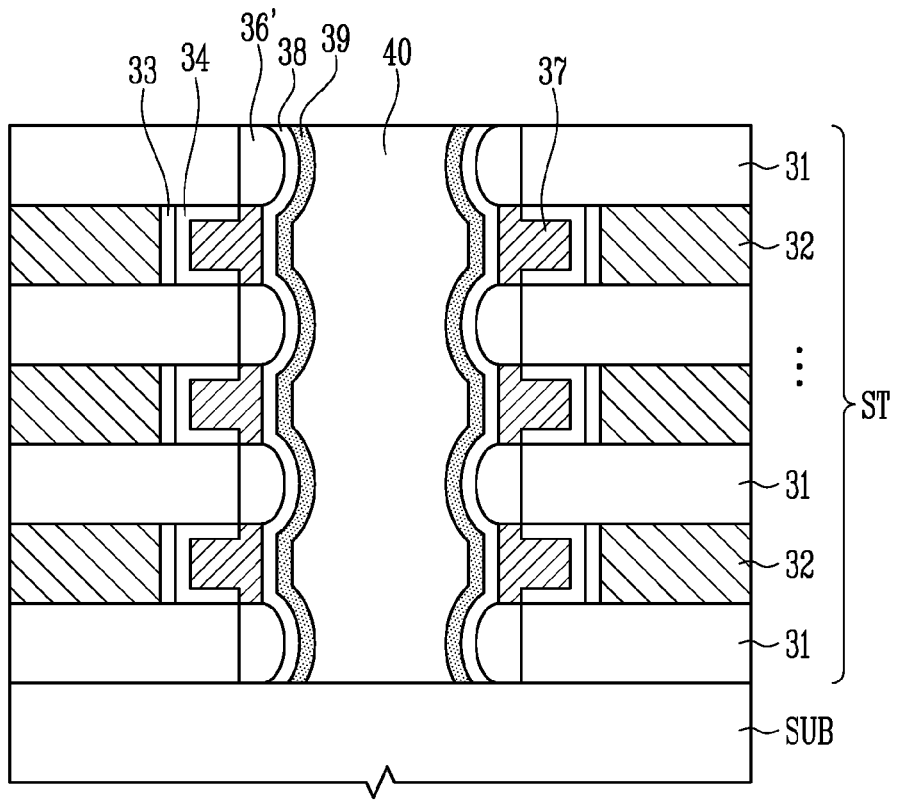

Referring to FIG. 4G, a floating gate 37 may be formed to fill the pocket P (see FIG. 4F). The floating gate 37 may include polysilicon. For example, a floating gate layer may be formed on the sidewall of the hole H (see FIG. 4F) to fill the pocket P (see FIG. 4F), and an etch-back process may be performed to expose a portion of the sidewall of the insulating pattern 36'. Thus, the floating gate 37 may remain only in the pocket P (see FIG. 4F), and the floating gates 37 that are adjacent to each other in the vertical direction may be electrically and physically spaced apart from each other by the insulating patterns 36'.

Thereafter, a tunnel insulating layer 38 may be formed along the sidewall of the insulating pattern 36' and the sidewall of the floating gate 37. The tunnel insulating layer 38 may be a layer through which electric charges tunnel via F-N tunneling or the like and may include an insulating material, such as oxide or nitride.

Subsequently, a channel layer 39 may be formed on the sidewall of the tunnel insulating layer 38. The channel layer 39 may be formed of a semiconductor material. In an embodiment, the channel layer 39 may include a semiconductor material, such as silicon or germanium, or may include a nanostructure, such as a nano dot, a nano tube, or graphene.

Thereafter, the core insulating layer 40 may be formed to fill the central portion of the hole. The core insulating layer 40 may be formed of an oxide layer.

Figure 4H:
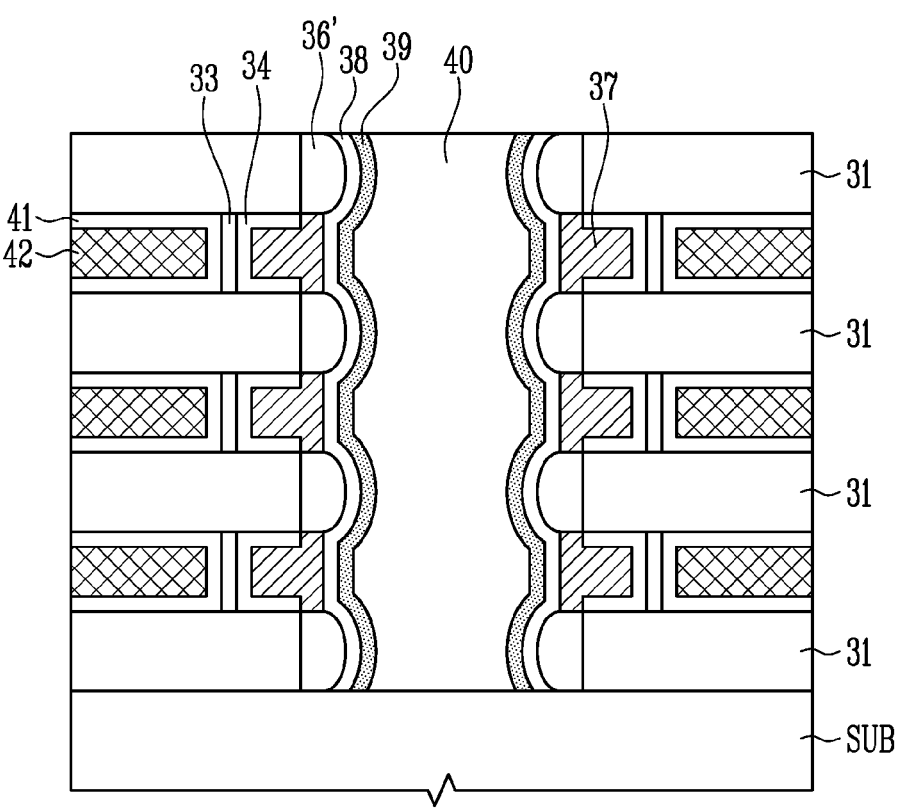

Referring to FIG. 4H, an etching process may be performed so that a sidewall of the stacked structure ST (see FIG. 4G) is exposed, and the exposed second material layer 32 (FIG. 4G) may be removed. Thereafter, a blocking insulating layer 41 may be formed along the exposed upper and lower surfaces of the first material layers 31 and the exposed surface of the low dielectric layer 33. Thereafter, a third material layer 42 may be formed in the space from which the second material layer 32 (see FIG. 4G) has been removed. The third material layer 42 may include a conductive material, such as polysilicon, tungsten, or metal.

FIGS. 5A to 5G are sectional views illustrating a method of manufacturing a semiconductor device according to an embodiment of the present disclosure.

Figure 5A:
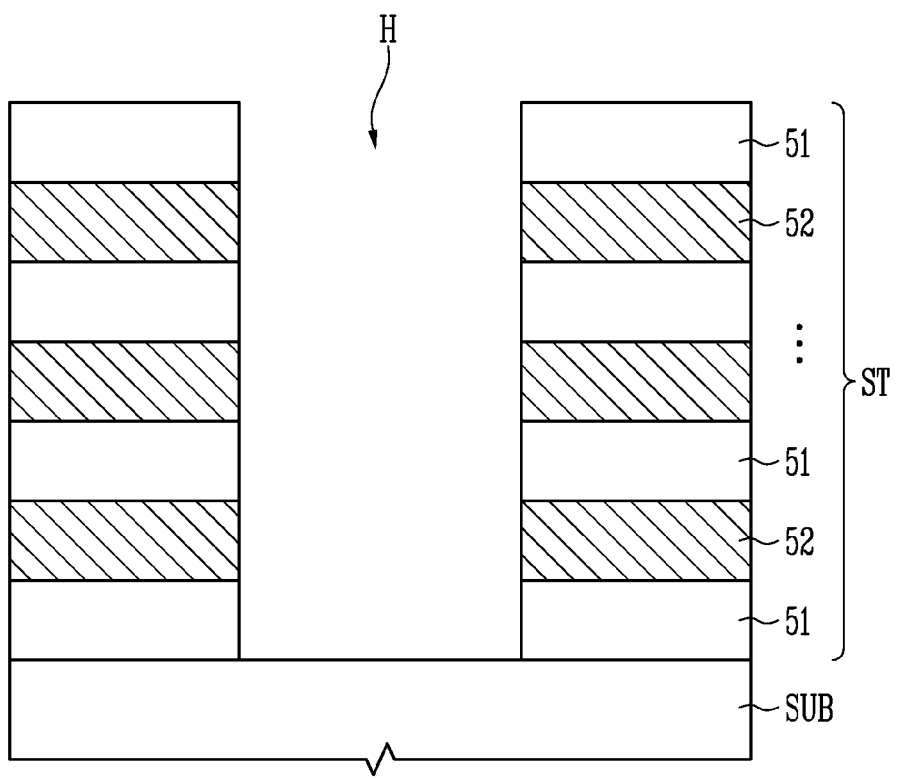
FIGS. 5A to 5G are sectional views illustrating a method of manufacturing a semiconductor device according to an embodiment of the present disclosure.

Referring to FIG. 5A, a stacked structure ST may be formed on a substrate SUB. The stacked structure ST may include first material layers 51 and second material layers 52 that are alternately stacked. The first and second material layers 51 and 52 may be stacked in a direction that is perpendicular to the substrate SUB. The first and second material layers 51 and 52 may be formed through a deposition process, such as CVD.

The first material layers 51 may include material having a high etch selectivity compared to the second material layers 52. In an embodiment, the first material layers 51 may include an insulating material, such as oxide, and the second material layers 52 may include a sacrificial material, such as nitride. In an embodiment, the first material layers 51 may include an insulating material, such as oxide, and the second material layers 52 may include a conductive material, such as polysilicon or tungsten.

Subsequently, a hard mask pattern (not shown) may be formed on the stacked structure ST, and an etching process that uses the hard mask pattern may be performed to form a hole H that passes through at least a portion of the stacked structure ST. The hole H may partially extend into the substrate SUB.

Figure 5B:
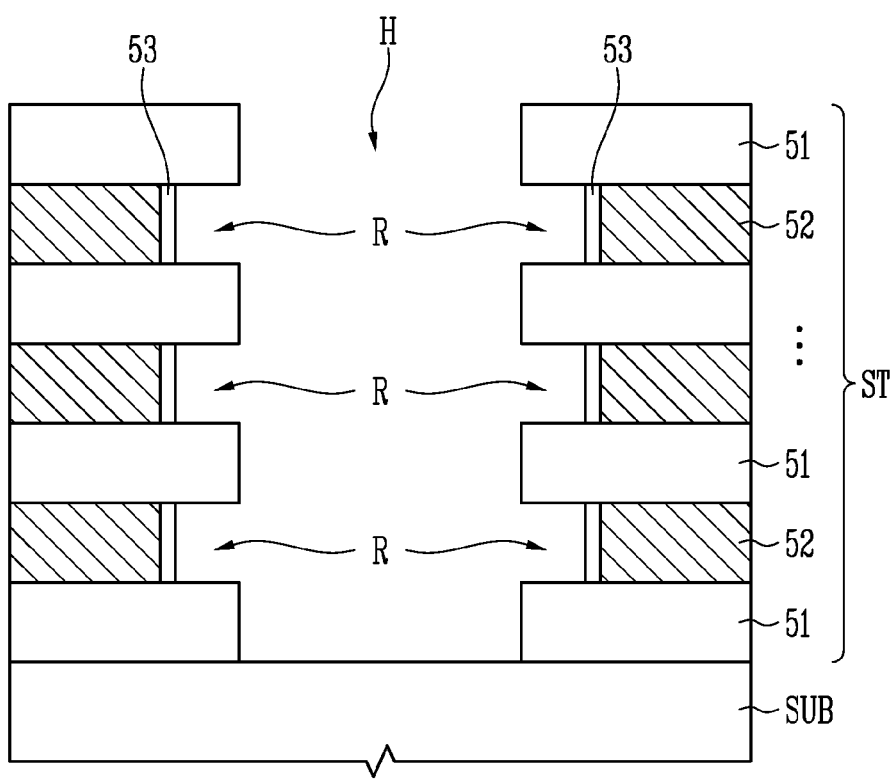

Referring to FIG. 5B, the second material layers 52 that are exposed through the hole H may be etched to a predetermined depth in a horizontal direction to form a recess area R. In other words, the sidewalls of the second material layers 52 may be etched to a predetermined depth so that the first material layers 51 protrude farther than the second material layers 52 in the horizontal direction.

Thereafter, a low dielectric layer 53 may be formed on a sidewall of each of the exposed second material layers 52. The low dielectric layer 53 may be selectively formed only on the sidewall of each of the second material layers 52 through a radical oxidation process.

Figure 5C:
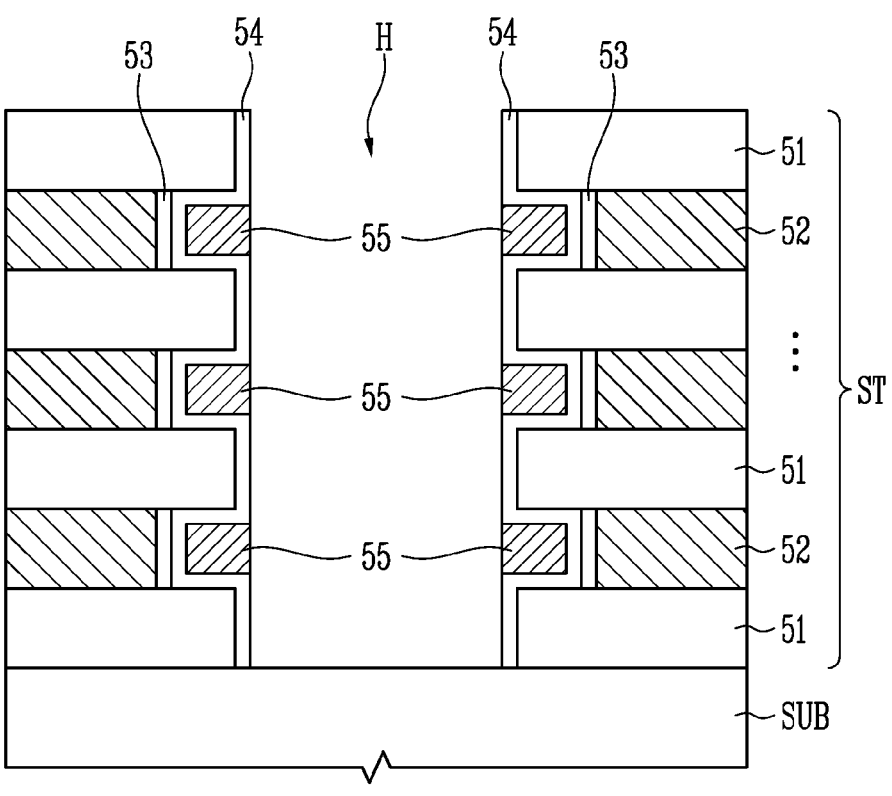

Referring to FIG. 5C, a high dielectric layer 54 may be formed along a sidewall of the hole H. For instance, the high dielectric layer 54 may be formed along protruding surfaces of the first material layers 51 and an exposed surface of the low dielectric layer 53. The high dielectric layer 54 may be formed to include a high dielectric constant material, such as aluminum oxide ($Al_2O_3$), hafnium oxide (HfOx), or hafnium silicon oxide (HfSiOx).

Thereafter, a first sacrificial layer 55 may be formed in a space between the protruding first material layers 51. For example, after forming the first sacrificial layer 55 on the sidewall of the hole H to fill the space between the protruding first material layers 51, an etch-back process may be performed so that the high dielectric layer 54 that is formed on the sidewall of each of the first material layers 51 is exposed. Thus, the first sacrificial layer 55 may remain only in the space between the protrusions of the first material layers 51 that are adjacent to each other in the vertical direction. The first sacrificial layer 55 may be formed of a polysilicon layer or a silicon nitride layer.

Figure 5D:
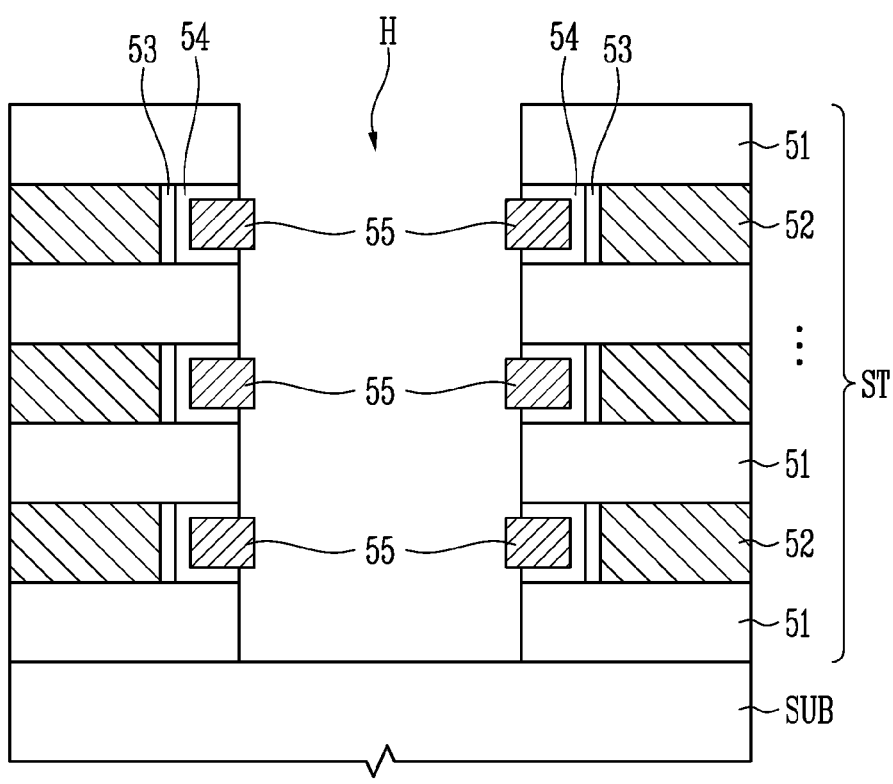

Referring to FIG. 5D, an etching process may be performed to remove the high dielectric layer 54 that is formed on the sidewall of each of the first material layers 51. Thus, the sidewall of each of the first material layers 51 may be exposed. The remaining high dielectric layer 54 encloses a portion of the first sacrificial layer 55 by covering a sidewall, a portion of an upper surface, and a portion of a lower surface of the first sacrificial layer 55, the sidewall being adjacent to the low dielectric layer 53.

Figure 5E:
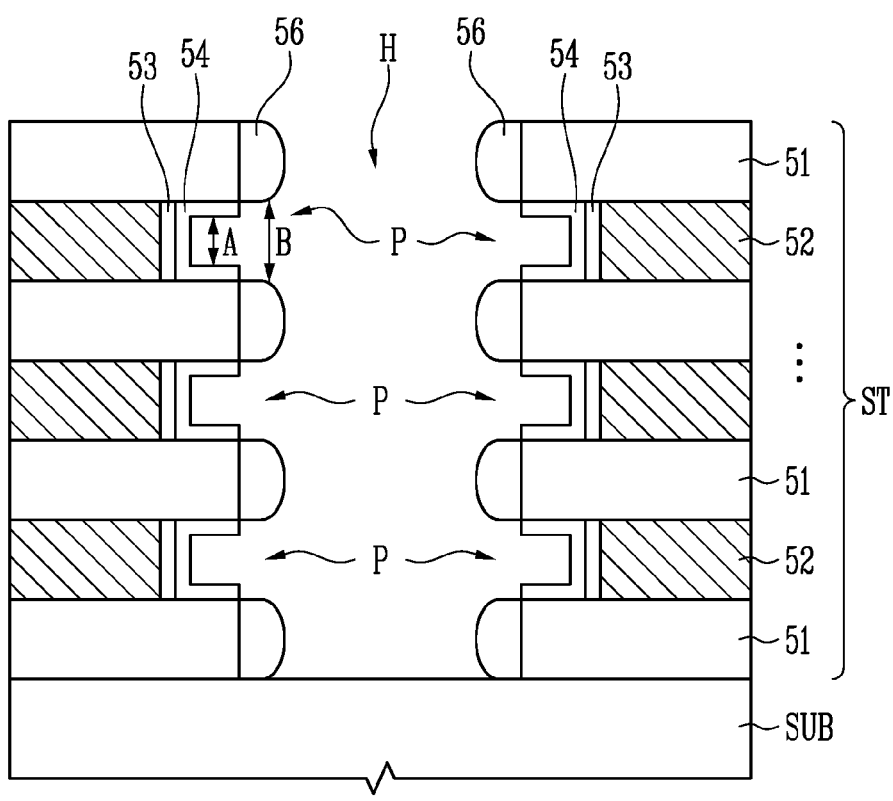

Referring to FIG. 5E, the first sacrificial layer 55 (see FIG. 5D) may be removed. Thereafter, an insulating pattern 56 may be formed by performing a selective oxide layer deposition process on the exposed sidewall of each of the first material layers 51. Thus, a pocket P including a space from which the first sacrificial layer 55 (see FIG. 5D) has been removed and a space between the insulating patterns 56 that are adjacent to each other in the vertical direction may be formed. The vertical length A of the space from which the first sacrificial layer 55 (see FIG. 5D) has been removed may be shorter than the vertical length B of the space between the insulating patterns 56 that are adjacent to each other in the vertical direction. In addition, the high dielectric layer 54 may be formed to contact only a space in the pocket P from which the first sacrificial layer 55 (see FIG. 5D) has been removed.

Figure 5F:
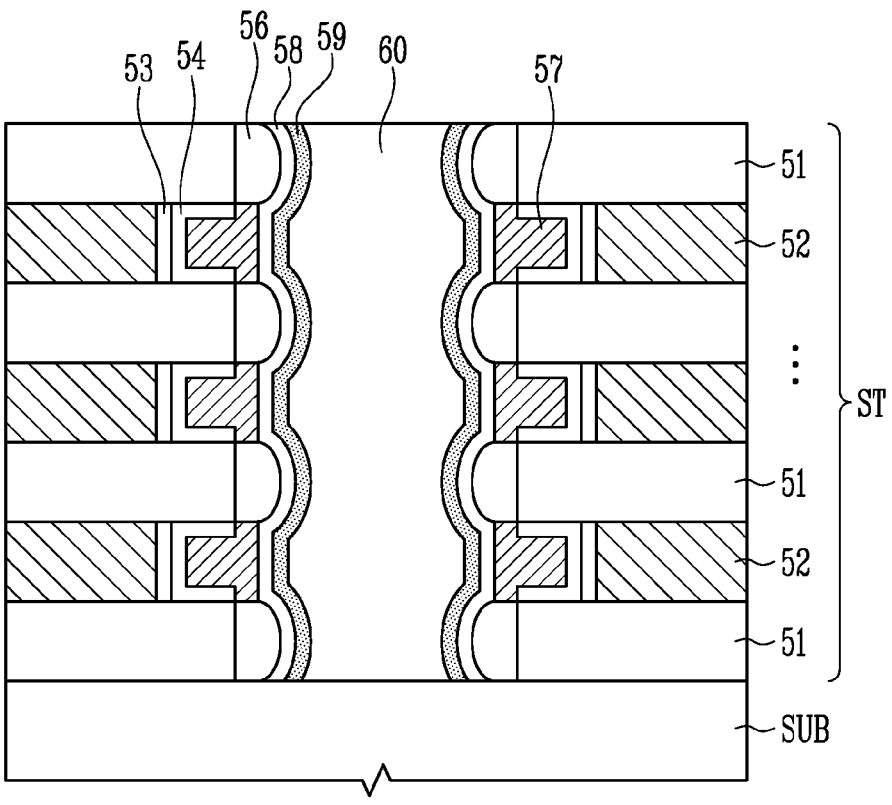

Referring to FIG. 5F, a floating gate 57 may be formed to fill each pocket P (see FIG. 5E). The floating gate 57 may include polysilicon. For example, a floating gate layer may be formed on the sidewall of the hole H (see FIG. 5E) to fill the pocket P (see FIG. 5E), and an etch-back process may be performed to expose a portion of the sidewall of the insulating pattern 56. Thus, the floating gate 57 may remain only in the pocket P (see FIG. 5E), and the floating gates 57 that are adjacent to each other in the vertical direction may be electrically and physically spaced apart from each other by the insulating patterns 56.

Thereafter, a tunnel insulating layer 58 may be formed along the sidewall of the insulating pattern 56 and the sidewall of the floating gate 57. The tunnel insulating layer 58 may be a layer through which electric charges tunnel via F-N tunneling or the like and may include an insulating material, such as oxide or nitride.

Subsequently, a channel layer 59 may be formed on the sidewall of the tunnel insulating layer 58. The channel layer 59 may be formed of a semiconductor material. In an embodiment, the channel layer 59 may include a semiconductor material, such as silicon or germanium, or may include a nanostructure, such as a nano dot, a nano tube, or graphene.

Thereafter, the core insulating layer 60 may be formed to fill the central portion of the hole. The core insulating layer 60 may be formed of an oxide layer.

Figure 5G:
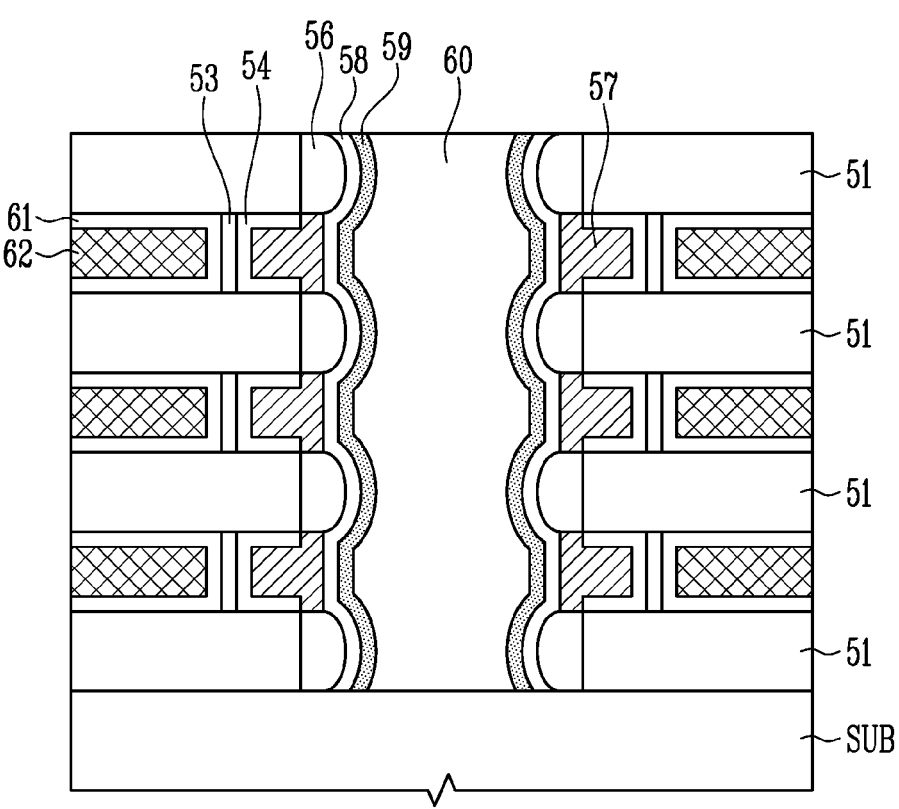

Referring to FIG. 5G, an etching process may be performed so that a sidewall of the stacked structure ST (see FIG. 5F) is exposed, and the exposed second material layer 52 (FIG. 5F) may be removed. Thereafter, a blocking insulating layer 61 may be formed along the exposed upper and lower surfaces of the first material layers 51 and the exposed surface of the low dielectric layer 53. Thereafter, the third material layer 62 may be formed in the space from which the second material layer 52 (see FIG. 5F) has been removed. The third material layer 62 may include a conductive material, such as polysilicon, tungsten, or metal.

Figure 6:
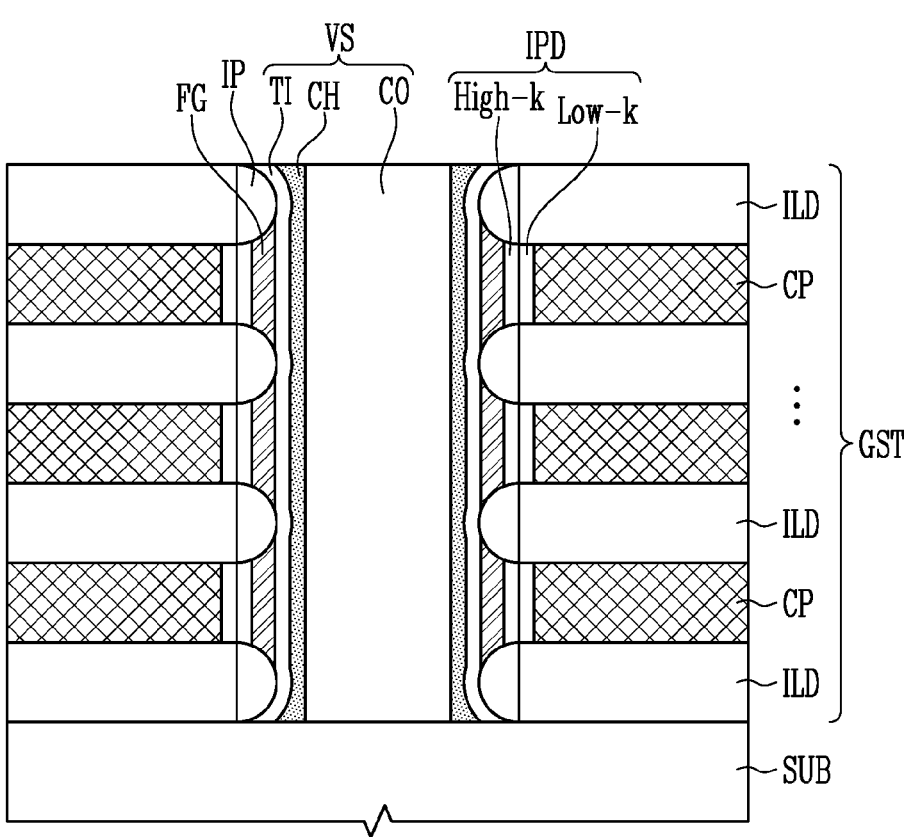
FIG. 6 is a sectional view illustrating a semiconductor device according to an embodiment of the present disclosure.

FIG. 6 is a sectional view illustrating a semiconductor device according to an embodiment of the present disclosure.

Referring to FIG. 6, the semiconductor device may include a gate stacked structure GST, a vertical structure VS, an insulating pattern IP, a floating gate FG, and a dielectric pattern IPD.

The gate stacked structure GST may include conductive layers CP and interlayer insulating layers ILD that are alternately stacked. The conductive layers CP may be gate electrodes, such as a select transistor or a memory cell. The conductive layers CP may be a select line that is coupled to the select transistor and a word line that is coupled to the memory cell. The conductive layers CP may include a conductive material, such as polysilicon, tungsten, or metal. The interlayer insulating layers ILD may function to insulate the stacked conductive layers CP from each other. The interlayer insulating layers ILD may include an insulating material, such as oxide or nitride. The interlayer insulating layers ILD may have a structure that protrudes in the direction of the vertical structure VS with respect to the conductive layers CP.

The vertical structure VS may extend in a vertical direction through the gate stacked structure GST. That is, the vertical structure VS may extend in a stacking direction of the gate stacked structure GST. The stacking direction of the gate stacked structure GST may be defined as the stacking direction of the alternately stacked conductive layers CP and the interlayer insulating layers ILD included in the gate stacked structure GST.

The vertical structure VS may include a core insulating layer CO, a channel layer CH, and a tunnel insulating layer TI. The core insulating layer CO may extend in a direction that is perpendicular to the substrate SUB. The core insulating layer CO may be formed in a central area of the vertical structure VS and may include an insulating material, such as oxide. The channel layer CH may be an area in which the channel, such as the select transistor or the memory cell, is formed. The channel layer CH may extend in a vertical direction and may be formed to enclose an outer wall of the core insulating layer CO. The channel layer CH may include a semiconductor material, such as silicon or germanium, or may include a nanostructure, such as a nano dot, a nano tube, or graphene. The tunnel insulating layer TI may extend in the vertical direction and may be formed to enclose an outer wall of the channel layer CH. The tunnel insulating layer TI may be a layer through which electric charges tunnel via F-N tunneling or the like and may include an insulating material, such as oxide or nitride.

The insulating pattern IP may be disposed between each of the interlayer insulating layers ILD and the vertical structure VS. The insulating pattern IP separates floating gates FG, which are vertically adjacent to each other, from each other. The insulating pattern IP may include an insulating material, such as oxide or nitride. The insulating pattern IP may be formed to directly contact sidewalls of the interlayer insulating layers ILD. The insulating pattern IP may have a semicircular shape, and a sidewall thereof facing the vertical structure VS may have a rounded surface.

The floating gate FG may be disposed in a space between the insulating patterns IP that are adjacent to each other in the vertical direction. The floating gate FG may be disposed in a space between the conductive layers CP and the vertical structure VS. A length of a first sidewall contacting the dielectric pattern IPD, among both sidewalls of the floating gate FG, may be shorter than a length of a second sidewall contacting the tunnel insulating layer TI. The floating gate FG may trap charges that are introduced by tunneling the tunnel insulating layer TI during a program operation. The floating gate FG may include polysilicon.

The dielectric pattern IPD may be disposed between each of the floating gates FG and each of the conductive layers CP. The dielectric pattern IPD may include a high dielectric layer High-k and a low dielectric layer Low-k. The high dielectric layer High-k may contact a first sidewall of the floating gate FG. The high dielectric layer High-k may be disposed in a space between the insulating patterns IP that are adjacent to each other in the vertical direction. The high dielectric layer High-k may include a high dielectric constant material, such as aluminum oxide ($Al_2O_3$), hafnium oxide (HfOx), or hafnium silicon oxide (HfSiOx).

The low dielectric layer Low-k may be disposed between the high dielectric layer High-k and each of the conductive layers CP. The low dielectric layer Low-k may be disposed in a space between the protrusions of the conductive layers CP that are adjacent to each other in the vertical direction. The low dielectric layer Low-k may have a dielectric permittivity that is lower than that of the high dielectric layer High-k. The low dielectric layer Low-k may be formed of a radical oxide layer.

FIGS. 7A to 7G are sectional views illustrating a method of manufacturing a semiconductor device according to an embodiment of the present disclosure.

Figure 7A:
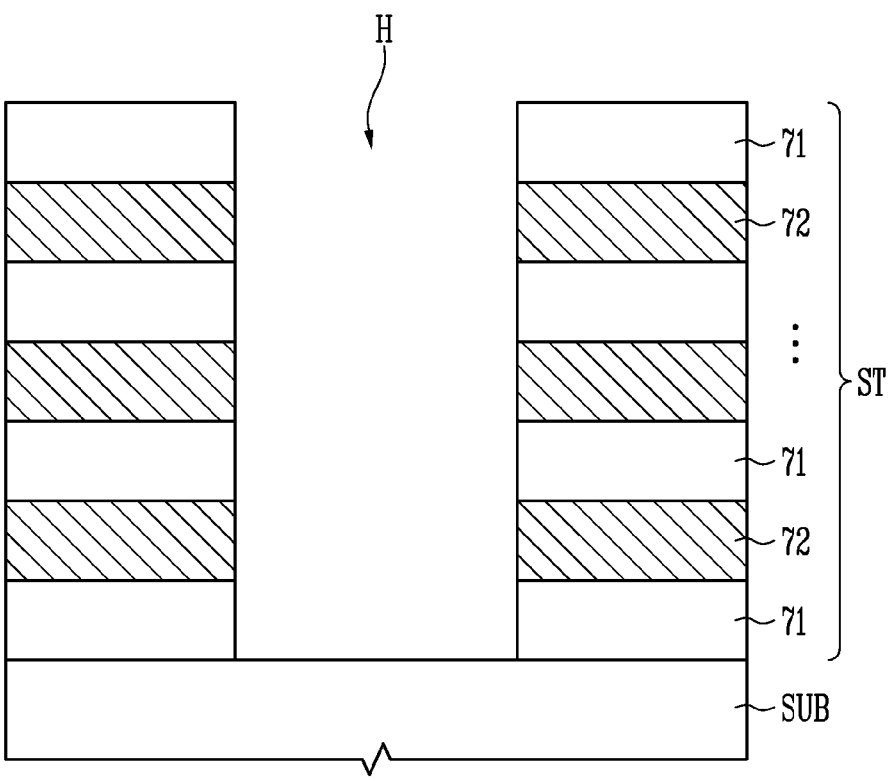
FIGS. 7A to 7G are sectional views illustrating a method of manufacturing a semiconductor device according to an embodiment of the present disclosure.

Referring to FIG. 7A, a stacked structure ST may be formed on a substrate SUB. The stacked structure ST may include first material layers 71 and second material layers 72 that are alternately stacked. The first and second material layers 71 and 72 may be stacked in a direction that is perpendicular to the substrate SUB. The first and second material layers 71 and 72 may be formed through a deposition process, such as CVD.

The first material layers 71 may include material having a high etch selectivity compared to the second material layers 72. In an embodiment, the first material layers 71 may include an insulating material, such as oxide, and the second material layers 72 may include a sacrificial material, such as nitride. In an embodiment, the first material layers 71 may include an insulating material, such as oxide, and the second material layers 72 may include a conductive material, such as polysilicon or tungsten.

Subsequently, a hard mask pattern (not shown) may be formed on the stacked structure ST, and an etching process that uses the hard mask pattern may be performed to form a hole H that passes through at least a portion of the stacked structure ST. The hole H may partially extend into the substrate SUB.

Figure 7B:
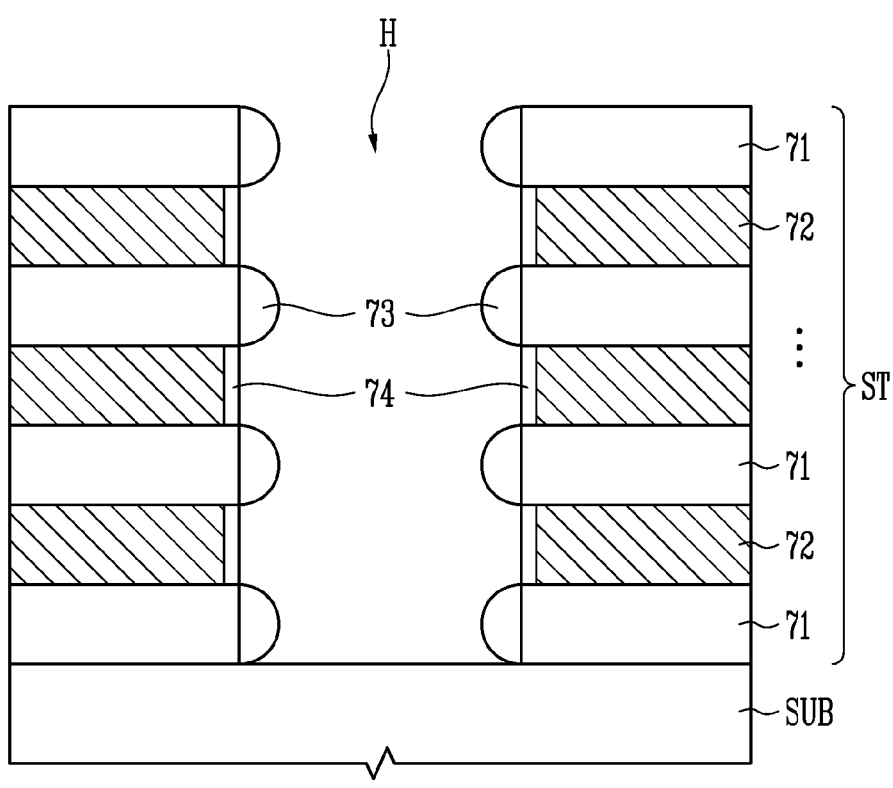

Referring to FIG. 7B, an insulating pattern 73 may be formed by performing a selective oxide layer deposition process on sidewalls of the first material layers 71 that are exposed through the hole H. The insulating pattern 73 may be formed in a semicircular shape.

Thereafter, by performing a radical oxidation process, the exposed sidewalls of the second material layers 72 may be oxidized to a predetermined thickness to form low dielectric layers 74. The low dielectric layers 74 may be formed between the first material layers 71 that are adjacent to each other in the vertical direction.

In an embodiment, after forming the semicircular insulating pattern 73, an oxide layer deposition process may be performed to form the low dielectric layer 74 along the sidewall of the insulating pattern 73 and the sidewall of each of the second material layers 72.

Figure 7C:
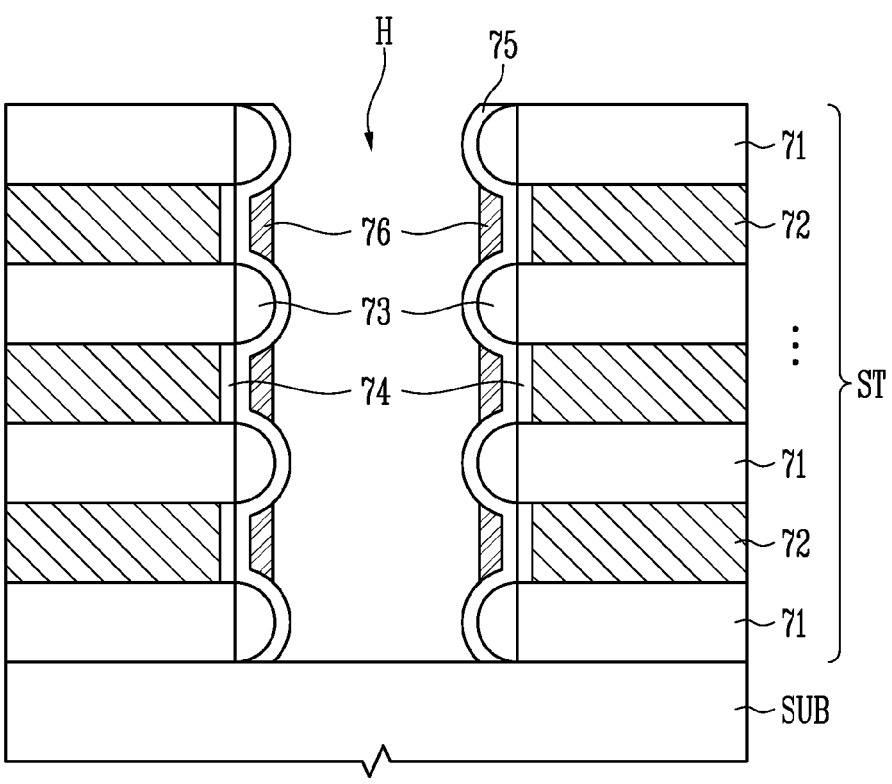

Referring to FIG. 7C, a high dielectric layer 75 may be formed along the sidewall of the insulating pattern 73 and the sidewall of the low dielectric layer 74. The high dielectric layer 75 may be formed to include a high dielectric constant material, such as aluminum oxide ($Al_2O_3$), hafnium oxide (HfOx), or hafnium silicon oxide (HfSiOx).

Thereafter, a sacrificial pattern 76 may be formed in a space between the insulating patterns 73 that are adjacent to each other in the vertical direction. The sacrificial pattern 76 may be formed of a polysilicon layer or a silicon nitride layer. For example, after a sacrificial layer is formed on the sidewall of the hole H to fill the space between the insulating patterns 73, an etch-back process may be performed so that the sacrificial layer remains only in the space between the insulating patterns 73, thus forming the sacrificial pattern 76. During the etch-back process, the high dielectric layer 75 covering the curved sidewall of each of the insulating patterns 73 may be exposed.

Figure 7D:
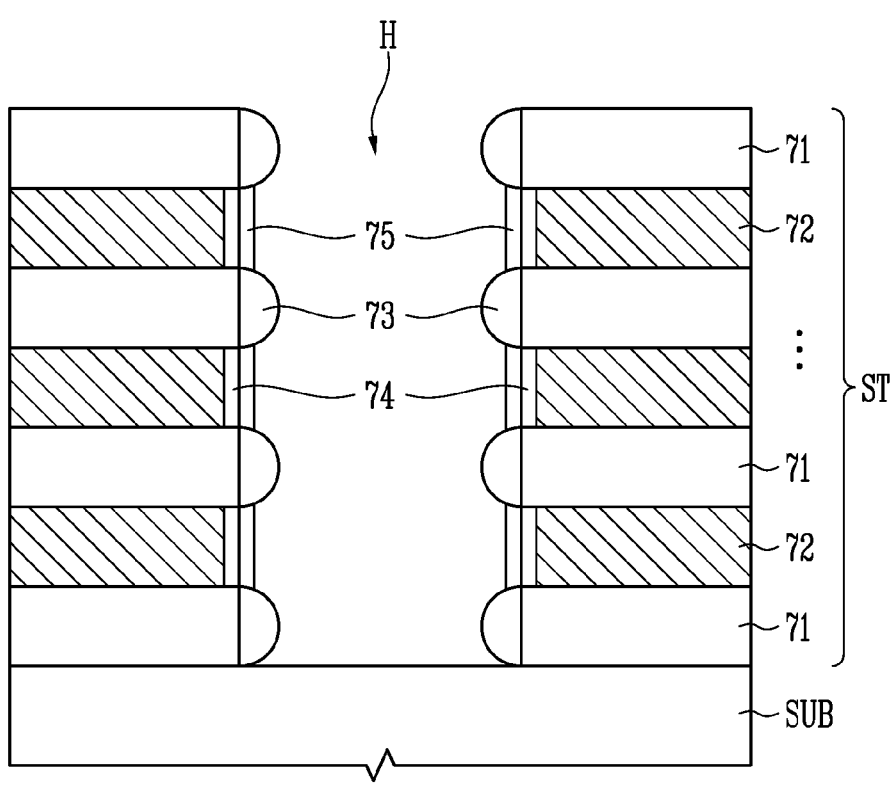

Referring to FIG. 7D, the high dielectric layer 75, which is exposed so that the high dielectric layer 75 remains only on the sidewall of the low dielectric layer 74, may be etched. Thereafter, the sacrificial pattern 76 (see FIG. 7C) may be removed.

Figure 7E:
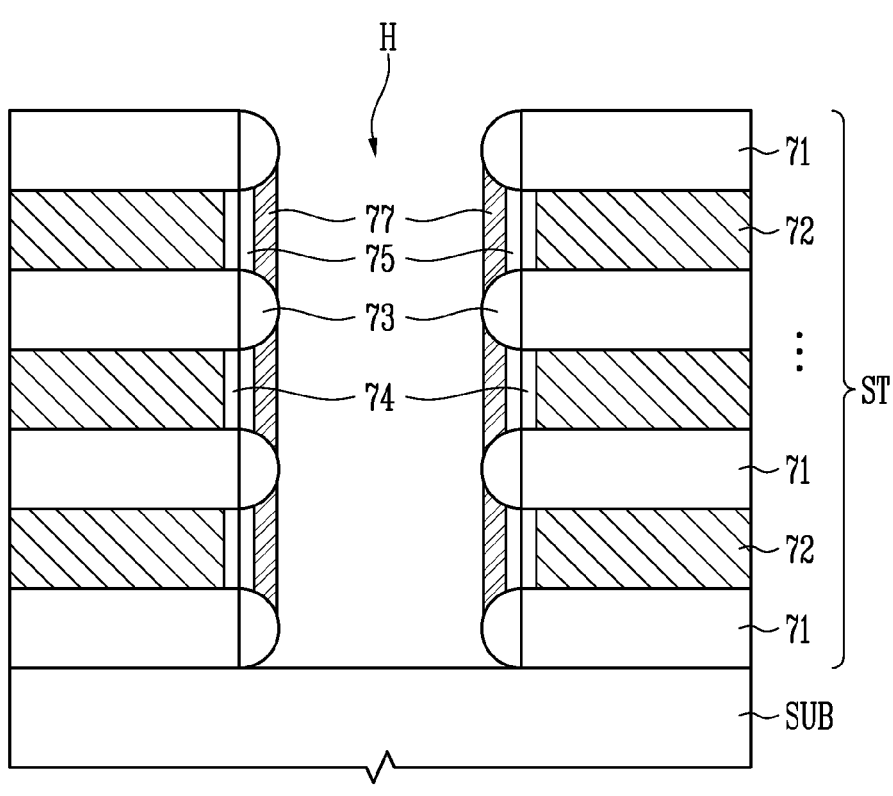

Referring to FIG. 7E, a floating gate 77 may be formed to contact the sidewall of the high dielectric layer 75 while filling the space between the insulating patterns 73 that are adjacent to each other in the vertical direction. The floating gate 77 may include polysilicon. For example, a floating gate layer may be formed on the sidewall of the hole H to fill the space between the vertically adjacent insulating patterns 73, and an etch-back process may be performed so that a portion of the sidewall of the insulating pattern 73 is exposed. Thus, the floating gate 77 may remain only in the space between the vertically adjacent insulating patterns 73, and the vertically adjacent floating gates 77 may be electrically and physically spaced apart from each other by the insulating pattern 73.

Figure 7F:
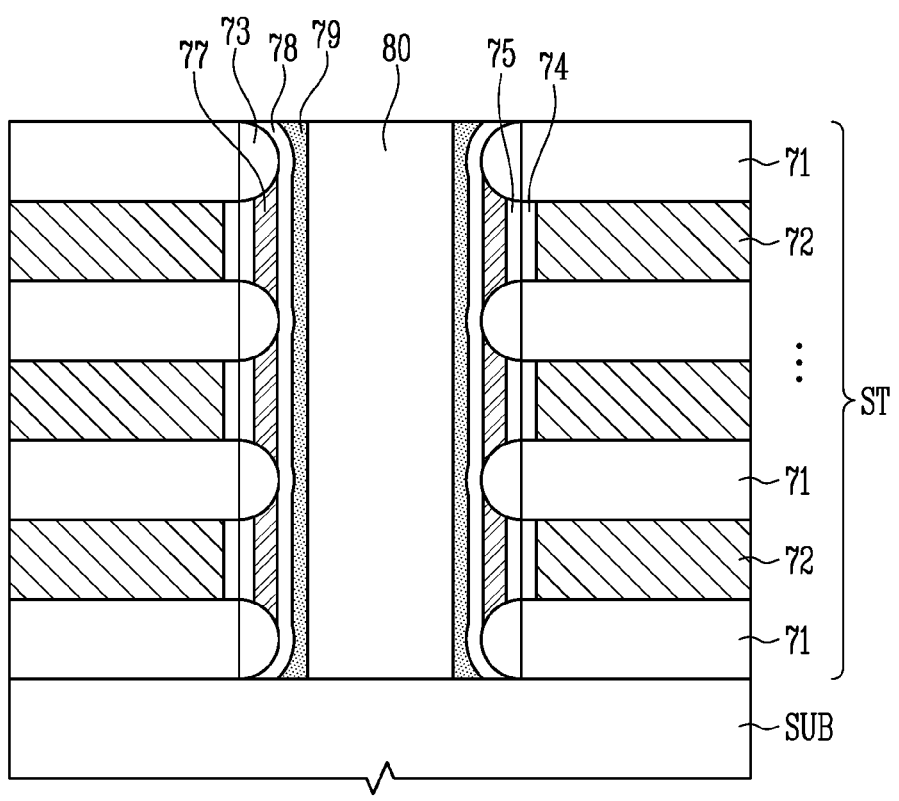

Referring to FIG. 7F, a tunnel insulating layer 78 may be formed along the sidewall of the insulating pattern 73 and the sidewall of the floating gate 77. The tunnel insulating layer 78 may be a layer through which electric charges tunnel via F-N tunneling or the like and may include an insulating material, such as oxide or nitride.

Subsequently, a channel layer 79 may be formed on the sidewall of the tunnel insulating layer 78. The channel layer 79 may be formed of a semiconductor material. In an embodiment, the channel layer 79 may include a semiconductor material, such as silicon or germanium, or may include a nanostructure, such as a nano dot, a nano tube, or graphene.

Thereafter, a core insulating layer 80 may be formed to fill the central portion of the hole. The core insulating layer 80 may be formed of an oxide layer.

Figure 7G:
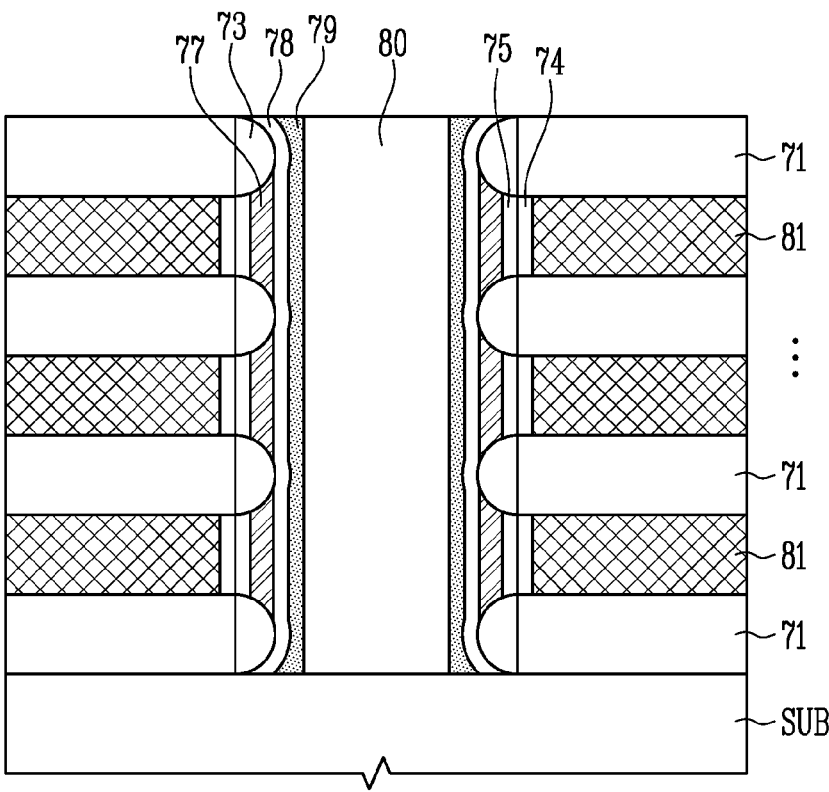

Referring to FIG. 7G, an etching process may be performed so that a sidewall of the stacked structure ST (see FIG. 7F) is exposed, and the exposed second material layer 72 (FIG. 7F) may be removed. Thereafter, the third material layer 81 may be formed in the space from which the second material layer 72 (see FIG. 7F) has been removed. The third material layer 81 may include a conductive material, such as polysilicon, tungsten, or metal. In an embodiment, after removing the exposed second material layer 72 (FIG. 7F), a blocking insulating layer (not shown) may be formed along the upper surface and lower surface of the first material layer

71 and the sidewall of the low dielectric layer 74. The blocking insulating layer may be formed of a material having a dielectric permittivity that is higher than that of the low dielectric layer 74.

FIGS. 8A to 8F are sectional views illustrating a method of manufacturing a semiconductor device according to an embodiment of the present disclosure.

Figure 8A:
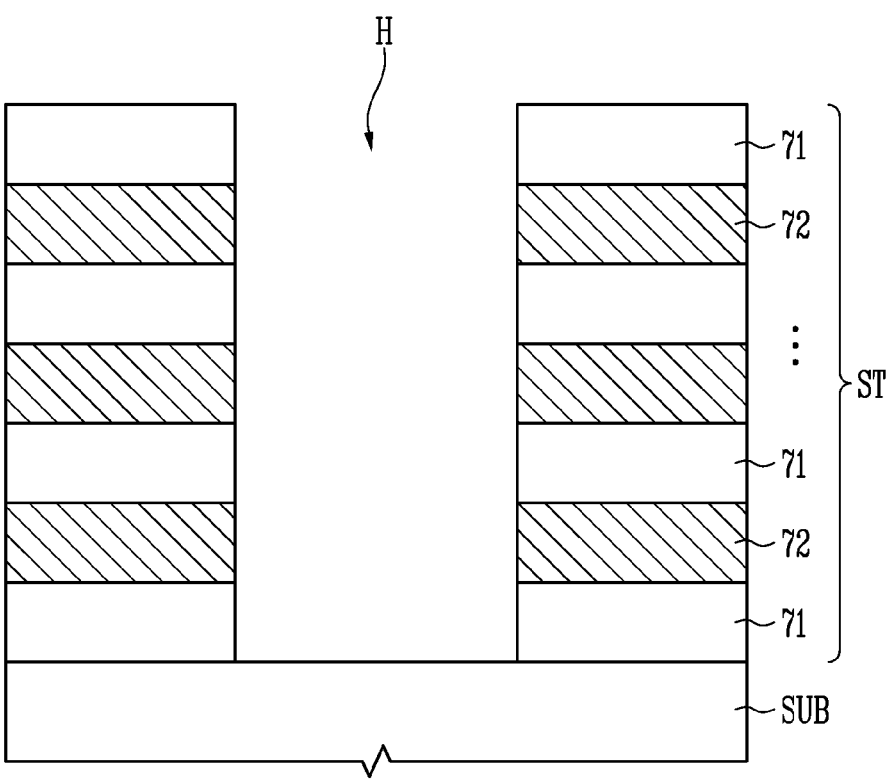
FIGS. 8A to 8F are sectional views illustrating a method of manufacturing a semiconductor device according to an embodiment of the present disclosure.

Referring to FIG. 8A, a stacked structure ST may be formed on a substrate SUB. The stacked structure ST may include first material layers 71 and second material layers 72 that are alternately stacked. The first and second material layers 71 and 72 may be stacked in a direction that is perpendicular to the substrate SUB. The first and second material layers 71 and 72 may be formed through a deposition process, such as CVD.

The first material layers 71 may include material having a high etch selectivity compared to the second material layers 72. In an embodiment, the first material layers 71 may include an insulating material, such as oxide, and the second material layers 72 may include a sacrificial material, such as nitride. In an embodiment, the first material layers 71 may include an insulating material, such as oxide, and the second material layers 72 may include a conductive material, such as polysilicon or tungsten.

Subsequently, a hard mask pattern (not shown) may be formed on the stacked structure ST, and an etching process that uses the hard mask pattern may be performed to form a hole H that passes through at least a portion of the stacked structure ST. The hole H may partially extend into substrate SUB.

Figure 8B:
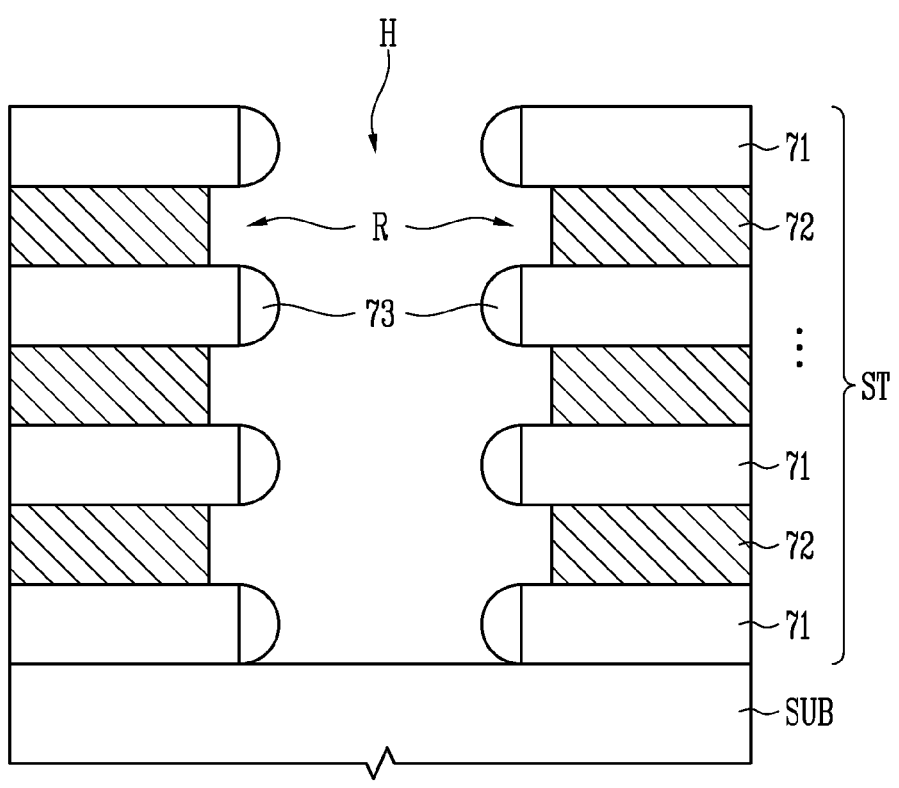

Referring to FIG. 8B, an insulating pattern 73 may be formed by performing a selective oxide layer deposition process on a sidewall of each of the first material layers 71. The insulating pattern 73 may be formed in a semicircular shape.

Thereafter, a sidewall of each of the second material layers 72 that is exposed through the hole H may be etched to a predetermined thickness to form a recess area R.

Figure 8C:
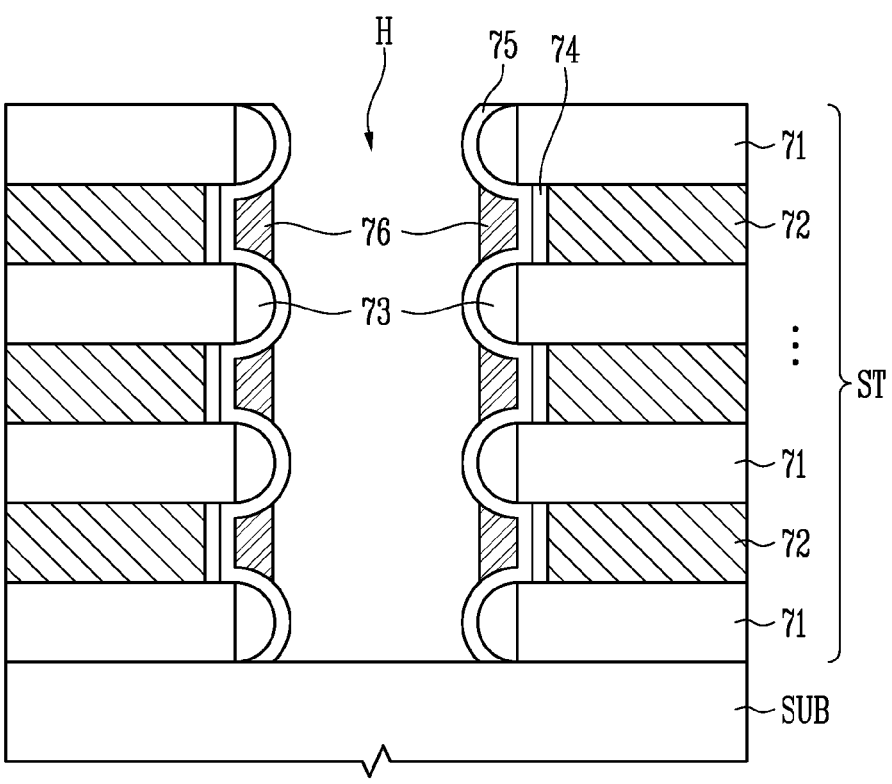

Referring to FIG. 8C, by performing a radical oxidation process, the exposed sidewall of each of the second material layers 72 may be oxidized to a predetermined thickness to form a low dielectric layer 74. The low dielectric layers 74 may be formed between the first material layers 71 that are adjacent to each other in the vertical direction.

In an embodiment, an oxide layer deposition process may be performed to form the low dielectric layer 74 along the sidewall of the insulating pattern 73 and the sidewall of each of the second material layers 72.

Subsequently, a high dielectric layer 75 may be formed along the sidewall of the insulating pattern 73 and the sidewall of the low dielectric layer 74. The high dielectric layer 75 may be formed to include a high dielectric constant material, such as aluminum oxide ($Al_2O_3$), hafnium oxide (HfOx), or hafnium silicon oxide (HfSiOx). The high dielectric layer 75 may be formed to cover a portion of the upper surface and a portion of the lower surface of each of the first material layers 71 that are exposed in the recess area.

Thereafter, a sacrificial pattern 76 may be formed in a space between the insulating patterns 73 that are adjacent to each other in the vertical direction. The sacrificial pattern 76 may be formed of a polysilicon layer or a silicon nitride layer. For example, after a sacrificial layer is formed on the sidewall of the hole H to fill the space between the insulating patterns 73, an etch-back process may be performed so that the sacrificial layer remains only in the space between the insulating patterns 73, thus forming the sacrificial pattern 76.

During the etch-back process, the high dielectric layer 75 covering the curved sidewall of each of the insulating patterns 73 may be exposed.

Figure 8D:
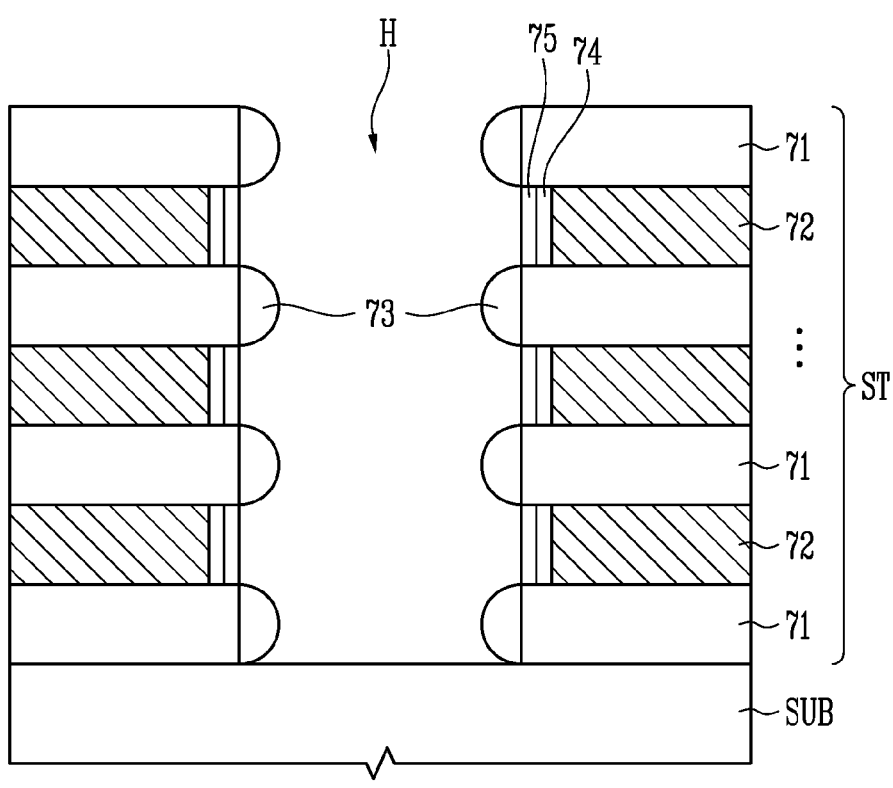

Referring to FIG. 8D, the high dielectric layer 75, which is exposed so that the high dielectric layer 75 remains only on the sidewall of the low dielectric layer 74, may be etched. Thereafter, the sacrificial pattern 76 (see FIG. 8C) may be removed.

Figure 8E:
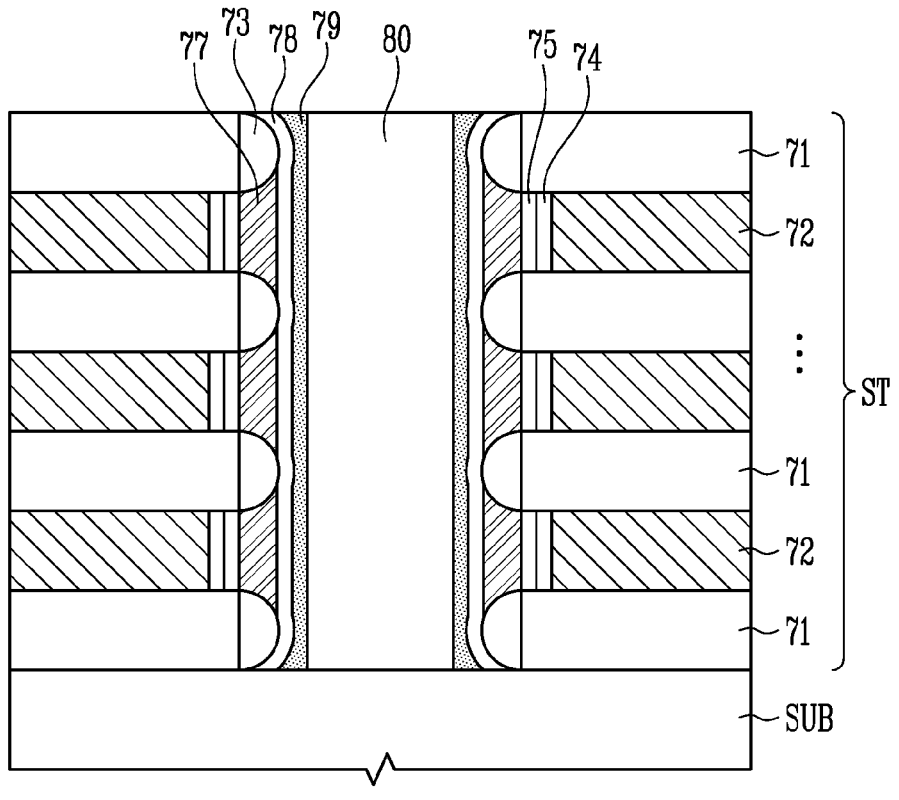

Referring to FIG. 8E, a floating gate 77 may be formed to contact the sidewall of the high dielectric layer 75 while filling the space between the insulating patterns 73 that are adjacent to each other in the vertical direction. The floating gate 77 may include polysilicon. For example, a floating gate layer may be formed on the sidewall of the hole H to fill the space between the vertically adjacent insulating patterns 73, and an etch-back process may be performed so that a portion of the sidewall of the insulating pattern 73 is exposed. Thus, the floating gate 77 may remain only in the space between the vertically adjacent insulating patterns 73, and the vertically adjacent floating gates 77 may be electrically and physically spaced apart from each other by the insulating pattern 73.

Thereafter, a tunnel insulating layer 78 may be formed along the sidewall of the insulating pattern 73 and the sidewall of the floating gate 77. The tunnel insulating layer 78 may be a layer through which electric charges tunnel via F-N tunneling or the like and may include an insulating material, such as oxide or nitride.

Subsequently, a channel layer 79 may be formed on the sidewall of the tunnel insulating layer 78. The channel layer 79 may be formed of a semiconductor material. In an embodiment, the channel layer 79 may include a semiconductor material, such as silicon or germanium, or may include a nanostructure, such as a nano dot, a nano tube, or graphene.

Thereafter, a core insulating layer 80 may be formed to fill the central portion of the hole. The core insulating layer 80 may be formed of an oxide layer.

Figure 8F:
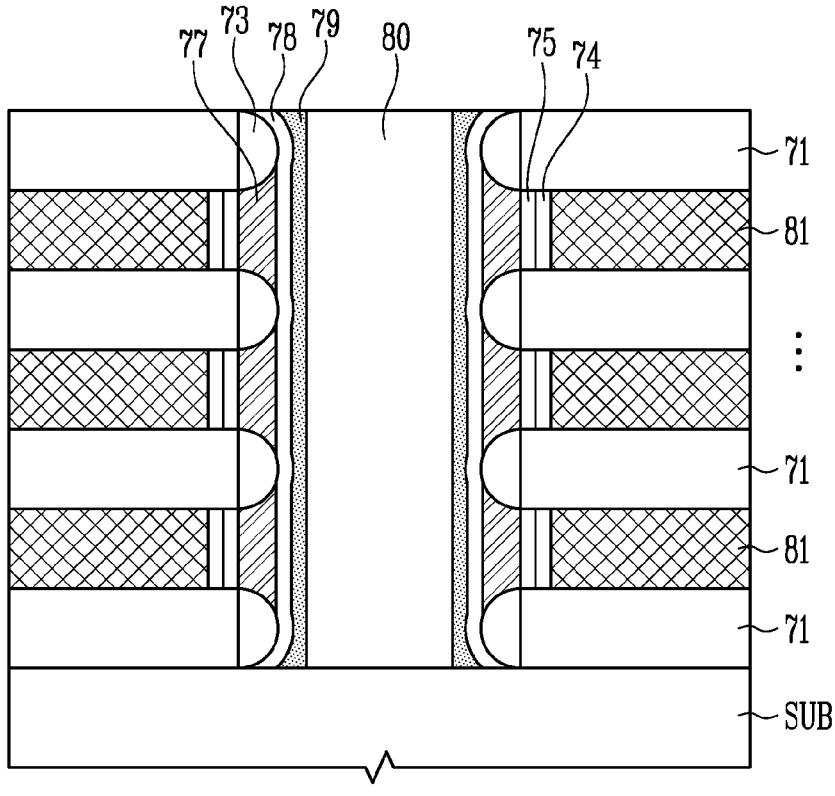

Referring to FIG. 8F, an etching process may be performed so that a sidewall of the stacked structure ST (see FIG. 8E) is exposed, and the exposed second material layer 72 (FIG. 8E) may be removed. Thereafter, the third material layer 81 may be formed in the space from which the second material layer 72 (see FIG. 8E) has been removed. The third material layer 81 may include a conductive material, such as polysilicon, tungsten, or metal. In an embodiment, after removing the exposed second material layer 72 (FIG. 8E), a blocking insulating layer (not shown) may be formed along the upper surface and lower surface of the first material layer 71 and the sidewall of the low dielectric layer 74. The blocking insulating layer may be formed of a material having a dielectric permittivity that is higher than that of the low dielectric layer 74.

FIGS. 9A to 9G are sectional views illustrating a method of manufacturing a semiconductor device according to an embodiment of the present disclosure.

Figure 9A:
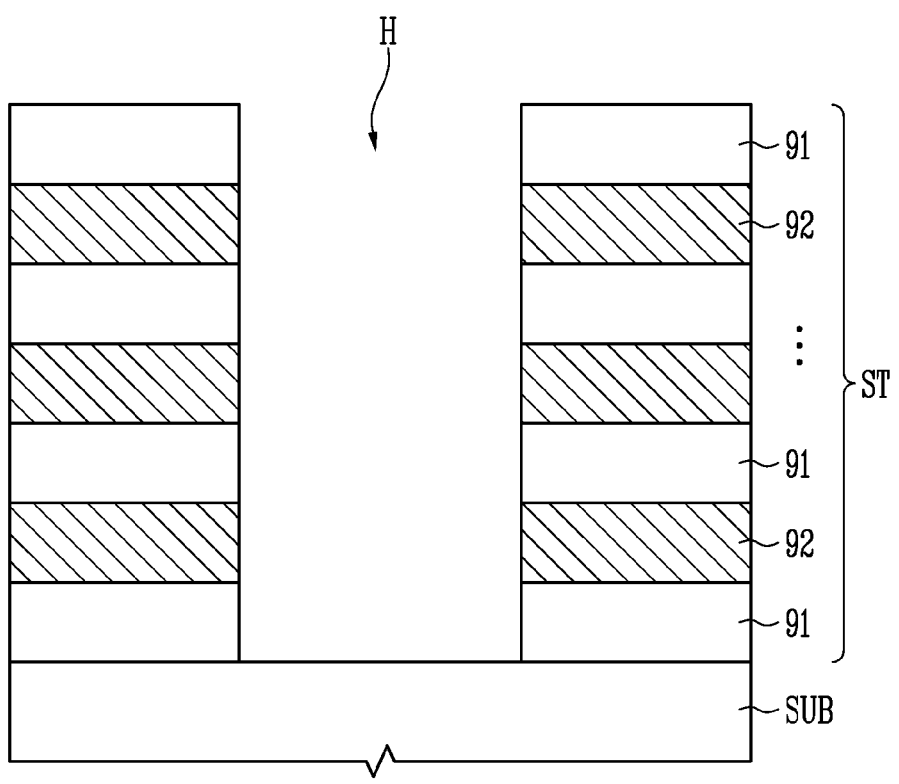
FIGS. 9A to 9G are sectional views illustrating a method of manufacturing a semiconductor device according to an embodiment of the present disclosure.

Referring to FIG. 9A, a stacked structure ST may be formed on a substrate SUB. The stacked structure ST may include first material layers 91 and second material layers 92 that are alternately stacked. The first and second material layers 91 and 92 may be stacked in a direction that is perpendicular to the substrate SUB. The first and second material layers 91 and 92 may be formed through a deposition process, such as CVD.

The first material layers 91 may include material having a high etch selectivity compared to the second material layers 92. In an embodiment, the first material layers 91 may include an insulating material, such as oxide, and the second material layers 92 may include a sacrificial material, such as nitride. In an embodiment, the first material layers 91 may include an insulating material, such as oxide, and the second material layers 92 may include a conductive material, such as polysilicon or tungsten.

Subsequently, a hard mask pattern (not shown) may be formed on the stacked structure ST, and an etching process that uses the hard mask pattern may be performed to form a hole H that passes through at least a portion of the stacked structure ST. The hole H may partially extend into the substrate SUB.

Figure 9B:
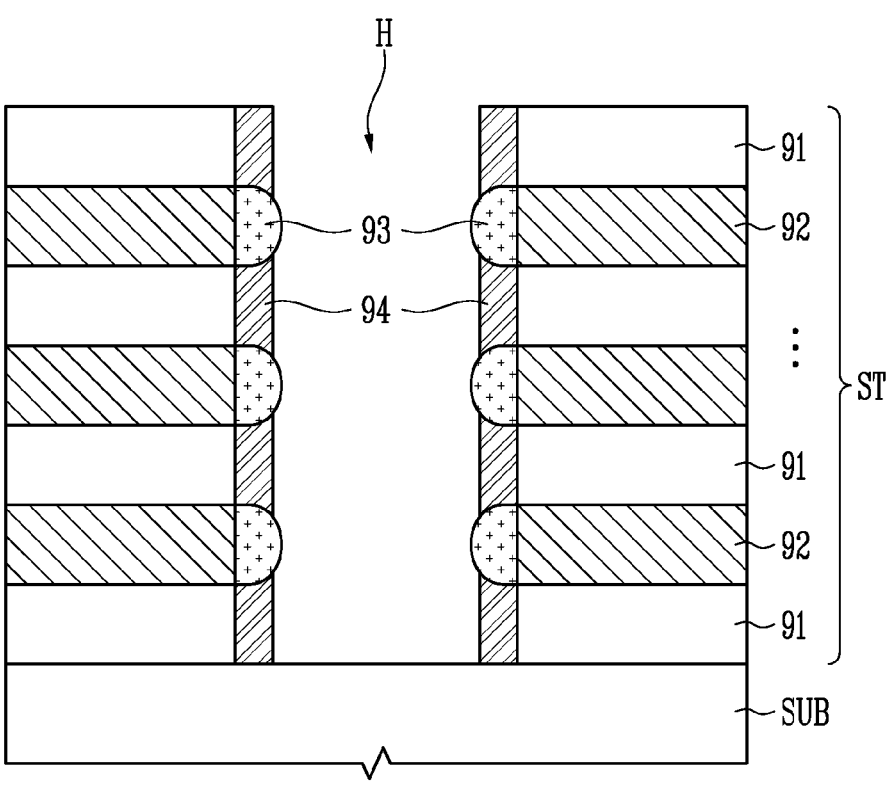

Referring to FIG. 9B, a first sacrificial pattern 93 may be formed by performing a selective deposition process on a sidewall of each of the second material layers 92 that is exposed through the hole H. The first sacrificial pattern 93 may be formed of a silicon oxycarbide (SiOC) layer. The first sacrificial pattern 93 may be formed in a shape of a semicircle protruding in a direction of the hole.

Thereafter, a second sacrificial pattern 94 may be formed in a space between the first sacrificial patterns 93 that are adjacent to each other in the vertical direction. The second sacrificial pattern 94 may be formed of a polysilicon layer or a silicon nitride layer. For example, after a sacrificial layer is formed on the sidewall of the hole H to fill the space between the first sacrificial patterns 93, an etch-back process may be performed so that the sacrificial layer remains only in the space between the first sacrificial patterns 93, thus forming a second sacrificial pattern 94. During the etch-back process, curved sidewalls of the first sacrificial patterns 93 may be partially exposed.

Figure 9C:
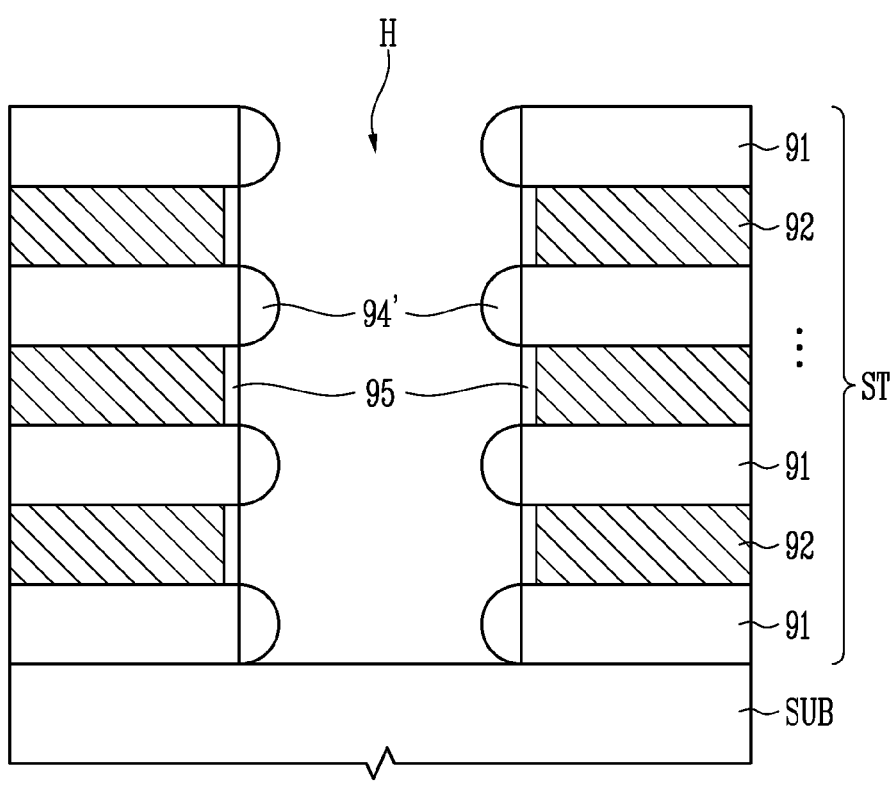

Referring to FIG. 9C, the exposed first sacrificial pattern 93 (see FIG. 9B) may be removed, and the remaining second sacrificial pattern 94 (see FIG. 9B) may be oxidized, thus forming an insulating pattern 94'. The insulating pattern 94' may be formed on a sidewall of each of the first material layers 91 and may be formed in a shape of a semicircle protruding in the direction of the hole.

Thereafter, by performing a radical oxidation process, the exposed sidewalls of the second material layers 92 may be oxidized to a predetermined thickness to form low dielectric layers 95. The low dielectric layers 95 may be formed between the first material layers 91 that are adjacent to each other in the vertical direction.

In an embodiment, an oxide layer deposition process may be performed to form the low dielectric layer 95 along the sidewall of the insulating pattern 94' and the sidewall of each of the second material layers 92.

Figure 9D:
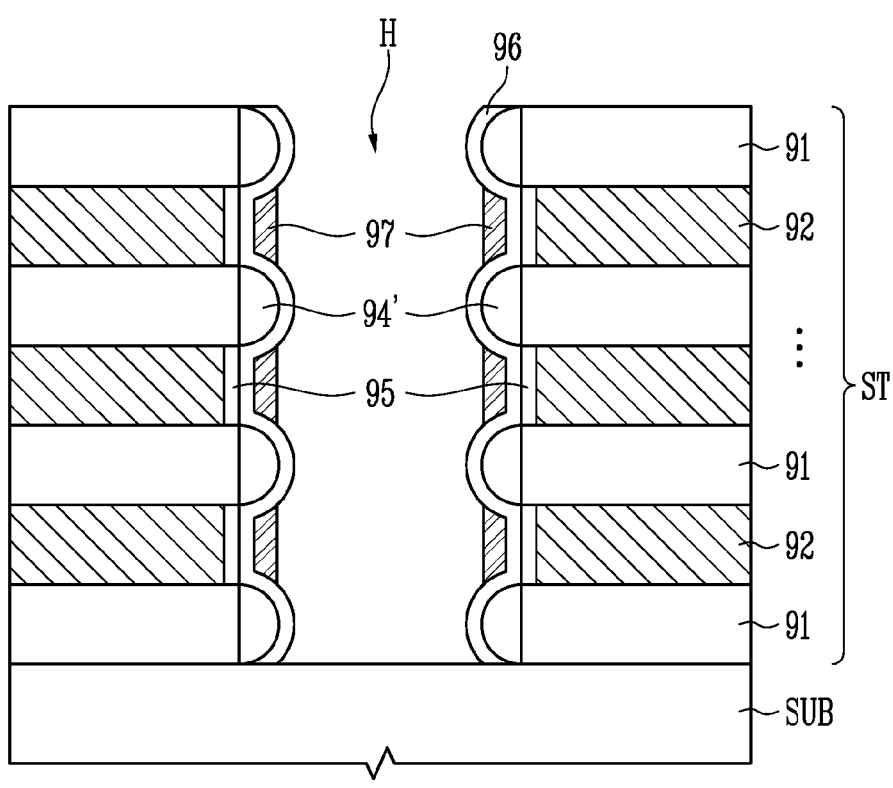

Referring to FIG. 9D, a high dielectric layer 96 may be formed along the sidewall of the insulating pattern 94' and the sidewall of the low dielectric layer 95. The high dielectric layer 96 may be formed to include a high dielectric constant material, such as aluminum oxide ($Al_2O_3$), hafnium oxide (HfOx), or hafnium silicon oxide (HfSiOx).

Thereafter, a third sacrificial pattern 97 may be formed in a space between the insulating patterns 94' that are adjacent to each other in the vertical direction. The third sacrificial pattern 97 may be formed of a polysilicon layer or a silicon nitride layer. For example, after a sacrificial layer is formed on the sidewall of the hole H to fill the space between the insulating patterns 94, an etch-back process may be performed so that the sacrificial layer remains only in the space between the insulating patterns 94, thus forming the third sacrificial pattern 97. During the etch-back process, the high dielectric layer 96 covering the curved sidewall of each of the insulating patterns 94' may be exposed.

Figure 9E:
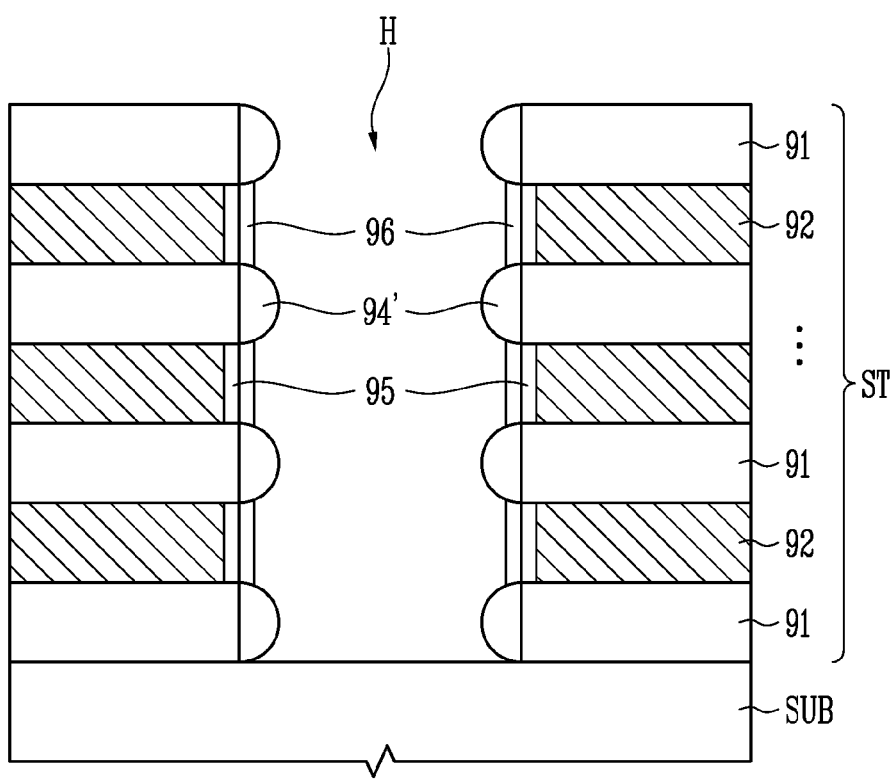

Referring to FIG. 9E, the high dielectric layer 96, which is exposed so that the high dielectric layer 96 remains only on the sidewall of the low dielectric layer 95, may be etched. Thereafter, the third sacrificial pattern 97 (see FIG. 9D) may be removed.

Figure 9F:
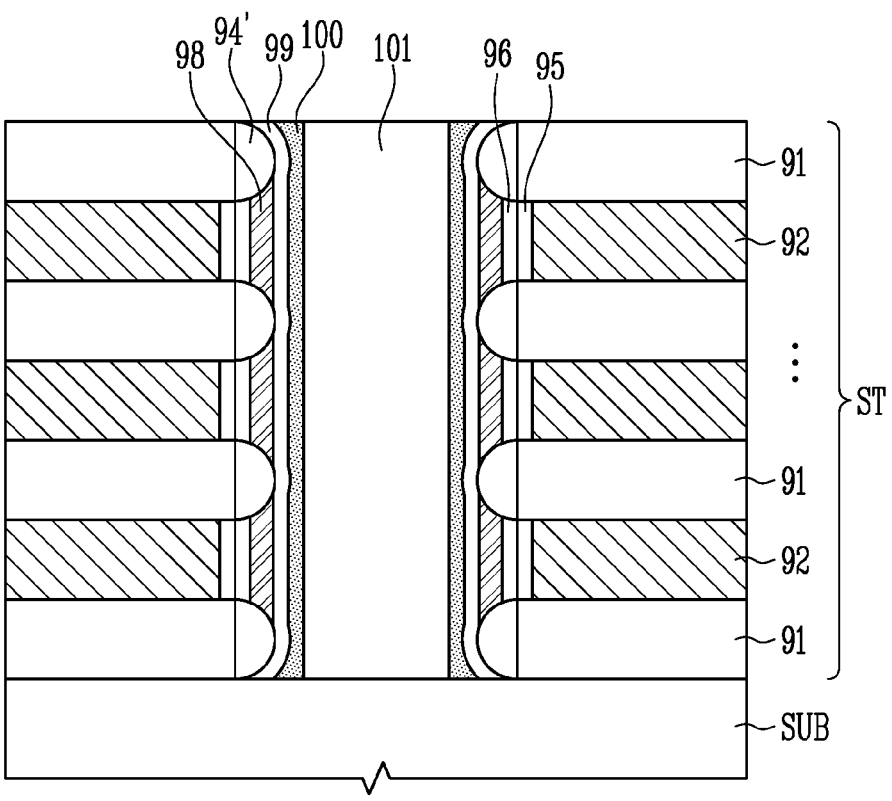

Referring to FIG. 9F, a floating gate 98 may be formed to contact the sidewall of the high dielectric layer 96 while filling the space between the insulating patterns 94' that are adjacent to each other in the vertical direction. The floating gate 98 may include polysilicon. For example, a floating gate layer may be formed on the sidewall of the hole to fill the space between the vertically adjacent insulating patterns 94, and an etch-back process may be performed so that a portion of the sidewall of the insulating pattern 94' is exposed. Thus, the floating gate 98 may remain only in the space between the vertically adjacent insulating patterns 94, and the vertically adjacent floating gates 98 may be electrically and physically spaced apart from each other by the insulating pattern 94'.

Thereafter, a tunnel insulating layer 99 may be formed along the sidewall of the insulating pattern 94' and the sidewall of the floating gate 98. The tunnel insulating layer 99 may be a layer through which electric charges tunnel via F-N tunneling or the like and may include an insulating material, such as oxide or nitride.

Subsequently, a channel layer 100 may be formed on the sidewall of the tunnel insulating layer 99. The channel layer 100 may be formed of a semiconductor material. In an embodiment, the channel layer 100 may include a semiconductor material, such as silicon or germanium, or may include a nanostructure, such as a nano dot, a nano tube, or graphene.

Thereafter, a core insulating layer 101 may be formed to fill the central portion of the hole. The core insulating layer 101 may be formed of an oxide layer.

Figure 9G:
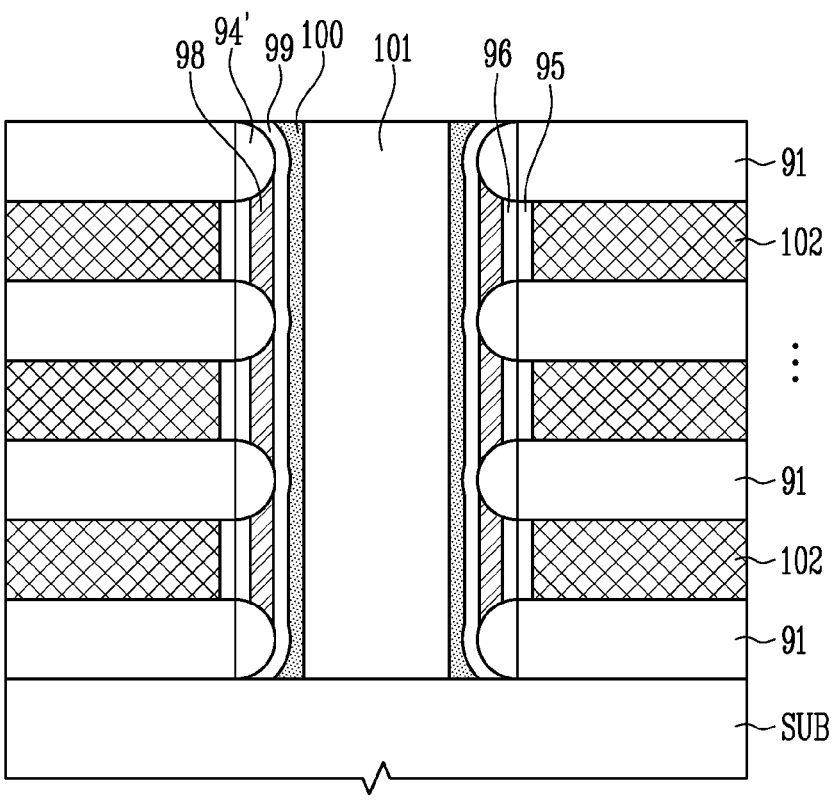

Referring to FIG. 9G, an etching process may be performed so that a sidewall of the stacked structure ST (see FIG. 9F) is exposed, and the exposed second material layer 92 (FIG. 9F) may be removed. Thereafter, the third material layer 102 may be formed in the space from which the second material layer 92 (see FIG. 9F) has been removed. The third material layer 102 may include a conductive material, such as polysilicon, tungsten, or metal. In an embodiment, after removing the exposed second material layer 92 (FIG. 9F), a blocking insulating layer (not shown) may be formed along the upper surface and lower surface of the first material layer 91 and the sidewall of the low dielectric layer 95. The blocking insulating layer may be formed of a material having a dielectric permittivity that is higher than that of the low dielectric layer 95.

FIGS. 10A to 10F are sectional views illustrating a method of manufacturing a semiconductor device according to an embodiment of the present disclosure.

Figure 10A:
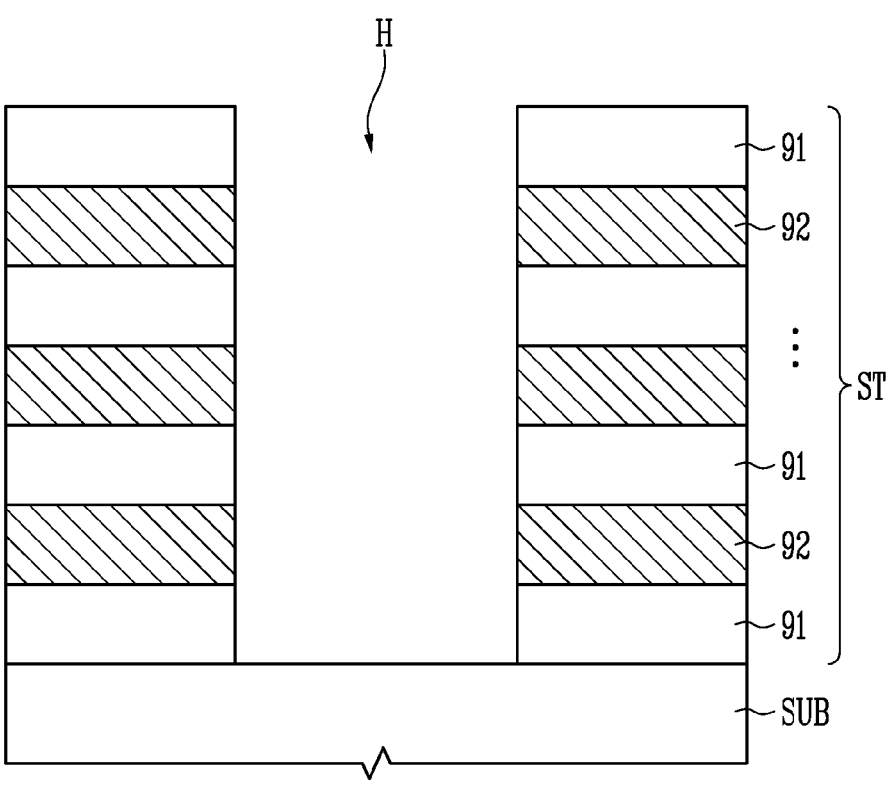
FIGS. 10A to 10F are sectional views illustrating a method of manufacturing a semiconductor device according to an embodiment of the present disclosure.

Referring to FIG. 10A, a stacked structure ST may be formed on a substrate SUB. The stacked structure ST may include first material layers 91 and second material layers 92 that are alternately stacked. The first and second material layers 91 and 92 may be stacked in a direction that is perpendicular to the substrate SUB. The first and second material layers 91 and 92 may be formed through a deposition process, such as CVD.

The first material layers 91 may include material having a high etch selectivity compared to the second material layers 92. In an embodiment, the first material layers 91 may include an insulating material, such as oxide, and the second material layers 92 may include a sacrificial material, such as nitride. In an embodiment, the first material layers 91 may include an insulating material, such as oxide, and the second material layers 92 may include a conductive material, such as polysilicon or tungsten.

Subsequently, a hard mask pattern (not shown) may be formed on the stacked structure ST, and an etching process that uses the hard mask pattern may be performed to form a hole H that passes through at least a portion of the stacked structure ST. The hole H may partially extend into the substrate SUB.

Figure 10B:
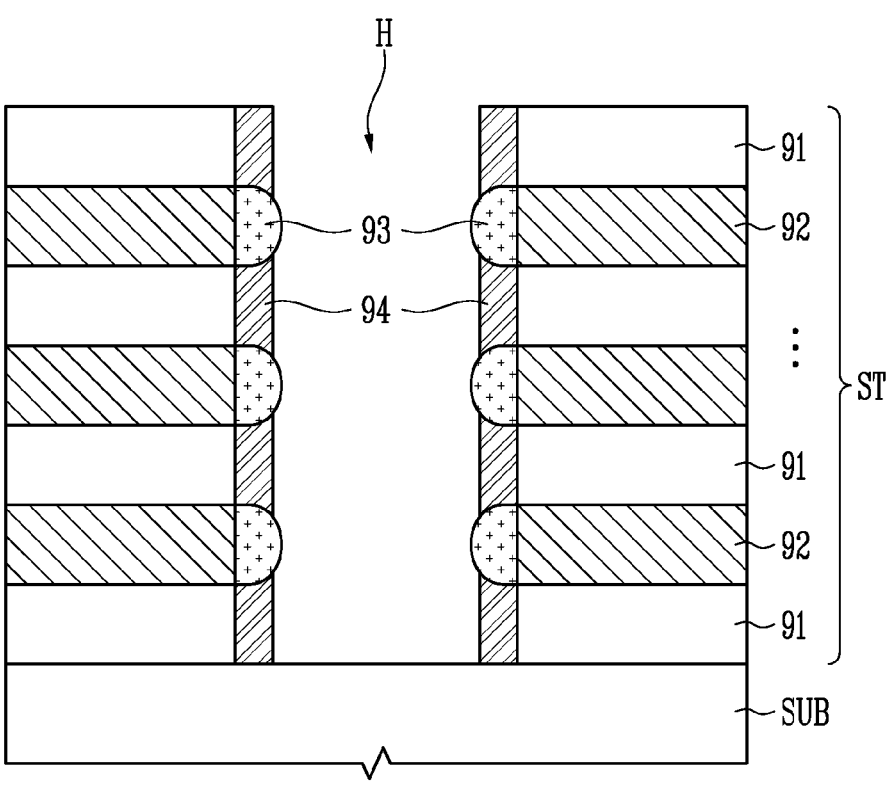

Referring to FIG. 10B, a first sacrificial pattern 93 may be formed by performing a selective deposition process on a sidewall of each of the second material layers 92 that is exposed through the hole H. The first sacrificial pattern 93 may be formed of a silicon oxycarbide (SiOC) layer. The first sacrificial pattern 93 may be formed in a shape of a semicircle protruding in a direction of the hole.

Thereafter, a second sacrificial pattern 94 may be formed in a space between the first sacrificial patterns 93 that are adjacent to each other in the vertical direction. The second sacrificial pattern 94 may be formed of a polysilicon layer or a silicon nitride layer. For example, after a sacrificial layer is formed on the sidewall of the hole H to fill the space between the first sacrificial patterns 93, an etch-back process may be performed so that the sacrificial layer remains only in the space between the first sacrificial patterns 93, thus forming a second sacrificial pattern 94. During the etch-back process, curved sidewalls of the first sacrificial patterns 93 may be partially exposed.

Figure 10C:
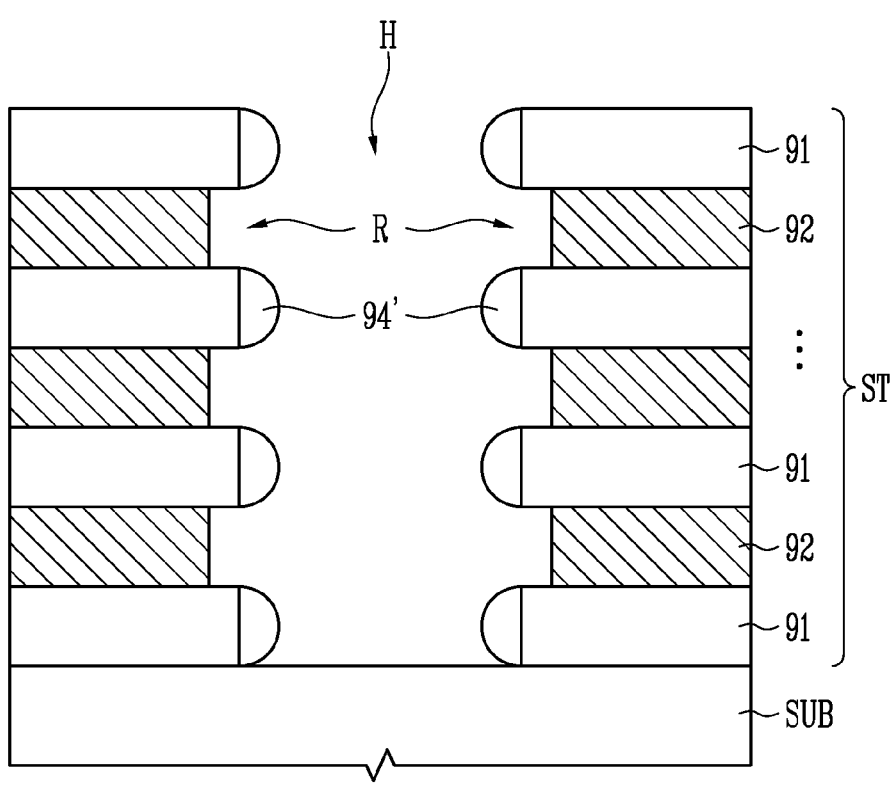

Referring to FIG. 10C, the exposed first sacrificial pattern 93 (see FIG. 10B) may be removed, and the remaining second sacrificial pattern 94 (see FIG. 9B) may be oxidized, thus forming an insulating pattern 94'. The insulating pattern 94' may be formed on a sidewall of each of the first material layers 91 and may be formed in a shape of a semicircle protruding in the direction of the hole.

Thereafter, an exposed sidewall of each of the second material layers 92 may be etched to a predetermined thickness to form a recess area R.

Figure 10D:
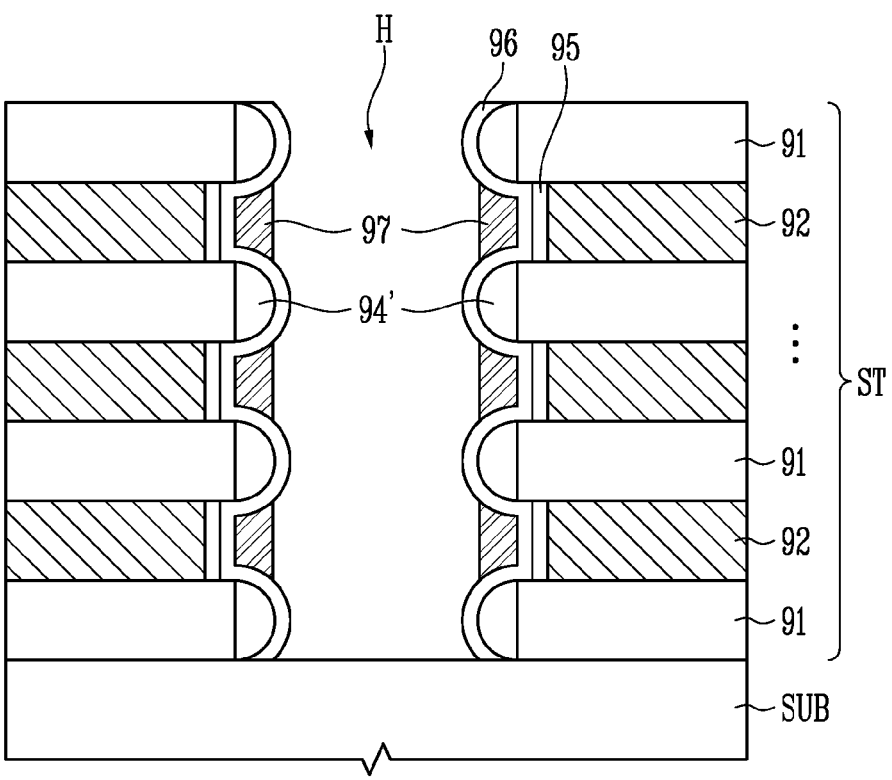

Referring to FIG. 10D, by performing a radical oxidation process, the exposed sidewall of each of the second material layers 92 may be oxidized to a predetermined thickness to form a low dielectric layer 95. The low dielectric layers 95 may be formed between the first material layers 91 that are adjacent to each other in the vertical direction.

In an embodiment, an oxide layer deposition process may be performed to form the low dielectric layer 95 along the sidewall of the insulating pattern 94' and the sidewall of each of the second material layers 92.

Subsequently, a high dielectric layer 96 may be formed along the sidewall of the insulating pattern 94' and the sidewall of the low dielectric layer 95. The high dielectric layer 96 may be formed to include a high dielectric constant material, such as aluminum oxide ($Al_2O_3$), hafnium oxide (HfOx), or hafnium silicon oxide (HfSiOx).

Thereafter, a third sacrificial pattern 97 may be formed in a space between the insulating patterns 94' that are adjacent to each other in the vertical direction. The third sacrificial pattern 97 may be formed of a polysilicon layer or a silicon nitride layer. For example, after a sacrificial layer is formed on the sidewall of the hole H to fill the space between the insulating patterns 94, an etch-back process may be performed so that the sacrificial layer remains only in the space between the insulating patterns 94, thus forming the third sacrificial pattern 97. During the etch-back process, the high dielectric layer 96 covering the curved sidewall of each of the insulating patterns 94' may be exposed.

Figure 10E:
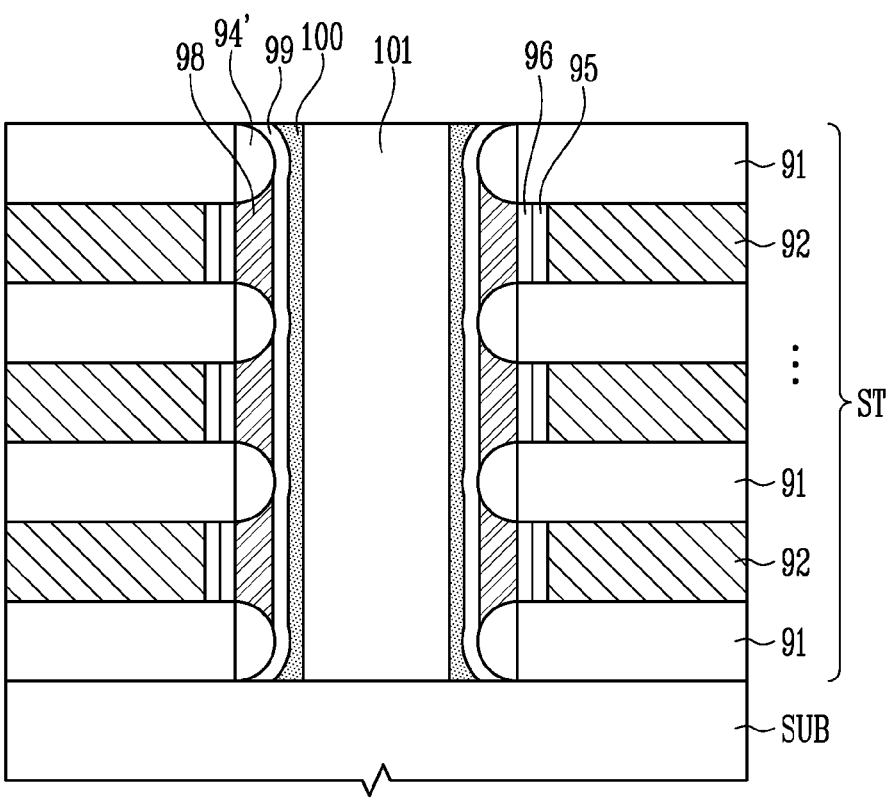

Referring to FIG. 10E, the high dielectric layer 96, which is exposed so that the high dielectric layer 96 remains only on the sidewall of the low dielectric layer 95, may be etched. Thereafter, the third sacrificial pattern 97 (see FIG. 10D) may be removed.

Subsequently, a floating gate 98 may be formed to contact the sidewall of the high dielectric layer 96 while filling the space between the insulating patterns 94' that are adjacent to each other in the vertical direction. The floating gate 98 may include polysilicon. For example, a floating gate layer may be formed on the sidewall of the hole to fill the space between the vertically adjacent insulating patterns 94, and an etch-back process may be performed so that a portion of the sidewall of the insulating pattern 94' is exposed. Thus, the floating gate 98 may remain only in the space between the vertically adjacent insulating patterns 94, and the vertically adjacent floating gates 98 may be electrically and physically spaced apart from each other by the insulating pattern 94'.

Thereafter, a tunnel insulating layer 99 may be formed along the sidewall of the insulating pattern 94' and the sidewall of the floating gate 98. The tunnel insulating layer 99 may be a layer through which electric charges tunnel via F-N tunneling or the like and may include an insulating material, such as oxide or nitride.

Subsequently, a channel layer 100 may be formed on the sidewall of the tunnel insulating layer 99. The channel layer 100 may be formed of a semiconductor material. In an embodiment, the channel layer 100 may include a semiconductor material, such as silicon or germanium, or may include a nanostructure, such as a nano dot, a nano tube, or graphene.

Thereafter, a core insulating layer 101 may be formed to fill the central portion of the hole. The core insulating layer 101 may be formed of an oxide layer.

Figure 10F:
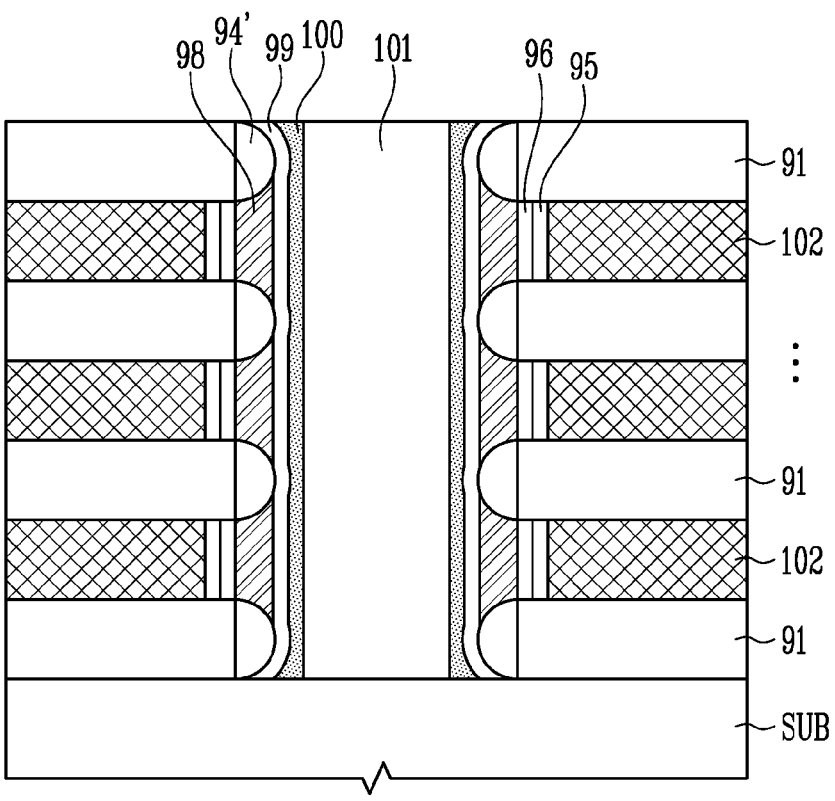

Referring to FIG. 10F, an etching process may be performed so that a sidewall of the stacked structure ST (see FIG. 10E) is exposed, and the exposed second material layer 92 (FIG. 10E) may be removed. Thereafter, the third material layer 102 may be formed in the space from which the second material layer 92 (see FIG. 10E) has been removed. The third material layer 102 may include a conductive material, such as polysilicon, tungsten, or metal. In an embodiment, after removing the exposed second material layer 92 (FIG. 10E), a blocking insulating layer (not shown) may be formed along the upper surface and lower surface of the first material layer 91 and the sidewall of the low dielectric layer 95. The blocking insulating layer may be formed of a material having a dielectric permittivity that is higher than that of the low dielectric layer 95.

FIGS. 11A to 11G are sectional views illustrating a method of manufacturing a semiconductor device according to an embodiment of the present disclosure.

Figure 11A:
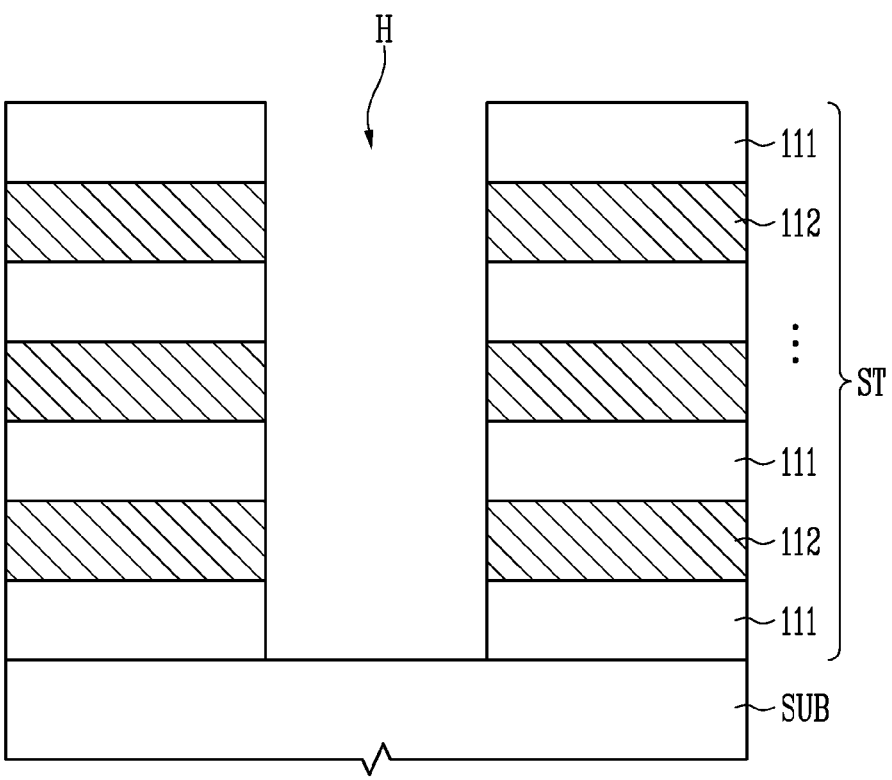
FIGS. 11A to 11G are sectional views illustrating a method of manufacturing a semiconductor device according to an embodiment of the present disclosure.

Referring to FIG. 11A, a stacked structure ST may be formed on a substrate SUB. The stacked structure ST may include first material layers 111 and second material layers 112 that are alternately stacked. The first and second material layers 111 and 112 may be stacked in a direction that is perpendicular to the substrate SUB. The first and second material layers 111 and 112 may be formed through a deposition process, such as CVD.

The first material layers 111 may include material having a high etch selectivity compared to the second material layers 112. In an embodiment, the first material layers 111 may include an insulating material, such as oxide, and the second material layers 112 may include a sacrificial material, such as nitride. In an embodiment, the first material layers 111 may include an insulating material, such as oxide, and the second material layers 112 may include a conductive material, such as polysilicon or tungsten.

Subsequently, a hard mask pattern (not shown) may be formed on the stacked structure ST, and an etching process that uses the hard mask pattern may be performed to form a hole H that passes through at least a portion of the stacked structure ST. The hole H may partially extend into the substrate SUB.

Figure 11B:
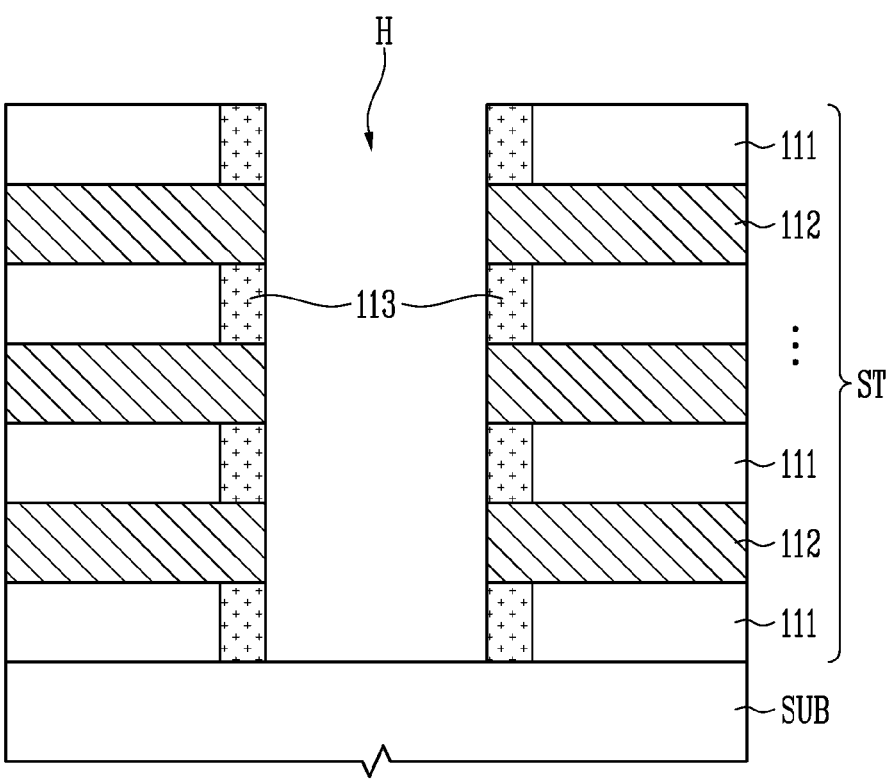

Referring to FIG. 11B, sidewalls of the first material layers 111 that are exposed through the hole H may be selectively etched to a predetermined thickness. Thus, the second material layers 112 may protrude in the horizontal direction by the thickness at which the sidewalls of the first material layers 111 are etched.

Thereafter, a first sacrificial layer 113 may be formed in a space from which each of the first material layers 111 has been removed. For example, after forming the first sacrificial layer 113 on the sidewall of the hole H to fill the space from which each of the first material layers 111 has been removed, an etch-back process may be performed so that the first sacrificial layer 113 may remain only in the space from which each of the first material layers 111 has been removed. The first sacrificial layer 113 may be formed of a polysilicon layer or a silicon nitride layer.

Figure 11C:
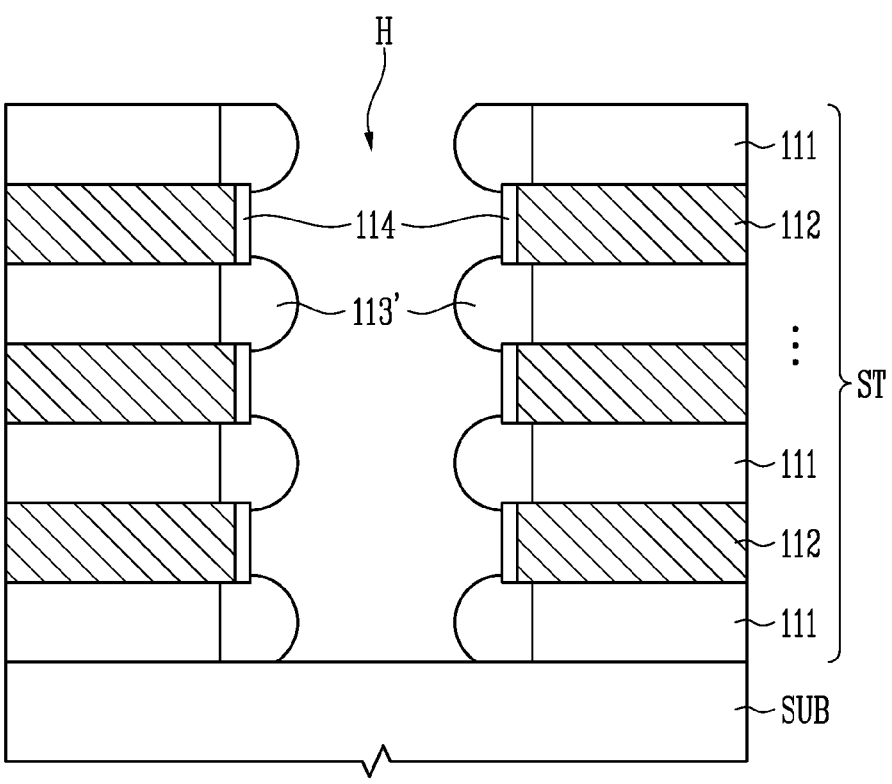

Referring to FIG. 11C, the insulating pattern 113' may be formed by oxidizing the first sacrificial layer 113. The insulating pattern 113' may protrude in a hole direction with respect to a sidewall of each of the second material layers 112, and a protrusion of the insulating pattern 113' may be formed to be round.

Thereafter, by performing a radical oxidation process, the exposed sidewalls of the second material layers 112 may be oxidized to a predetermined thickness to form low dielectric layers 114. The low dielectric layers 114 may be formed between the insulating patterns 113' that are adjacent to each other in the vertical direction.

In an embodiment, an oxide layer deposition process may be performed to form the low dielectric layer 114 along the protruding surface of the insulating pattern 113' and the sidewall of each of the second material layers 112.

Figure 11D:
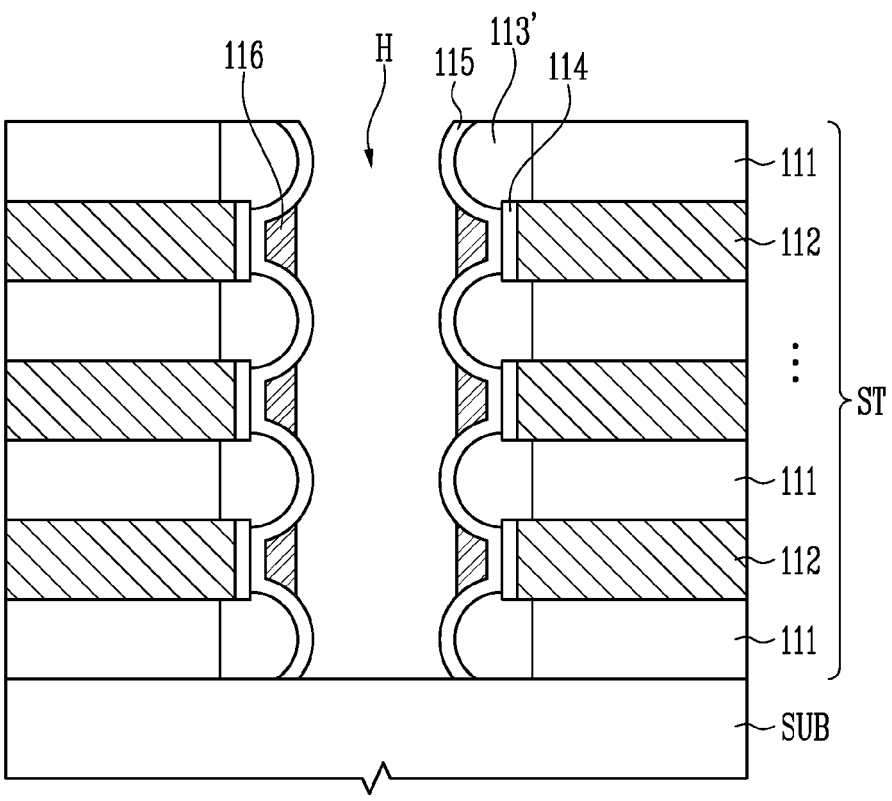

Referring to FIG. 11D, a high dielectric layer 115 may be formed along a surface of a protrusion of the insulating pattern 113' and the sidewall of the low dielectric layer 114. The high dielectric layer 115 may be formed to include a high dielectric constant material, such as aluminum oxide ($Al_2O_3$), hafnium oxide (HfOx), or hafnium silicon oxide (HfSiOx).

Thereafter, a second sacrificial layer 116 may be formed in a space between the insulating patterns 113' that are adjacent to each other in the vertical direction. For example, after forming the second sacrificial layer 116 on the sidewall of the hole H to fill the space between the vertically adjacent insulating patterns 113, an etch-back process may be performed so that the second sacrificial layer 116 may remain only in the space between the vertically adjacent insulating patterns 113'. The second sacrificial layer 116 may be formed of a polysilicon layer or a silicon nitride layer. During the etch-back process, the high dielectric layer 115 covering the curved sidewall of each of the insulating patterns 113' may be exposed.

Figure 11E:
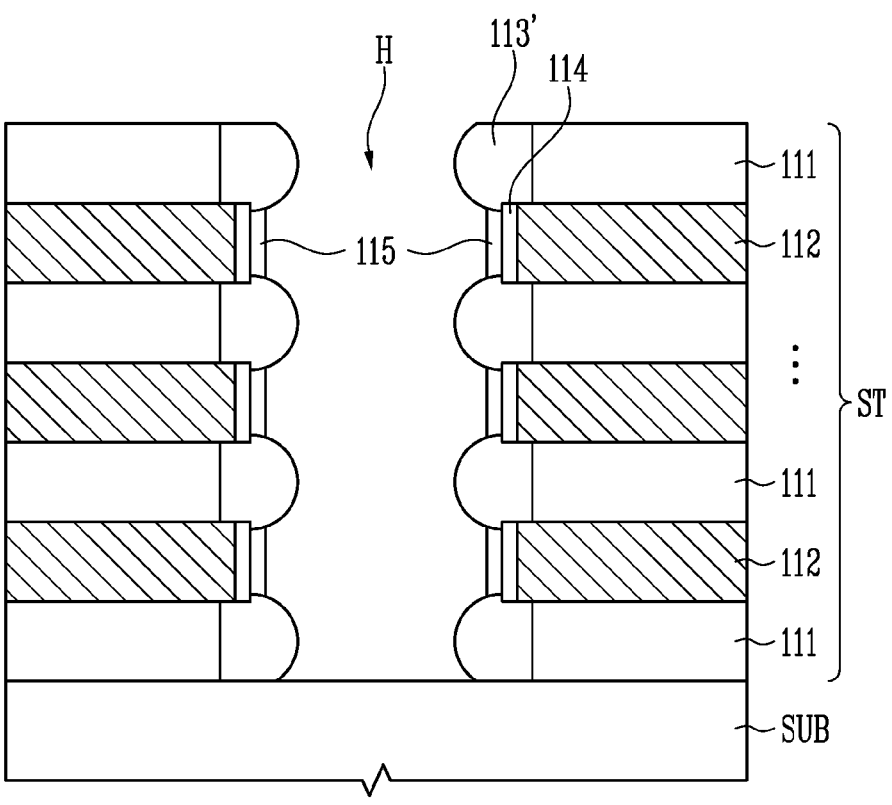

Referring to FIG. 11E, the high dielectric layer 115, which is exposed so that the high dielectric layer 115 remains only on the sidewall of the low dielectric layer 114, may be etched. Thereafter, the second sacrificial layer 116 (FIG. 11D) may be removed.

Figure 11F:
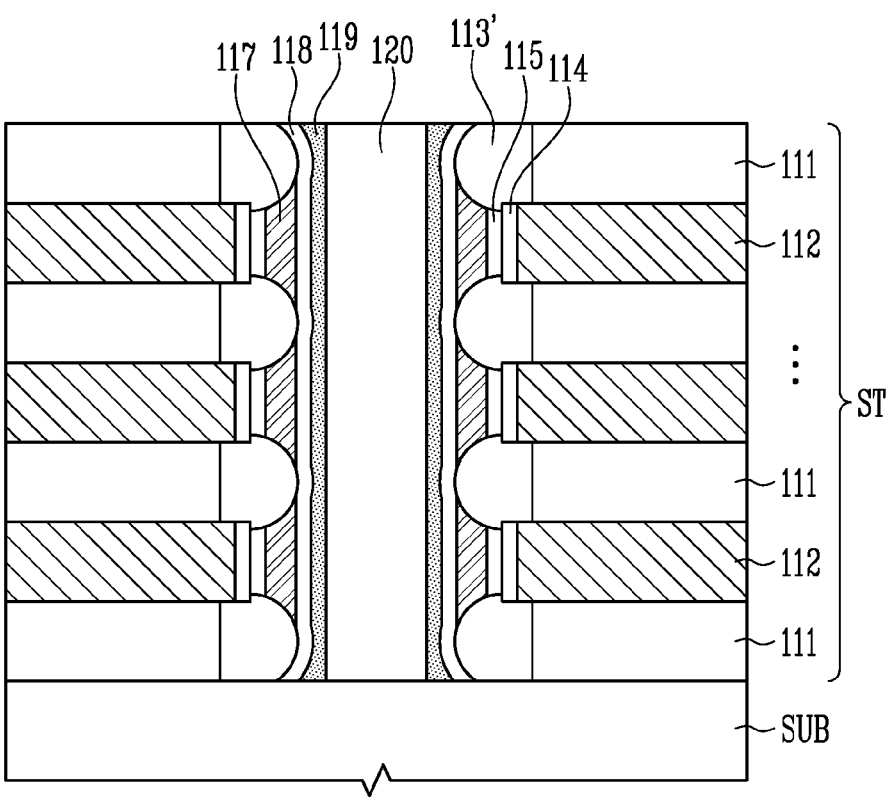

Referring to FIG. 11F, a floating gate 117 may be formed to contact the sidewall of the high dielectric layer 115 while filling the space between the insulating patterns 113' that are adjacent to each other in the vertical direction. The floating gate 117 may include polysilicon. For example, a floating gate layer may be formed on the sidewall of the hole to fill the space between the vertically adjacent insulating patterns 113', and an etch-back process may be performed so that a portion of the sidewall of the insulating pattern 113' is exposed. Thus, the floating gate 117 may remain only in the space between the vertically adjacent insulating patterns 113', and the vertically adjacent floating gates 117 may be electrically and physically spaced apart from each other by the insulating pattern 113'.

Thereafter, a tunnel insulating layer 118 may be formed along the sidewall of the insulating pattern 113' and the sidewall of the floating gate 117. The tunnel insulating layer 118 may be a layer through which electric charges tunnel via F-N tunneling or the like and may include an insulating material, such as oxide or nitride.

Subsequently, a channel layer 119 may be formed on the sidewall of the tunnel insulating layer 118. The channel layer 119 may be formed of a semiconductor material. In an embodiment, the channel layer 119 may include a semiconductor material, such as silicon or germanium, or may include a nanostructure, such as a nano dot, a nano tube, or graphene.

Thereafter, a core insulating layer 120 may be formed to fill such that the central portion of the hole. The core insulating layer 120 may be formed of an oxide layer.

Figure 11G:
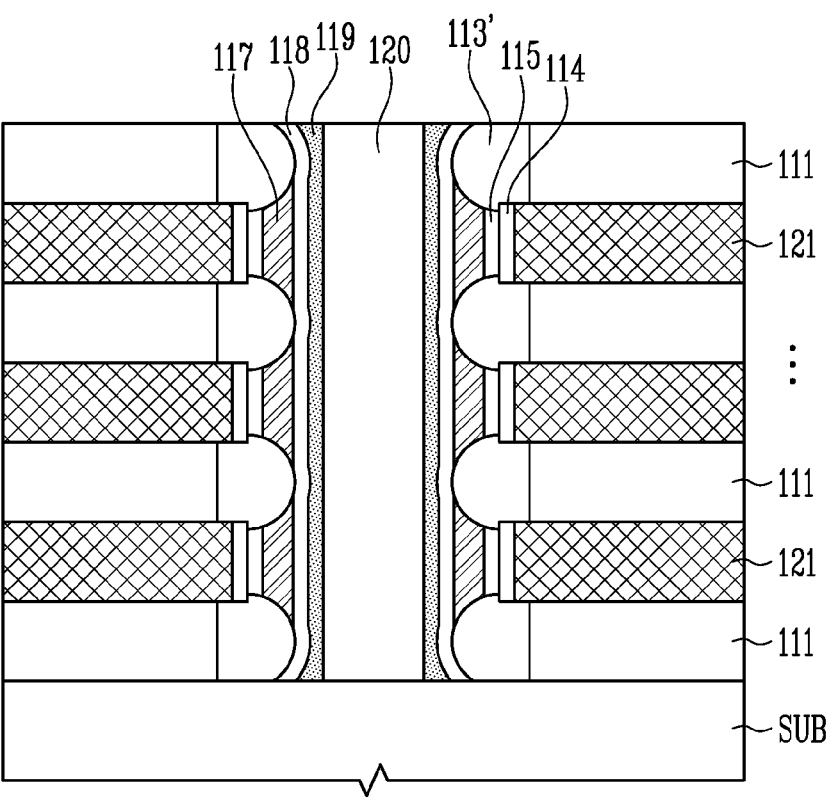

Referring to FIG. 11G, an etching process may be performed so that a sidewall of the stacked structure ST (see FIG. 11F) is exposed, and the exposed second material layer 112 (FIG. 11F) may be removed. Thereafter, the third material layer 121 may be formed in the space from which the second material layer 112 (see FIG. 11F) has been removed. The third material layer 121 may include a conductive material, such as polysilicon, tungsten, or metal. In an embodiment, after removing the exposed second material layer 112 (FIG. 11F), a blocking insulating layer (not shown) may be formed along the upper surface and lower surface of the first material layer 111 and the sidewall of the low dielectric layer 114. The blocking insulating layer may be formed of a material having a dielectric permittivity that is higher than that of the low dielectric layer 114.

FIGS. 12A to 12G are sectional views illustrating a method of manufacturing a semiconductor device according to an embodiment of the present disclosure.

Figure 12A:
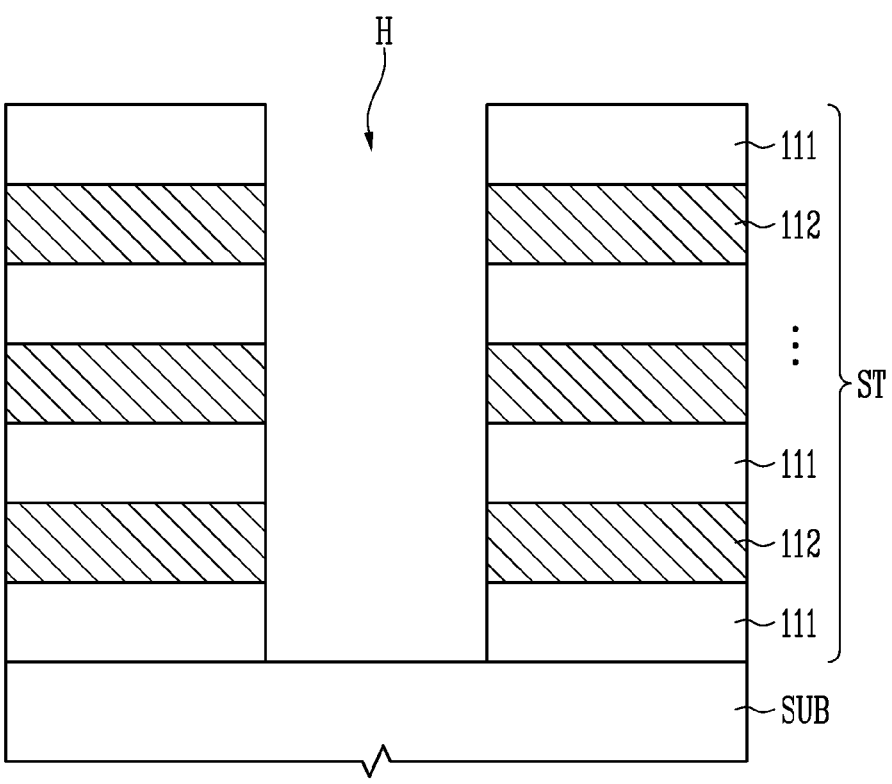
FIGS. 12A to 12G are sectional views illustrating a method of manufacturing a semiconductor device according to an embodiment of the present disclosure.

Referring to FIG. 12A, a stacked structure ST may be formed on a substrate SUB. The stacked structure ST may include first material layers 111 and second material layers 112 that are alternately stacked. The first and second material layers 111 and 112 may be stacked in a direction that is perpendicular to the substrate SUB. The first and second material layers 111 and 112 may be formed through a deposition process, such as CVD.

The first material layers 111 may include material having a high etch selectivity compared to the second material layers 112. In an embodiment, the first material layers 111 may include an insulating material, such as oxide, and the second material layers 112 may include a sacrificial material, such as nitride. In an embodiment, the first material layers 111 may include an insulating material, such as oxide, and the second material layers 112 may include a conductive material, such as polysilicon or tungsten.

Subsequently, a hard mask pattern (not shown) may be formed on the stacked structure ST, and an etching process that uses the hard mask pattern may be performed to form a hole H that passes through at least a portion of the stacked structure ST. The hole H may partially extend into the substrate SUB.

Figure 12B:
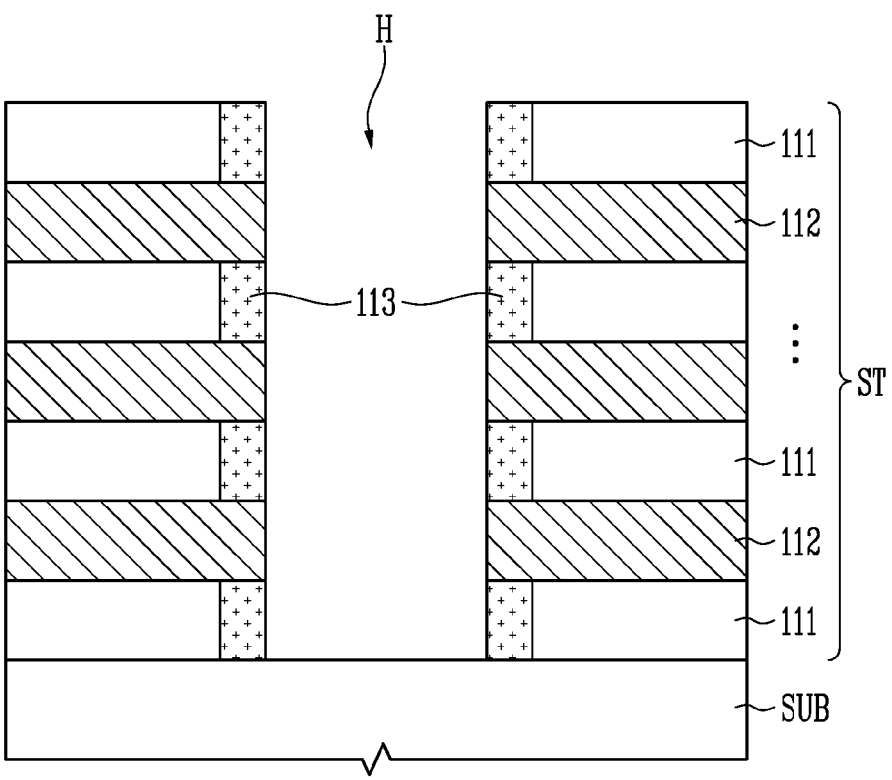

Referring to FIG. 12B, sidewalls of the first material layers 111 that are exposed through the hole H may be selectively etched to a predetermined thickness. Thus, the second material layers 112 may protrude in the horizontal direction by the thickness at which the sidewalls of the first material layers 111 are etched.

Thereafter, a first sacrificial layer 113 may be formed in a space from which each of the first material layers 111 has been removed. For example, after forming the first sacrificial layer 113 on the sidewall of the hole H to fill the space from which each of the first material layers 111 has been removed, an etch-back process may be performed so that the first sacrificial layer 113 may remain only in the space from which each of the first material layers 111 has been removed. The first sacrificial layer 113 may be formed of a polysilicon layer or a silicon nitride layer.

Figure 12C:
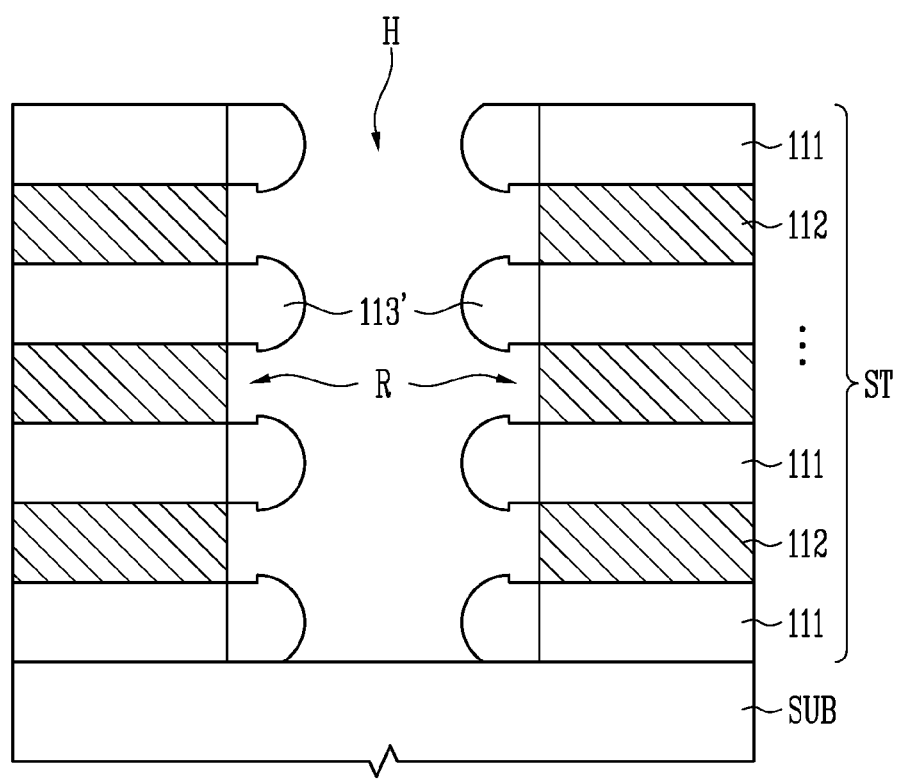

Referring to FIG. 12C, the insulating pattern 113' may be formed by oxidizing the first sacrificial layer 113. The insulating pattern 113' may protrude in a hole direction with respect to a sidewall of each of the second material layers 112, and a protrusion of the insulating pattern 113' may be formed to be round.

Thereafter, an exposed sidewall of each of the second material layers 112 may be etched to a predetermined thickness to form a recess area R.

Figure 12D:
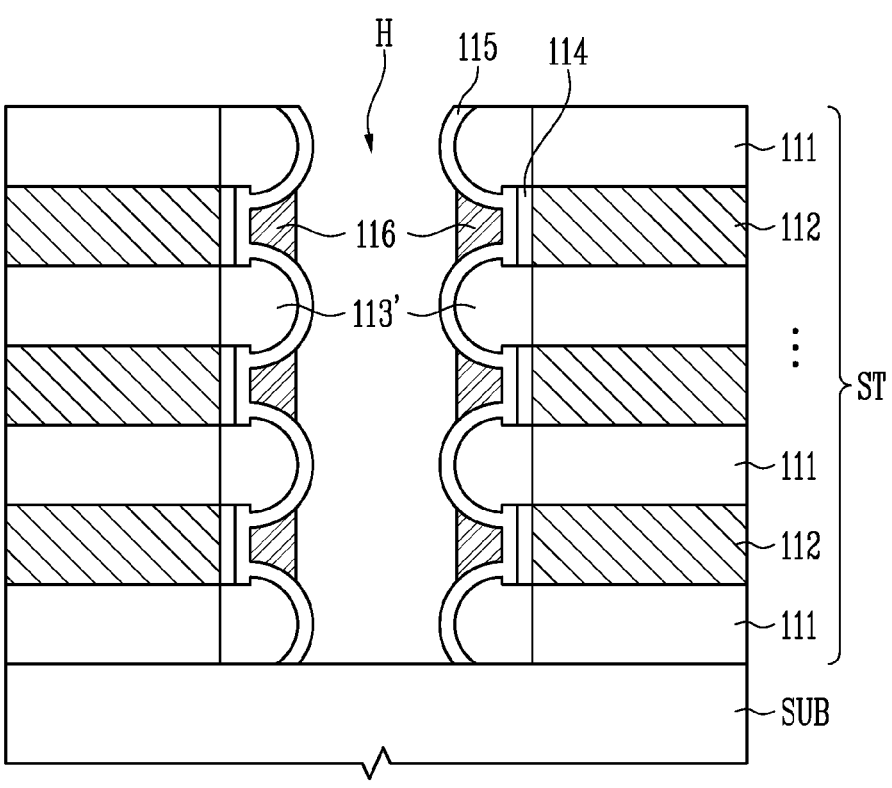

Referring to FIG. 12D, by performing a radical oxidation process, the exposed sidewall of each of the second material layers 112 may be oxidized to a predetermined thickness to form a low dielectric layer 114. The low dielectric layers 114 may be formed between the insulating patterns 113' that are adjacent to each other in the vertical direction.

In an embodiment, an oxide layer deposition process may be performed to form the low dielectric layer 114 along the protruding surface of the insulating pattern 113' and the sidewall of each of the second material layers 112.

Subsequently, a high dielectric layer 115 may be formed along the surface of the protrusion of the insulating pattern 113' and the sidewall of the low dielectric layer 114. The high dielectric layer 115 may be formed to include a high dielectric constant material, such as aluminum oxide ($Al_2O_3$), hafnium oxide (HfOx), or hafnium silicon oxide (HfSiOx).

Thereafter, a second sacrificial layer 116 may be formed in a space between the insulating patterns 113' that are adjacent to each other in the vertical direction. For example, after forming the second sacrificial layer 116 on the sidewall of the hole H to fill the space between the vertically adjacent insulating patterns 113, an etch-back process may be performed so that the second sacrificial layer 116 may remain only in the space between the vertically adjacent insulating patterns 113'. The second sacrificial layer 116 may be formed of a polysilicon layer or a silicon nitride layer. During the etch-back process, the high dielectric layer 115 covering the curved sidewall of each of the insulating patterns 113' may be exposed.

Figure 12E:
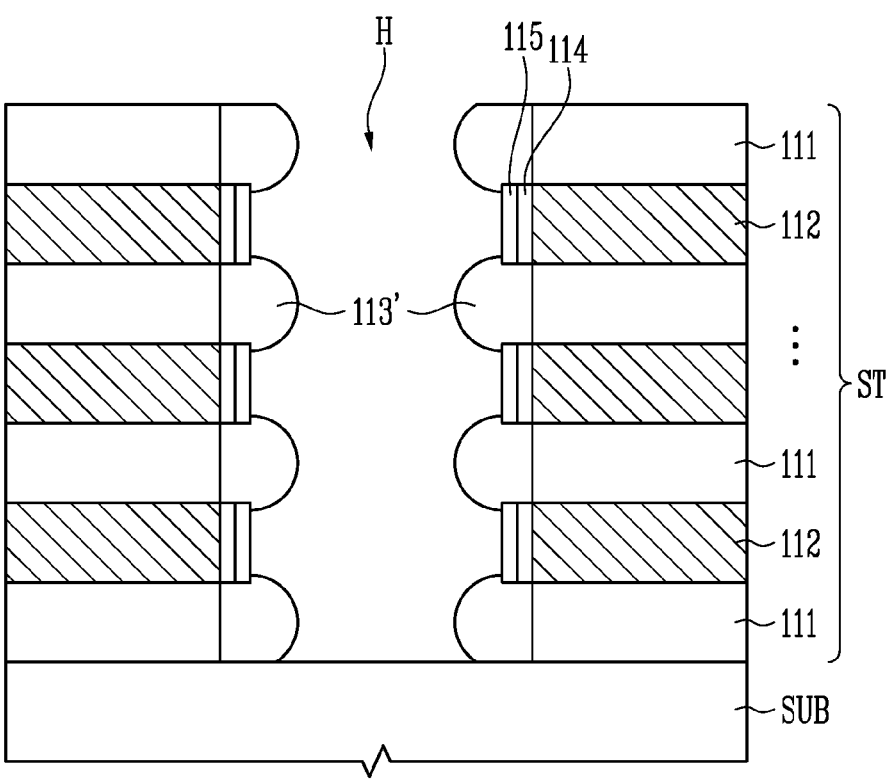

Referring to FIG. 12E, the high dielectric layer 115, which is exposed so that the high dielectric layer 115, may remain only on the sidewall of the low dielectric layer 114 is etched. Thereafter, the second sacrificial layer 116 (FIG. 12D) may be removed.

Figure 12F:
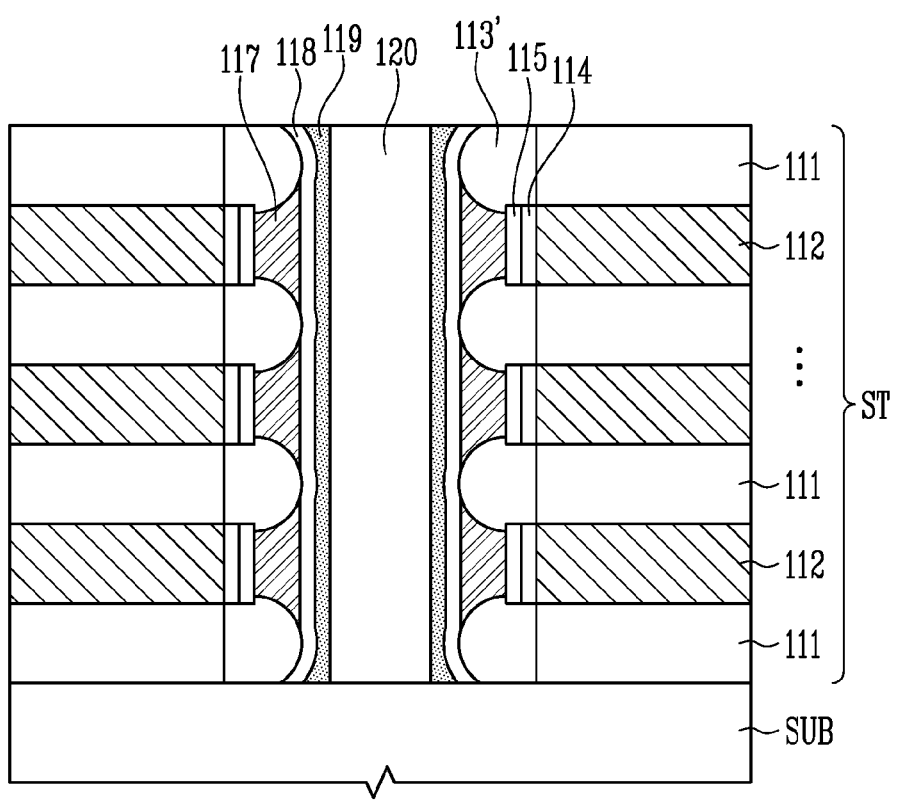

Referring to FIG. 12F, a floating gate 117 may be formed to contact the sidewall of the high dielectric layer 115 while filling the space between the insulating patterns 113' that are adjacent to each other in the vertical direction. The floating gate 117 may include polysilicon. For example, a floating gate layer may be formed on the sidewall of the hole to fill the space between the vertically adjacent insulating patterns 113', and an etch-back process may be performed so that a portion of the sidewall of the insulating pattern 113' is exposed. Thus, the floating gate 117 may remain only in the space between the vertically adjacent insulating patterns 113', and the vertically adjacent floating gates 117 may be electrically and physically spaced apart from each other by the insulating pattern 113'.

Thereafter, a tunnel insulating layer 118 may be formed along the sidewall of the insulating pattern 113' and the sidewall of the floating gate 117. The tunnel insulating layer 118 may be a layer through which electric charges tunnel via F-N tunneling or the like and may include an insulating material, such as oxide or nitride.

Subsequently, a channel layer 119 may be formed on the sidewall of the tunnel insulating layer 118. The channel layer 119 may be formed of a semiconductor material. In an embodiment, the channel layer 119 may include a semiconductor material, such as silicon or germanium, or may include a nanostructure, such as a nano dot, a nano tube, or graphene.

Thereafter, a core insulating layer 120 may be formed to fill the central portion of the hole. The core insulating layer 120 may be formed of an oxide layer.

Figure 12G:
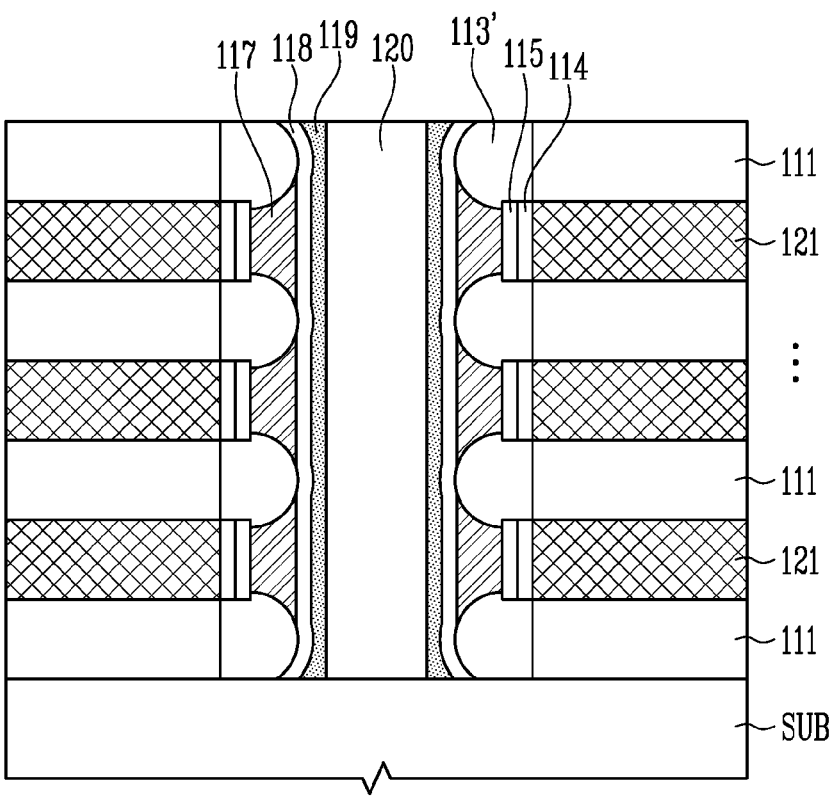

Referring to FIG. 12G, an etching process may be performed so that a sidewall of the stacked structure ST (see FIG. 12F) is exposed, and the exposed second material layer 112 (FIG. 12F) may be removed. Thereafter, the third material layer 121 may be formed in the space from which the second material layer 112 (see FIG. 12F) has been removed. The third material layer 121 may include a conductive material, such as polysilicon, tungsten, or metal. In an embodiment, after removing the exposed second material layer 112 (FIG. 12F), a blocking insulating layer (not shown) may be formed along the upper surface and lower surface of the first material layer 111 and the sidewall of the low dielectric layer 114. The blocking insulating layer may be formed of a material having a dielectric permittivity that is higher than that of the low dielectric layer 114.

Figure 13:
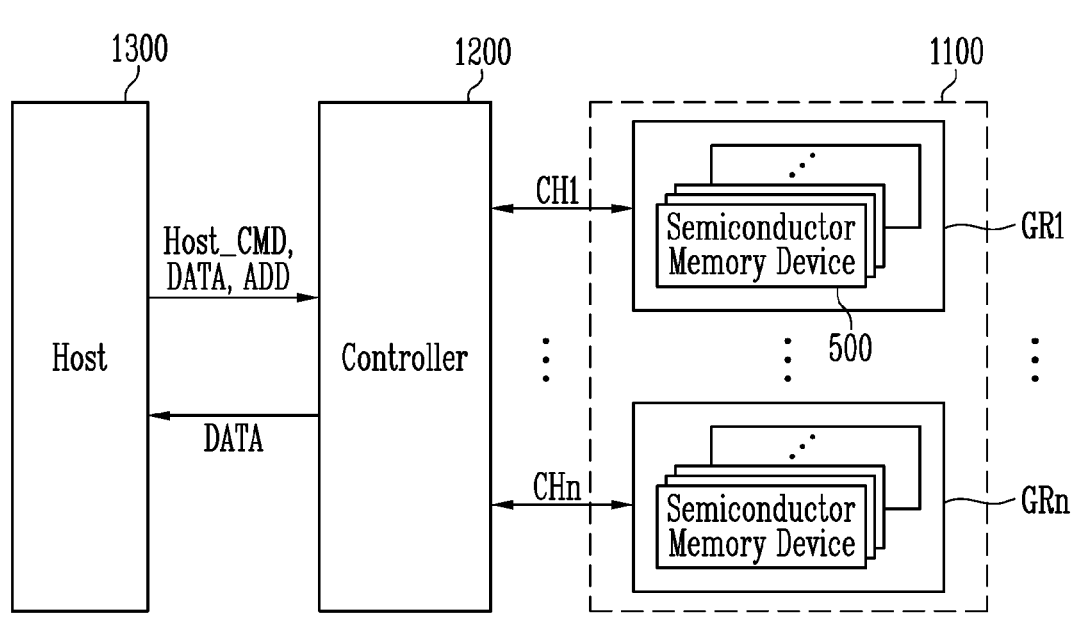
FIG. 13 is a block diagram illustrating a memory system including a semiconductor device according to an embodiment of the present disclosure.

FIG. 13 is a block diagram illustrating a memory system including a semiconductor device according to an embodiment of the present disclosure.

Referring to FIG. 13, a memory system 1000 may include a memory device 1100, a controller 1200, and a host 1300. The memory device 1100 may include a plurality of semiconductor memory devices 500. The plurality of semiconductor memory devices 500 may be divided into a plurality of groups. In an embodiment of the present disclosure, although the host 1300 is illustrated and described as being included in the memory system 1000, the memory system 1000 may be configured to include only the controller 1200 and the memory device 1100, the host 1300 being disposed outside the memory system 1000.

In FIG. 13, it is illustrated that the plurality of groups GR1 to GRn of the memory device 1100 communicate with the controller 1200 through first to n-th channels CH1 to CHn, respectively. Each semiconductor memory device 500 may be the semiconductor device, described above with reference to FIGS. 1, 3, and 6.

The groups GR1 to GRn may individually communicate with the controller 1200 through one common channel. The controller 1200 may control the plurality of semiconductor memory devices 500 of the memory device 1100 through the plurality of channels CH1 to CHn.

The controller 1200 may be coupled between the host 1300 and the memory device 1100. The controller 1200 may access the memory device 1100 in response to a request from the host 1300. For example, the controller 1200 may control a read operation, a program operation, an erase operation, and a background operation of the memory device 1100 in response to a host command Host_CMD that is received from the host 1300. The host 1300 may transmit an address ADD and data to be programmed DATA, together with the host command Host_CMD, during a program operation, and may transmit an address ADD, together with the host command Host_CMD, during a read operation. During a program operation, the controller 1200 may transmit the command corresponding to the program operation and the data to be programmed DATA to the memory device 1100. During a read operation, the controller 1200 may transmit the command corresponding to the read operation to the memory device 1100, receive read data DATA from the memory device 1100, and transmit the received data DATA to the host 1300. The controller 1200 may provide an interface between the memory device 1100 and the host 1300. The controller 1200 may run firmware for controlling the memory device 1100.

The host 1300 may include portable electronic devices, such as a computer, a personal digital assistant (PDA), a portable multimedia player (PMP), an MP3 player, a camera, a camcorder, and a mobile phone. The host 1300 may request the program operation, the read operation, the erase operation, etc. of the memory system 1000 through the host command Host_CMD. The host 1300 may transmit the host command Host_CMD corresponding to the program operation, the data DATA, and the address ADD to the controller 1200 so as to perform the program operation of the memory device 1100 and may transmit the host command Host_CMD corresponding to the read operation and the address ADD to the controller 1200 so as to perform the read operation. Here, the address ADD may be the logical address of the data.

The controller 1200 and the memory device 1100 may be integrated into a single semiconductor memory device. In an exemplary embodiment, the controller 1200 and the memory device 1100 may be integrated into a single semiconductor memory device to form a memory card. For example, the controller 1200 and the memory device 1100 may be integrated into a single semiconductor memory device to form a memory card, such as a personal computer memory card international association (PCMCIA), a compact flash card (CF), a smart media card (SM or SMC), a memory stick, a multimedia card (MMC, RS-MMC, or MMCmicro), an SD card (SD, miniSD, microSD, or SDHC), or a universal flash storage (UFS).

In an embodiment, the memory system 1000 may be provided as one of various elements of an electronic device, such as a computer, an ultra mobile PC (UMPC), a workstation, a net-book, a personal digital assistant (PDA), a portable computer, a web tablet, a wireless phone, a mobile phone, a smartphone, an e-book, a portable multimedia player (PMP), a game console, a navigation device, a black box, a digital camera, a three-dimensional (3D) television, a digital audio recorder, a digital audio player, a digital picture recorder, a digital picture player, a digital video recorder, a digital video player, a device capable of transmitting/receiving information in a wireless environment, one of various electronic devices for forming a home network, one of various electronic devices for forming a computer network, one of various electronic devices for forming a telematics network, a radio frequency identification (RFID) device, or one of various elements for forming a computing system.

In an example embodiment, the memory device 1100 or the memory system 1000 may be mounted as various types of packages. For example, the memory device 1100 or the memory system 1000 may be packaged in a type, such as package on package (PoP), ball grid arrays (BGAs), chip scale packages (CSPs), plastic leaded chip carrier (PLCC), plastic dual in line package (PDIP), die in waffle pack, die in wafer form, chip on board (COB), ceramic dual in line package (CERDIP), plastic metric quad flat pack (MQFP), thin quad flat pack (TQFP), small outline integrated circuit (SOIC), shrink small outline package (SSOP), thin small outline package (TSOP), system in package (SIP), multi chip package (MCP), wafer-level fabricated package (WFP), or wafer-level processed stack package (WSP).

According to the present disclosure, it is possible to provide a semiconductor device which has a stable structure and improved reliability, and a method of manufacturing the semiconductor device.

What is claimed is:

1. A semiconductor device, comprising:

a gate stacked structure including a plurality of insulating layers and a plurality of conductive layers that are alternately stacked;

a vertical structure extending into the gate stacked structure;

a floating gate disposed between the vertical structure and the plurality of conductive layers; and a dielectric pattern disposed between the floating gate and the plurality of conductive layers, wherein the floating gate comprises a first portion that is adjacent to the vertical structure and a second portion that is adjacent to the dielectric pattern, wherein the dielectric pattern does not contact an upper surface and a lower surface of the first portion, and wherein the dielectric pattern contacts an upper surface, a lower surface, and a sidewall of the second portion.

2. The semiconductor device according to claim 1, wherein a vertical length of the first portion is longer than that of the second portion.

3. The semiconductor device according to claim 1, wherein the dielectric pattern comprises:

a first high dielectric layer formed along the upper surface, the lower surface, and the sidewall of the second portion;

a second high dielectric layer formed along an upper surface, a lower surface, and a sidewall of each of the plurality of conductive layers; and a low dielectric layer disposed between the first high dielectric layer and the second high dielectric layer.

4. The semiconductor device according to claim 3, wherein the plurality of insulating layers protrude farther toward the vertical structure than the plurality of conductive layers.

5. The semiconductor device according to claim 4, further comprising:

a plurality of insulating patterns disposed between the plurality of insulating layers and the vertical structure.

6. The semiconductor device according to claim 5, wherein the first portion is disposed in a space between the plurality of insulating layers, and wherein the second portion is disposed in a space between the plurality of insulating patterns.

7. The semiconductor device according to claim 5, wherein the first high dielectric layer and the second high dielectric layer extend to a space between the plurality of insulating patterns and the plurality of insulating layers.

* * * * *